(12) United States Patent
Kageyama et al.

(10) Patent No.: US 10,999,543 B2
(45) Date of Patent: May 4, 2021

(54) SOLID-STATE IMAGING DEVICE, ELECTRONIC APPARATUS, LENS CONTROL METHOD, AND VEHICLE

(71) Applicant: SONY CORPORATION, Tokyo (JP)

(72) Inventors: Kazumi Kageyama, Tokyo (JP); Shinichi Fujii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 129 days.

(21) Appl. No.: 16/310,876

(22) PCT Filed: Jun. 14, 2017

(86) PCT No.: PCT/JP2017/021947
§ 371 (c)(1),
(2) Date: Dec. 18, 2018

(87) PCT Pub. No.: WO2018/003501
PCT Pub. Date: Jan. 4, 2018

(65) Prior Publication Data
US 2020/0314347 A1  Oct. 1, 2020

(30) Foreign Application Priority Data

Jun. 28, 2016 (JP) .............................. JP2016-127685

(51) Int. Cl.
*H04N 5/369* (2011.01)
*H04N 5/232* (2006.01)
(Continued)

(52) U.S. Cl.
CPC ............. *H04N 5/369* (2013.01); *B60R 11/04* (2013.01); *G02B 7/34* (2013.01);
(Continued)

(58) Field of Classification Search
CPC ......... H04N 5/232122; H04N 9/04559; G60R 11/04; G02B 7/34
See application file for complete search history.

(56) References Cited

U.S. PATENT DOCUMENTS 9,906,744 B2* 2/2018 Kim ................... H04N 9/04557
2011/0199506 A1* 8/2011 Takamiya ........ H04N 5/232122
348/222.1
(Continued)

FOREIGN PATENT DOCUMENTS

CN 104969540 A 10/2015
JP 2010-140013 A 6/2010
(Continued)

OTHER PUBLICATIONS

International Search Report and Written Opinion of PCT Application No. PCT/JP2017/021947, dated Sep. 5, 2017, 11 pages of ISRWO.

*Primary Examiner* — Antoinette T Spinks
(74) *Attorney, Agent, or Firm* — Chip Law Group

(57) ABSTRACT

The present technology relates to a solid-state imaging device, an electronic apparatus, a lens control method, and a vehicle capable of suppressing deterioration in quality of a captured image. A sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block. For example, the present technology is able to be applied to a camera that calculates an amount of a deviation of a focus and performs focus control on a basis of a calculated defocus amount.

17 Claims, 41 Drawing Sheets

(51) Int. Cl.
   *H04N 9/04*      (2006.01)
   *B60R 11/04*     (2006.01)
   *G02B 7/34*      (2021.01)

(52) U.S. Cl.
   CPC ... *H04N 5/232122* (2018.08); *H04N 9/04559* (2018.08); *H04N 9/045* (2013.01)

(56) References Cited

U.S. PATENT DOCUMENTS

| | | | |
|---|---|---|---|
| 2012/0249846 A1* | 10/2012 | Nishio | H04N 5/23212 |
| | | | 348/294 |
| 2014/0176780 A1* | 6/2014 | Koshiba | H04N 13/207 |
| | | | 348/336 |
| 2015/0156400 A1* | 6/2015 | Seo | H04N 9/04557 |
| | | | 348/353 |
| 2016/0105600 A1* | 4/2016 | Omata | G02B 7/34 |
| | | | 348/140 |
| 2016/0212364 A1* | 7/2016 | Okazawa | H04N 9/04515 |
| 2016/0276396 A1 | 9/2016 | Tayanaka et al. | |

FOREIGN PATENT DOCUMENTS

| | | |
|---|---|---|
| JP | 2012-215785 A | 11/2012 |
| JP | 2015-133469 A | 7/2015 |
| WO | 2010/055931 A1 | 5/2010 |
| WO | 2015/087515 A2 | 6/2015 |

\* cited by examiner

FIG. 16

|   | A 1 | 2 | C D 3 | 4 | B 5 | 6 | C D 7 | 8 | A 9 | 10 | C D 11 | 12 | B 13 | 14 | C D 15 | 16 |
|---|---|---|---|---|---|---|---|---|---|---|---|---|---|---|---|---|
| C1 | G | G | ■ | B | G | G | ■ | B | G | G | ■ | B | G | G | ■ | B |
| 2 | G | G | B | B | G | G | B | B | G | G | B | B | G | G | B | B |
| AB3 | ■ | R | G | G | ■ | R | G | G | ■ | R | G | G | ■ | R | G | G |
| 4 | R | R | G | G | R | R | G | G | R | R | G | G | R | R | G | G |
| D5 | G | G | ■ | B | G | G | ■ | B | G | G | ■ | B | G | G | ■ | B |
| 6 | G | G | B | B | G | G | B | B | G | G | B | B | G | G | B | B |
| AB7 | ■ | R | G | G | ■ | R | G | G | ■ | R | G | G | ■ | R | G | G |
| 8 | R | R | G | G | R | R | G | G | R | R | G | G | R | R | G | G |
| C9 | G | G | ■ | B | G | G | ■ | B | G | G | ■ | B | G | G | ■ | B |
| 10 | G | G | B | B | G | G | B | B | G | G | B | B | G | G | B | B |
| AB11 | ■ | R | G | G | ■ | R | G | G | ■ | R | G | G | ■ | R | G | G |
| 12 | R | R | G | G | R | R | G | G | R | R | G | G | R | R | G | G |
| D13 | G | G | ■ | B | G | G | ■ | B | G | G | ■ | B | G | G | ■ | B |
| 14 | G | G | B | B | G | G | B | B | G | G | B | B | G | G | B | B |
| AB15 | ■ | R | G | G | ■ | R | G | G | ■ | R | G | G | ■ | R | G | G |
| 16 | R | R | G | G | R | R | G | G | R | R | G | G | R | R | G | G |

| | A C D 1 | 2 | A C D 3 | 4 | B C D 5 | 6 | B C D 7 | 8 | A C D 9 | 10 | A C D 11 | 12 | B C D 13 | 14 | B C D 15 | 16 |
|---|---|---|---|---|---|---|---|---|---|---|---|---|---|---|---|---|
| AB1 | ■ | G | B | B | ■ | G | B | B | ■ | G | B | B | ■ | G | B | B |
| 2 | G | G | B | B | G | G | B | B | G | G | B | B | G | G | B | B |
| C3 | R | R | ■ | G | R | R | ■ | G | R | R | ■ | G | R | R | ■ | G |
| 4 | R | R | G | G | R | R | G | G | R | R | G | G | R | R | G | G |
| AB5 | ■ | G | B | B | ■ | G | B | B | ■ | G | B | B | ■ | G | B | B |
| 6 | G | G | B | B | G | G | B | B | G | G | B | B | G | G | B | B |
| D7 | R | R | ■ | G | R | R | ■ | G | R | R | ■ | G | R | R | ■ | G |
| 8 | R | R | G | G | R | R | G | G | R | R | G | G | R | R | G | G |
| C9 | ■ | G | B | B | ■ | G | B | B | ■ | G | B | B | ■ | G | B | B |
| 10 | G | G | B | B | G | G | B | B | G | G | B | B | G | G | B | B |
| AB11 | R | R | ■ | G | R | R | ■ | G | R | R | ■ | G | R | R | ■ | G |
| 12 | R | R | G | G | R | R | G | G | R | R | G | G | R | R | G | G |
| D13 | ■ | G | B | B | ■ | G | B | B | ■ | G | B | B | ■ | G | B | B |
| 14 | G | G | B | B | G | G | B | B | G | G | B | B | G | G | B | B |
| AB15 | R | R | ■ | G | R | R | ■ | G | R | R | ■ | G | R | R | ■ | G |
| 16 | R | R | G | G | R | R | G | G | R | R | G | G | R | R | G | G |

|  | 1 | 2 | A 3 | B 4 | 5 | 6 | A 7 | B 8 | 9 | 10 | A 11 | B 12 | 13 | 14 | A 15 | B 16 |
|---|---|---|---|---|---|---|---|---|---|---|---|---|---|---|---|---|
| A1 | G | G |  | B | G | G |  | B | G | G |  | B | G | G |  | B |
| B2 | G | G | B |  | G | G | B |  | G | G | B |  | G | G | B |  |
| 3 | R | R | G | G | R | R | G | G | R | R | G | G | R | R | G | G |
| 4 | R | R | G | G | R | R | G | G | R | R | G | G | R | R | G | G |
| A5 | G | G |  | B | G | G |  | B | G | G |  | B | G | G |  | B |
| B6 | G | G | B |  | G | G | B |  | G | G | B |  | G | G | B |  |
| 7 | R | R | G | G | R | R | G | G | R | R | G | G | R | R | G | G |
| 8 | R | R | G | G | R | R | G | G | R | R | G | G | R | R | G | G |
| A9 | G | G |  | B | G | G |  | B | G | G |  | B | G | G |  | B |
| B10 | G | G | B |  | G | G | B |  | G | G | B |  | G | G | B |  |
| 11 | R | R | G | G | R | R | G | G | R | R | G | G | R | R | G | G |
| 12 | R | R | G | G | R | R | G | G | R | R | G | G | R | R | G | G |
| A13 | G | G |  | B | G | G |  | B | G | G |  | B | G | G |  | B |
| B14 | G | G | B |  | G | G | B |  | G | G | B |  | G | G | B |  |
| 15 | R | R | G | G | R | R | G | G | R | R | G | G | R | R | G | G |
| 16 | R | R | G | G | R | R | G | G | R | R | G | G | R | R | G | G |

|  | 1 | 2 | A 3 | C D 4 | 5 | 6 | B 7 | C D 8 | 9 | 10 | A 11 | C D 12 | 13 | 14 | B 15 | C D 16 |
|---|---|---|---|---|---|---|---|---|---|---|---|---|---|---|---|---|
| AB1 | G | G | ■ | B | G | G | ■ | B | G | G | ■ | B | G | G | ■ | B |
| C2 | G | G | B | ■ | G | G | B | ■ | G | G | B | ■ | G | G | B | ■ |
| 3 | R | R | G | G | R | R | G | G | R | R | G | G | R | R | G | G |
| 4 | R | R | G | G | R | R | G | G | R | R | G | G | R | R | G | G |
| AB5 | G | G | ■ | B | G | G | ■ | B | G | G | ■ | B | G | G | ■ | B |
| D6 | G | G | B | ■ | G | G | B | ■ | G | G | B | ■ | G | G | B | ■ |
| 7 | R | R | G | G | R | R | G | G | R | R | G | G | R | R | G | G |
| 8 | R | R | G | G | R | R | G | G | R | R | G | G | R | R | G | G |
| AB9 | G | G | ■ | B | G | G | ■ | B | G | G | ■ | B | G | G | ■ | B |
| C10 | G | G | B | ■ | G | G | B | ■ | G | G | B | ■ | G | G | B | ■ |
| 11 | R | R | G | G | R | R | G | G | R | R | G | G | R | R | G | G |
| 12 | R | R | G | G | R | R | G | G | R | R | G | G | R | R | G | G |
| AB13 | G | G | ■ | B | G | G | ■ | B | G | G | ■ | B | G | G | ■ | B |
| D14 | G | G | B | ■ | G | G | B | ■ | G | G | B | ■ | G | G | B | ■ |
| 15 | R | R | G | G | R | R | G | G | R | R | G | G | R | R | G | G |
| 16 | R | R | G | G | R | R | G | G | R | R | G | G | R | R | G | G |

FIG. 30

|     | 1 | 2 | 3 | 4 | 5 | 6 | 7 | 8 | 9 | 10 | 11 | 12 | 13 | 14 | 15 | 16 |
|-----|---|---|---|---|---|---|---|---|---|----|----|----|----|----|----|----|
| EF1 | G | G |   | B | G | G |   | B | G | G  |    | B  | G  | G  |    | B  |
| GH2 | G | G | B |   | G | G | B |   | G | G  | B  |    | G  | G  | B  |    |
| 3   | R | R | G | G | R | R | G | G | R | R  | G  | G  | R  | R  | G  | G  |
| 4   | R | R | G | G | R | R | G | G | R | R  | G  | G  | R  | R  | G  | G  |
| EF5 | G | G |   | B | G | G |   | B | G | G  |    | B  | G  | G  |    | B  |
| GH6 | G | G | B |   | G | G | B |   | G | G  | B  |    | G  | G  | B  |    |
| 7   | R | R | G | G | R | R | G | G | R | R  | G  | G  | R  | R  | G  | G  |
| 8   | R | R | G | G | R | R | G | G | R | R  | G  | G  | R  | R  | G  | G  |
| EF9 | G | G |   | B | G | G |   | B | G | G  |    | B  | G  | G  |    | B  |
| GH10| G | G | B |   | G | G | B |   | G | G  | B  |    | G  | G  | B  |    |
| 11  | R | R | G | G | R | R | G | G | R | R  | G  | G  | R  | R  | G  | G  |
| 12  | R | R | G | G | R | R | G | G | R | R  | G  | G  | R  | R  | G  | G  |
| EF13| G | G |   | B | G | G |   | B | G | G  |    | B  | G  | G  |    | B  |
| GH14| G | G | B |   | G | G | B |   | G | G  | B  |    | G  | G  | B  |    |
| 15  | R | R | G | G | R | R | G | G | R | R  | G  | G  | R  | R  | G  | G  |
| 16  | R | R | G | G | R | R | G | G | R | R  | G  | G  | R  | R  | G  | G  |

FIG. 31

| | CD1 | CD2 | 131A A3 | A4 | CD5 | CD6 | 131B B7 | B8 | CD9 | CD10 | A11 | A12 | CD13 | CD14 | B15 | 131B B16 |
|---|---|---|---|---|---|---|---|---|---|---|---|---|---|---|---|---|
| AB1 | G | G | ■ | B | G | G | ■ | B | G | G | ■ | B | G | G | ■ | B |
| AB2 | G | G | B | ■ | G | G | B | ■ | G | G | B | ■ | G | G | B | ■ |
| 131C C3 | ■ | R | G | G | ■ | R | G | G | ■ | R | G | G | ■ | R | G | G |
| C4 | R | ■ | G | G | R | ■ | G | G | R | ■ | G | G | R | ■ | G | G |
| AB5 | G | G | ■ | B | G | G | ■ | B | G | G | ■ | B | G | G | ■ | B |
| AB6 | G | G | B | ■ | G | G | B | ■ | G | G | B | ■ | G | G | B | ■ |
| 131D D7 | ■ | R | G | G | ■ | R | G | G | ■ | R | G | G | ■ | R | G | G |
| D8 | R | ■ | G | G | R | ■ | G | G | R | ■ | G | G | R | ■ | G | G |
| AB9 | G | G | ■ | B | G | G | ■ | B | G | G | ■ | B | G | G | ■ | B |
| AB10 | G | G | B | ■ | G | G | B | ■ | G | G | B | ■ | G | G | B | ■ |
| C11 | ■ | R | G | G | ■ | R | G | G | ■ | R | G | G | ■ | R | G | G |
| C12 | R | ■ | G | G | R | ■ | G | G | R | ■ | G | G | R | ■ | G | G |
| AB13 | G | G | ■ | B | G | G | ■ | B | G | G | ■ | B | G | G | ■ | B |
| AB14 | G | G | B | ■ | G | G | B | ■ | G | G | B | ■ | G | G | B | ■ |
| D15 | ■ | R | G | G | ■ | R | G | G | ■ | R | G | G | ■ | R | G | G |
| D16 | R | ■ | G | G | R | ■ | G | G | R | ■ | G | G | R | ■ | G | G |

|   | A 1 | 2 | A 3 | 4 | B 5 | 6 | B 7 | 8 | A 9 | 10 | A 11 | 12 | B 13 | 14 | B 15 | 16 |
|---|---|---|---|---|---|---|---|---|---|---|---|---|---|---|---|---|
| A B1 | G | G | ■ | B | G | G | ■ | B | G | G | ■ | B | G | G | ■ | B |
| 2 | G | G | B | B | G | G | B | B | G | G | B | B | G | G | B | B |
| A B3 | ■ | R | ■ | G | ■ | R | ■ | G | ■ | R | ■ | G | ■ | R | ■ | G |
| 4 | R | R | G | G | R | R | G | G | R | R | G | G | R | R | G | G |
| A B5 | G | G | ■ | B | G | G | ■ | B | G | G | ■ | B | G | G | ■ | B |
| 6 | G | G | B | B | G | G | B | B | G | G | B | B | G | G | B | B |
| A B7 | ■ | R | ■ | G | ■ | R | ■ | G | ■ | R | ■ | G | ■ | R | ■ | G |
| 8 | R | R | G | G | R | R | G | G | R | R | G | G | R | R | G | G |
| A B9 | G | G | ■ | B | G | G | ■ | B | G | G | ■ | B | G | G | ■ | B |
| 10 | G | G | B | B | G | G | B | B | G | G | B | B | G | G | B | B |
| A B11 | ■ | R | ■ | G | ■ | R | ■ | G | ■ | R | ■ | G | ■ | R | ■ | G |
| 12 | R | R | G | G | R | R | G | G | R | R | G | G | R | R | G | G |
| A B13 | G | G | ■ | B | G | G | ■ | B | G | G | ■ | B | G | G | ■ | B |
| 14 | G | G | B | B | G | G | B | B | G | G | B | B | G | G | B | B |
| A B15 | ■ | R | ■ | G | ■ | R | ■ | G | ■ | R | ■ | G | ■ | R | ■ | G |
| 16 | R | R | G | G | R | R | G | G | R | R | G | G | R | R | G | G |

FIG. 37

SOLID-STATE IMAGING DEVICE, ELECTRONIC APPARATUS, LENS CONTROL METHOD, AND VEHICLE

CROSS REFERENCE TO RELATED APPLICATIONS

This application is a U.S. National Phase of International Patent Application No. PCT/JP2017/021947 filed on Jun. 14, 2017, which claims priority benefit of Japanese Patent Application No. JP 2016-127685 filed in the Japan Patent Office on Jun. 28, 2016. Each of the above-referenced applications is hereby incorporated herein by reference in its entirety.

TECHNICAL FIELD

The present technology relates to a solid-state imaging device, an electronic apparatus, a lens control method, and a vehicle, and in particular to a solid-state imaging device, an electronic apparatus, a lens control method, and a vehicle capable of suppressing deterioration in quality of a captured image.

BACKGROUND ART

In recent years, an imaging device such as a digital still camera or a digital video camera that images a subject such as a person or an animal using an image sensor such as a complementary metal-oxide semiconductor (CMOS) sensor and records image data obtained as a result of thereof has become widespread.

In such an imaging device, a technology in which a phase difference detection function is given to the image sensor and an autofocus (AF) of a phase difference detection type is realized without using a dedicated automatic focus detection (AF) sensor is known. For example, Patent Literature 1 proposes that one block includes 2×2 (=4) pixels of the same color and one pixel in the block is used as a phase difference detection pixel.

In an example of Patent Literature 1, in the blocks of 2×2 green (G) pixels on a center left side, the phase difference detection pixel is disposed in an upper right pixel. On the other hand, in the blocks of 2×2 green (G) pixels on a center right side, the phase difference detection pixel is disposed in an upper left pixel.

In the phase difference detection pixel, for example, a light shielding portion is provided in a right half or a left half of the pixel, and a side opposite to the light shielding portion is used as a light transmitting portion. A phase difference is detected from a difference between outputs of a pair of phase difference detection pixels of which positions of the light shielding portions are opposite, and a defocus amount is calculated on the basis of the phase difference. In addition, a focus state is controlled on the basis of the calculated defocus amount.

CITATION LIST

Patent Literature

Patent Literature 1: JP 2015-133469A

DISCLOSURE OF INVENTION

Technical Problem

A normal imaging pixel for imaging a subject is adjacent to a phase difference detection pixel. It is necessary to perform correction for reducing an influence of the phase difference detection pixel with respect to an output of an imaging pixel adjacent to the phase difference detection pixel. According to a position of the phase difference detection pixel disposed among four pixels, in a case in which the disposition position thereof is different for each block, a correction method in an adjacent block is different for each block. As a result, a correction calculation becomes complicated, and in a case in which the correction calculation is simplified, it is difficult to suppress deterioration of the quality of a captured image.

The present technology has been made in consideration of such a situation and is intended to be able to suppress deterioration of quality of a captured image.

Solution to Problem

An aspect of the present technology is a solid-state imaging device in which a sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block.

The sub block can include 2×2 pixels adjacent to each other.

The block can include four Bayer-arranged sub blocks.

The number of the phase difference detection pixels disposed in the block can be equal to or greater than two and is equal to or less than four.

The number of the phase difference detection pixels disposed in the sub block can be one or two.

The sub block in which the phase difference detection pixel is disposed can be a red or blue sub block.

The phase difference detection pixel can detect a phase difference in a horizontal direction or a vertical direction, or a phase difference in an upper left diagonal direction or an upper right diagonal direction.

One of a pair of phase difference detection pixels can be disposed in two pixels of a first sub block, and the other of the pair of phase difference detection pixels can be disposed in two pixels of a second sub block of the same color as the first sub block.

One of a pair of phase difference detection pixels of another direction that detect a phase difference of a second direction different from a first direction in which the phase difference detection pixel of the first sub block detects a phase difference can be disposed in two pixels of a third sub block of which a color is different from the color of the first sub block, and the other of the pair of phase difference detection pixels of the other direction can be disposed in two pixels of a fourth sub block of the same color as the third sub block.

One of a pair of phase difference detection pixels that detect a phase difference can be disposed in each corresponding position of the sub block of a first color, the sub block of a second color, and the sub block of a third color configuring a first block, and the other of the pair of phase difference detection pixels that detect the phase difference can be disposed in each corresponding position of the sub block of the first color, the sub block of the second color, and the sub block of the third color configuring a second block.

Light can enter the phase difference detection pixel through a color filter.

The phase difference detection pixel can be separately detected for each color of the color filter.

The phase difference detection pixel that detects a phase difference of a horizontal direction or a vertical direction can be disposed substantially in a center of an imaging region, and the phase difference detection pixel that detects a phase difference of an upper left diagonal direction or an upper right diagonal direction can be disposed in a diagonal direction of the imaging region.

Positions in the sub blocks in which the phase difference detection pixels are disposed can correspond to each other within the sub block of a first color and within the sub block of a second color different from the first color, but the positions can be different between sub blocks of the first color and sub blocks of the second color.

A detection unit that detects a phase difference on a basis of an output of the phase difference detection pixel can be further included.

An aspect of the present technology is an electronic apparatus including: an image sensor in which pixels for photoelectric conversion of light from a subject are disposed in a planar manner; and a control unit that controls driving of a lens that causes light to be incident on the image sensor on a basis of a phase difference detected by a phase difference detection pixel. In the image sensor, a sub block includes a plurality of pixels of the same color, and the phase difference detection pixels are disposed at positions corresponding to each other in two or more sub blocks in a case in which the phase difference detection pixels are disposed in two or more sub blocks among the plurality of sub blocks configuring the block.

An aspect of the present technology is a lens control method of an electronic apparatus including an image sensor in which pixels for photoelectric conversion of light from a subject are disposed in a planar manner, a sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block, the lens control method including: controlling driving of a lens that causes light to be incident on the image sensor on a basis of a phase difference detected by the phase difference detection pixel.

An aspect of the present technology is a vehicle including: an image sensor in which pixels for photoelectric conversion of light from a subject are disposed in a planar manner; and a control unit that controls driving of a lens that causes light to be incident on the image sensor on a basis of a phase difference detected by a phase difference detection pixel. In the image sensor, a sub block includes a plurality of pixels of the same color, a block includes a plurality of sub blocks including different colors, and the phase difference detection pixels are disposed at positions corresponding to each other in two or more sub blocks in a case in which the phase difference detection pixels are disposed in two or more sub blocks among the plurality of sub blocks configuring the block.

In an aspect of the present technology, a sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block.

Advantageous Effects of Invention

As described above, according to an aspect of the present technology, it is possible to suppress deterioration of quality of a captured image.

Note that the effects described in the present specification are merely examples and are not intended to be limitative and may have additional effects.

BRIEF DESCRIPTION OF DRAWINGS

FIG. 16 is a diagram illustrating a planar configuration example of an embodiment of the image sensor to which the present technology is applied.

FIG. 17 is a diagram illustrating a planar configuration example of an embodiment of the image sensor to which the present technology is applied.

FIG. 18 is a diagram illustrating a planar configuration example of an embodiment of the image sensor to which the present technology is applied.

FIG. 19 is a diagram illustrating a planar configuration example of an embodiment of the image sensor to which the present technology is applied.

FIG. 21 is a diagram illustrating a planar configuration example of an embodiment of the image sensor to which the present technology is applied.

FIG. 22 is a diagram illustrating a planar configuration example of an embodiment of the image sensor to which the present technology is applied.

FIG. 23 is a diagram illustrating a planar configuration example of an embodiment of the image sensor to which the present technology is applied.

FIG. 24 is a diagram illustrating a planar configuration example of an embodiment of the image sensor to which the present technology is applied.

FIG. 25 is a diagram illustrating a planar configuration example of an embodiment of the image sensor to which the present technology is applied.

FIG. 26 is a diagram illustrating a planar configuration example of an embodiment of the image sensor to which the present technology is applied.

Figure 27:
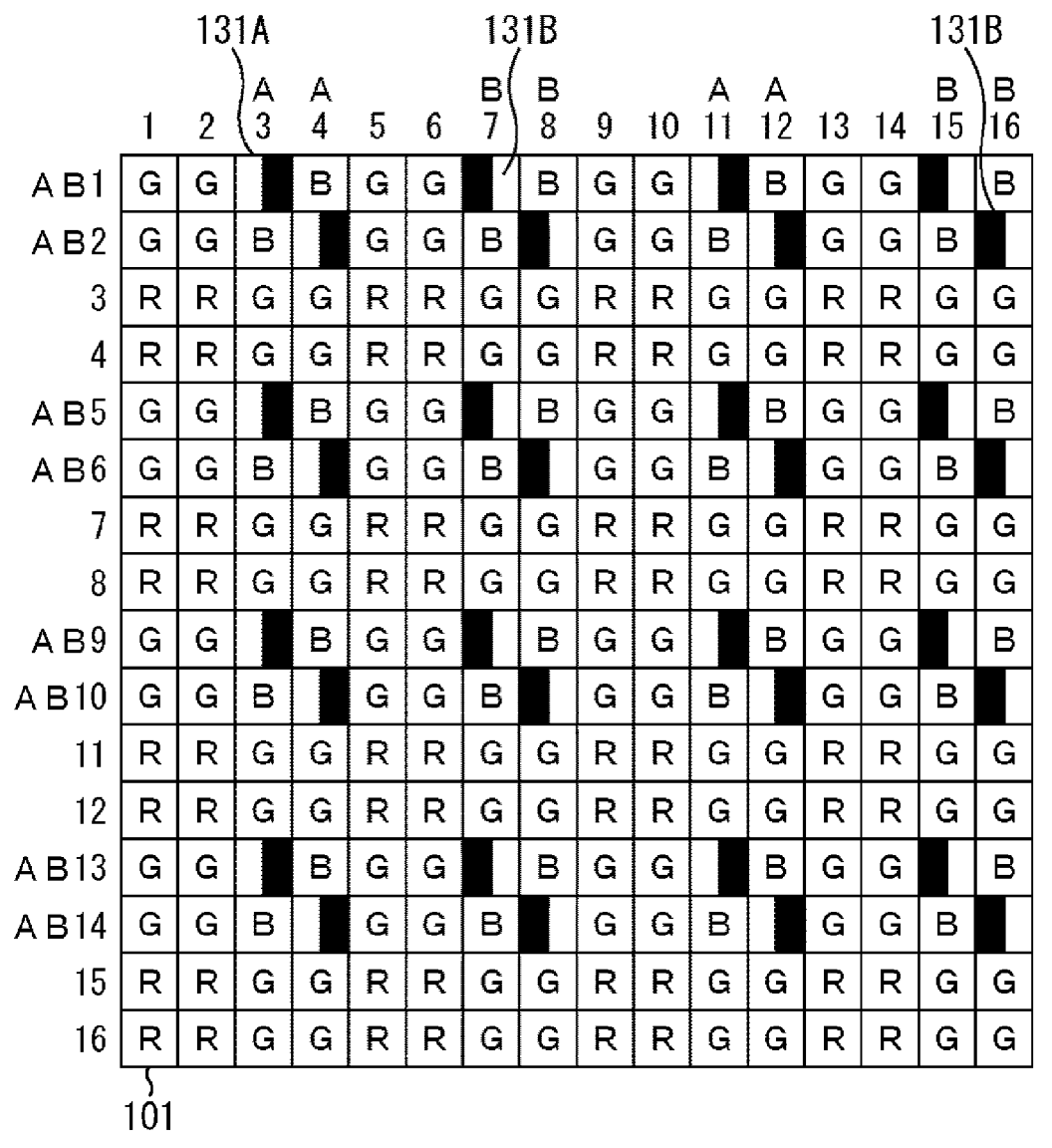

FIG. 27 is a diagram illustrating a planar configuration example of an embodiment of the image sensor to which the present technology is applied.

FIG. 28 is a diagram illustrating a planar configuration example of an embodiment of the image sensor to which the present technology is applied.

FIG. 29 is a diagram illustrating a planar configuration example of an embodiment of the image sensor to which the present technology is applied.

FIG. 30 is a diagram illustrating a planar configuration example of an embodiment of the image sensor to which the present technology is applied.

FIG. 31 is a diagram illustrating a planar configuration example of an embodiment of the image sensor to which the present technology is applied.

FIG. 32 is a diagram illustrating a planar configuration example of an embodiment of the image sensor to which the present technology is applied.

FIG. 33 is a diagram illustrating a planar configuration example of an embodiment of the image sensor to which the present technology is applied.

FIG. 35 is a diagram illustrating a planar configuration example of an embodiment of the image sensor to which the present technology is applied.

FIG. 37 is a diagram illustrating a planar configuration example of an embodiment of the image sensor to which the present technology is applied.

MODE(S) FOR CARRYING OUT THE INVENTION

Figure 1:
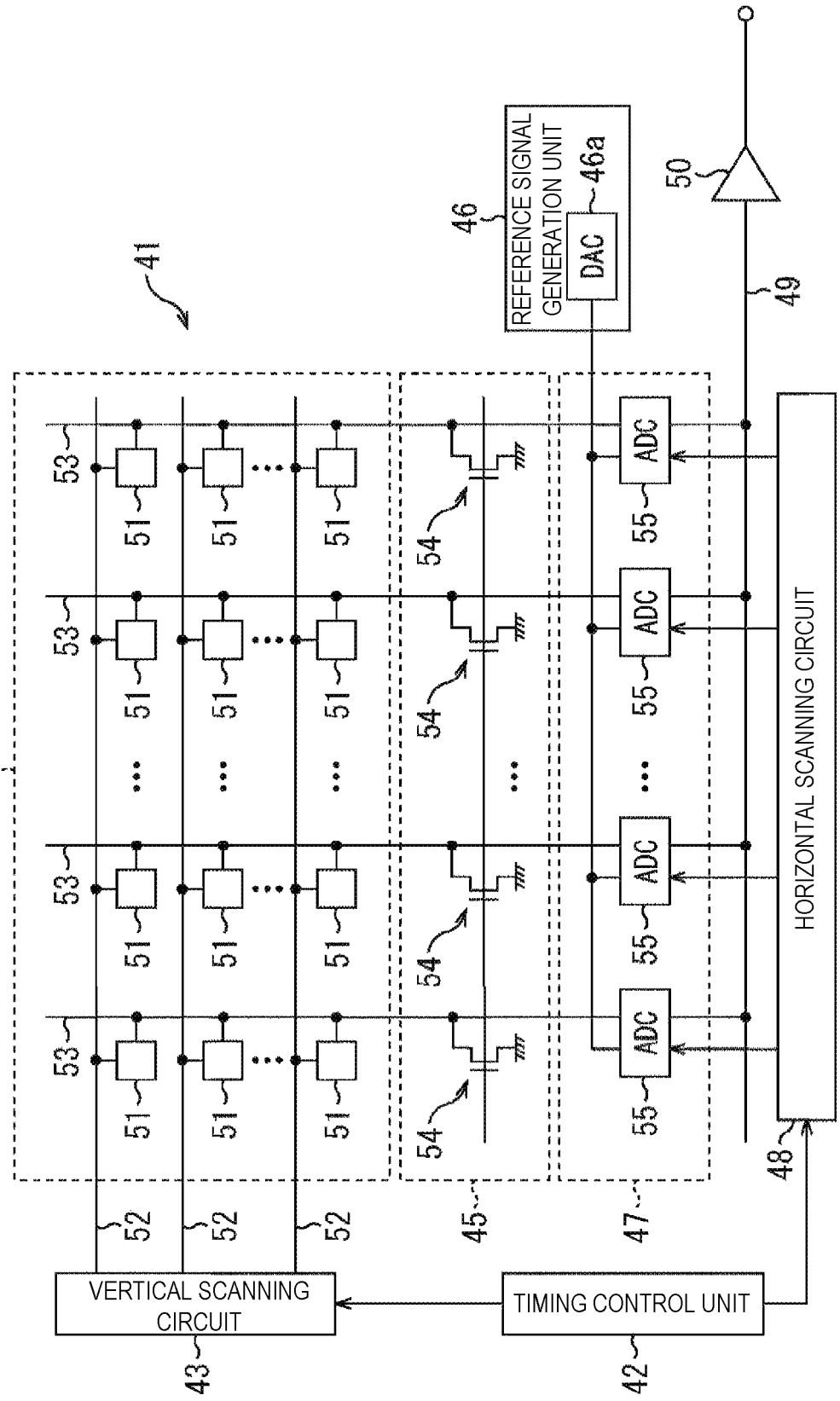
FIG. 1 is a block diagram illustrating a configuration example of an embodiment of an image sensor to which the present technology is applied.

Hereinafter, an embodiment for implementing the present technology (hereinafter, referred to as an embodiment) will be described. Note that the description will be given in the following sequence.

1. First Embodiment
   (1) Disposition of pixels (FIGS. 1 to 4)
   (2) First configuration example (phase difference detection pixels of horizontal direction and vertical direction are disposed in ¼ pixel, B pixel, and R pixel) (FIGS. 5 to 7)
   (3) Principle of phase difference detection (FIGS. 8 to 10)
   (4) Configuration example of electronic apparatus (FIGS. 11 and 12)
   (5) Phase difference autofocus processing (FIGS. 13, 14A, and 14B)
(6) Imaging processing (FIG. 15)
2. Second configuration example (phase difference detection pixels of horizontal direction and vertical direction are disposed in 1/4 pixel, B pixel, and R pixel) (FIG. 16)
3. Third configuration example (phase difference detection pixels of horizontal direction and vertical direction are disposed in 1/4 pixel, B pixel, and R pixel in mixed manner) (FIG. 17)
4. Fourth configuration example (upper left diagonal and upper right diagonal phase difference detection pixels are disposed in 1/4 pixel, B pixel, and R pixel) (FIG. 18)
5. Fifth configuration example (upper right diagonal and upper left diagonal phase difference detection pixels are disposed in 1/4 pixel, B pixel, and R pixel) (FIG. 19)
6. Sixth configuration example (upper left diagonal and upper right diagonal phase difference detection pixels are disposed in 1/4 pixel, B pixel, and R pixel in mixed manner) (FIG. 20)
7. Seventh configuration example (phase difference detection pixels of horizontal direction and vertical direction are disposed in 1/4 pixel, G pixel in row of B pixel, and G pixel in row of R pixel) (FIG. 21)
8. Eighth configuration example (phase difference detection pixels of horizontal direction and vertical direction are disposed in 1/4 pixel, G pixel in row of B pixel, and G pixel in row of R pixel) (FIG. 22)
9. Ninth configuration example (phase difference detection pixels of horizontal direction and vertical direction are disposed in 1/4 pixel, G pixel in row of B pixel, and G pixel in row of R pixel in mixed manner) (FIG. 23)
10. Tenth configuration example (phase difference detection pixels of upper left diagonal and upper right diagonal are disposed in 1/4 pixel, G pixel in row of B pixel, and G pixel in row of R pixel) (FIG. 24)
11. Eleventh configuration example (phase difference detection pixels of upper right diagonal and upper left diagonal are disposed in 1/4 pixel, G pixel in row of B pixel, and G pixel in row of R pixel) (FIG. 25)
12. Twelfth configuration example (phase difference detection pixels of upper left diagonal and upper right diagonal are disposed in 1/4 pixel, G pixel in row of B pixel, and G pixel in row of R pixel in mixed manner) (FIG. 26)
13. Thirteenth configuration example (phase difference detection pixels of the same horizontal direction are disposed in 2/4 pixel and B pixel) (FIG. 27)

14. Fourteenth configuration example (pair of phase difference detection pixels of horizontal direction are disposed in 2/4 pixel and B pixel) (FIG. 28)
15. Fifteenth configuration example (phase difference detection pixels of horizontal direction and vertical direction are disposed in 2/4 pixel and B pixel in mixed manner) (FIG. 29)
16. Sixteenth configuration example (phase difference detection pixels of upper left diagonal and upper right diagonal are disposed in 2/4 pixel and B pixel in mixed manner) (FIG. 30)
17. Seventeenth configuration example (phase difference detection pixels of the same horizontal direction and the same vertical direction are disposed in 2/4 pixel, B pixel, and R pixel) (FIG. 31)
18. Eighteenth configuration example (phase difference detection pixels of the same vertical direction and the same horizontal direction are disposed in 2/4 pixel, B pixel, and R pixel) (FIG. 32)
19. Nineteenth configuration example (pair of phase difference detection pixels of horizontal direction and vertical direction are disposed in 2/4 pixel, B pixel, and R pixel) (FIG. 33)
20. Twentieth configuration example (pair of phase difference detection pixels of upper left diagonal and upper right diagonal are disposed in 2/4 pixel, B pixel, and R pixel) (FIG. 34)
21. Twenty-first configuration example (phase difference detection pixels of horizontal direction are disposed in 1/4 pixel, B pixel, G pixel, and R pixel) (FIGS. 35 and 36)
22. Twenty-second configuration example (phase difference detection pixels of horizontal direction are disposed in 1/4 pixel, B pixel, two G pixels, and R pixel) (FIG. 37)
23. Disposition of phase difference detection pixel (FIG. 38)
24. Modification example (FIG. 39)
25. Application example (FIGS. 40 and 41)
26. Others

1. First Embodiment (1) Disposition of Pixels

FIG. 1 is a block diagram illustrating a configuration example of an embodiment of an image sensor to which the present technology is applied.

An image sensor 41 of FIG. 1 includes a timing control unit 42, a vertical scanning circuit 43, a pixel array unit 44, a constant current source circuit unit 45, a reference signal generation unit 46, and a column analog to digital (AD) conversion unit 47 on a semiconductor substrate that is not shown. In addition, a horizontal scanning circuit 48, a horizontal output line 49, and an output circuit 50 are provided.

The timing control unit 42 supplies a clock signal or a timing signal necessary for a predetermined operation to the vertical scanning circuit 43 and the horizontal scanning circuit 48 on a basis of a master clock of a predetermined frequency. For example, the timing control unit 42 supplies a timing signal of a shutter operation or a read operation of a pixel 51 to the vertical scanning circuit 43 and the horizontal scanning circuit 48. In addition, although not shown, the timing control unit 42 also supplies the clock signal or the timing signal necessary for the predetermined operation to the reference signal generation unit 46, the column AD conversion unit 47, and the like.

The vertical scanning circuit 43 sequentially supplies a signal for controlling an output of a pixel signal to each pixel 51 arranged in a vertical direction of the pixel array unit 44 at a predetermined timing.

In the pixel array unit 44, a plurality of pixels 51 are disposed in a two-dimensional array form (a matrix form). That is, M×N pixels 51 are disposed in a planar manner. Values of M and N are arbitrary integers.

The plurality of pixels 51 disposed in the two-dimensional array form are connected to the vertical scanning circuit 43 on a row basis by a horizontal signal line 52. In other words, the plurality of pixels 51 disposed in the same row in the pixel array unit 44 are connected to the vertical scanning circuit 43 by the same one horizontal signal line 52. In addition, in FIG. 1, although one line is shown for the horizontal signal line 52, the horizontal signal line 52 is not limited to one line.

In addition, the plurality of pixels 51 disposed in the two-dimensional array form are connected to the horizontal scanning circuit 48 on a column basis by a vertical signal line 53. In other words, the plurality of pixels 51 disposed in the same column in the pixel array unit 44 are connected to the horizontal scanning circuit 48 by the same one vertical signal line 53.

Each pixel 51 in the pixel array unit 44 outputs the pixel signal corresponding to a charge accumulated therein to the vertical signal line 53 according to a signal supplied from the vertical scanning circuit 43 through the horizontal signal line 52. The pixel 51 functions as a pixel for imaging (hereinafter, referred to as an imaging pixel) that outputs a pixel signal of an image of a subject or a pixel for phase difference detection (hereinafter, referred to as a phase difference detection pixel). A detailed configuration of the pixel 51 will be described later with reference to FIG. 2 and the like.

The constant current source circuit unit 45 has a plurality of load metal-oxide semiconductors (MOSs) 54, and one load MOS 54 is connected to one vertical signal line 53. A bias voltage is applied to a gate of the load MOS 54, a source of the load MOS 54 is grounded, and the load MOS 54 configures a source follower circuit together with a transistor in the pixel 51 connected through the vertical signal line 53.

The reference signal generation unit 46 has a digital to analog converter (DAC) 46a, generates a reference signal of a ramp waveform according to the clock signal from the timing control unit 42, and supplies the reference signal to the column AD conversion unit 47.

The column AD conversion unit 47 has a plurality of analog to digital converters (ADCs) 55 of which there is one for each column of the pixel array unit 44. Therefore, the plurality of pixels 51, one load MOS 54, and one ADC 55 are connected to one vertical signal line 53.

The ADC 55 performs correlated double sampling (CDS) processing and further performs AD conversion processing on the pixel signal supplied from the pixel 51 of the same column through the vertical signal line 53.

Each ADC 55 temporarily stores pixel data after the AD conversion and outputs the pixel data to the horizontal output line 49 according to the control of the horizontal scanning circuit 48.

The horizontal scanning circuit 48 sequentially outputs the pixel data stored in the plurality of ADCs 55 to the horizontal output line 49 at a predetermined timing.

The horizontal output line 49 is connected to an output circuit (an amplification circuit) 50, and the pixel data after the AD conversion that is output from each ADC 55 is output from the output circuit 50 to the outside of the image sensor 41 through the horizontal output line 49. For example, the output circuit 50 (signal processing unit) may only perform buffering in some cases, or perform various kinds of digital signal processing such as black level adjustment and column variation correction in some cases.

The image sensor 41 configured as described above is a CMOS image sensor referred to as a column AD method in which the ADCs 55 that perform the CDS processing and the AD conversion processing are disposed for each vertical column.

Figure 2:
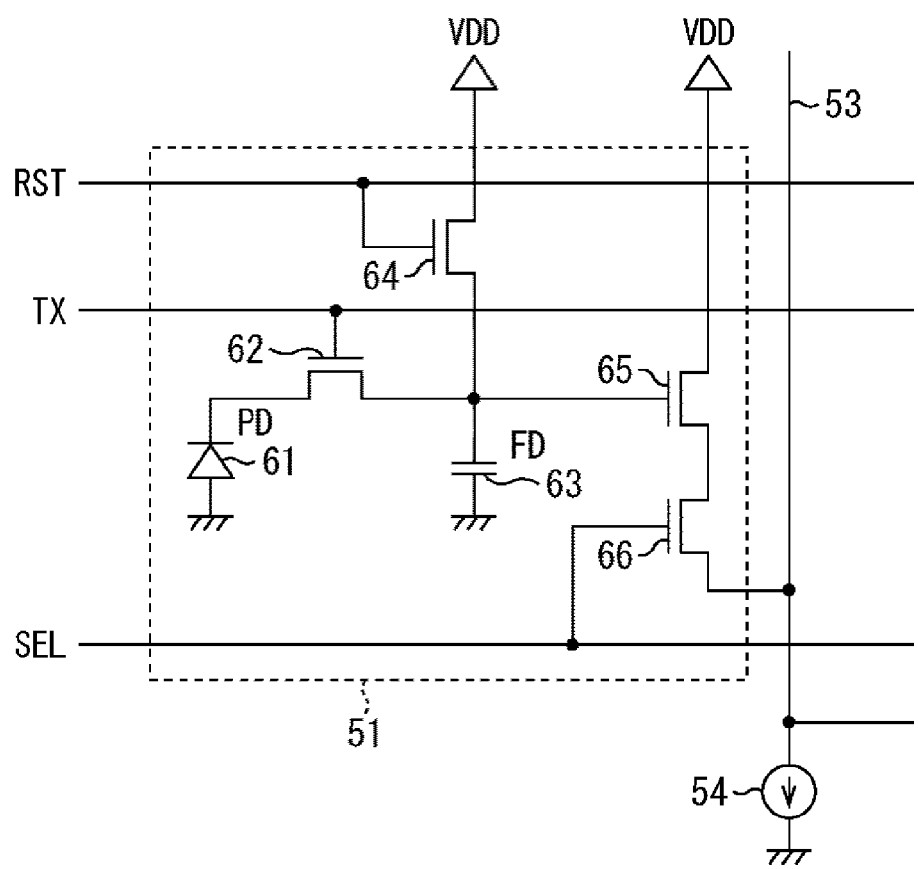
FIG. 2 is a diagram illustrating an equivalent circuit of a pixel.

FIG. 2 illustrates an equivalent circuit of the pixel 51. The pixel 51 has a photodiode 61 as a photoelectric conversion element, a transmission transistor 62, a floating diffusion (FD: floating diffusion region) 63, a reset transistor 64, an amplification transistor 65, and a selection transistor 66.

The photodiode 61 is a photoelectric conversion unit that generates and accumulates a charge (a signal charge) according to a received amount of light. An anode terminal of the photodiode 61 is grounded and a cathode terminal of the photodiode 61 is connected to the FD 63 through the transmission transistor 62.

When the transmission transistor 62 is turned on by a transmission signal TX, the transmission transistor 62 reads the charge generated by the photodiode 61 and transmits the charge to the FD 63.

The FD 63 holds the charge read from the photodiode 61. When the reset transistor 64 is turned on by a reset signal RST, the reset transistor 64 resets a potential of the FD 63 by discharging the charge accumulated in the FD 63 to a constant voltage source VDD.

The amplification transistor 65 outputs a pixel signal according to the potential of the FD 63. That is, the amplification transistor 65 configures a source follower circuit together with the load MOS 54 as the constant current source, and the pixel signal indicating a level according to the charge accumulated in the FD 63 is output from the amplification transistor 65 to the ADC 55 through the selection transistor 66.

The selection transistor 66 is turned on when the pixel 51 is selected by a selection signal SEL and outputs the pixel signal of the pixel 51 to the ADC 55 through the vertical signal line 53. The transmission signal TX, the reset signal RST, and the selection signal SEL are supplied from the vertical scanning circuit 43 through the horizontal signal line 52 (FIG. 1).

Figure 3:
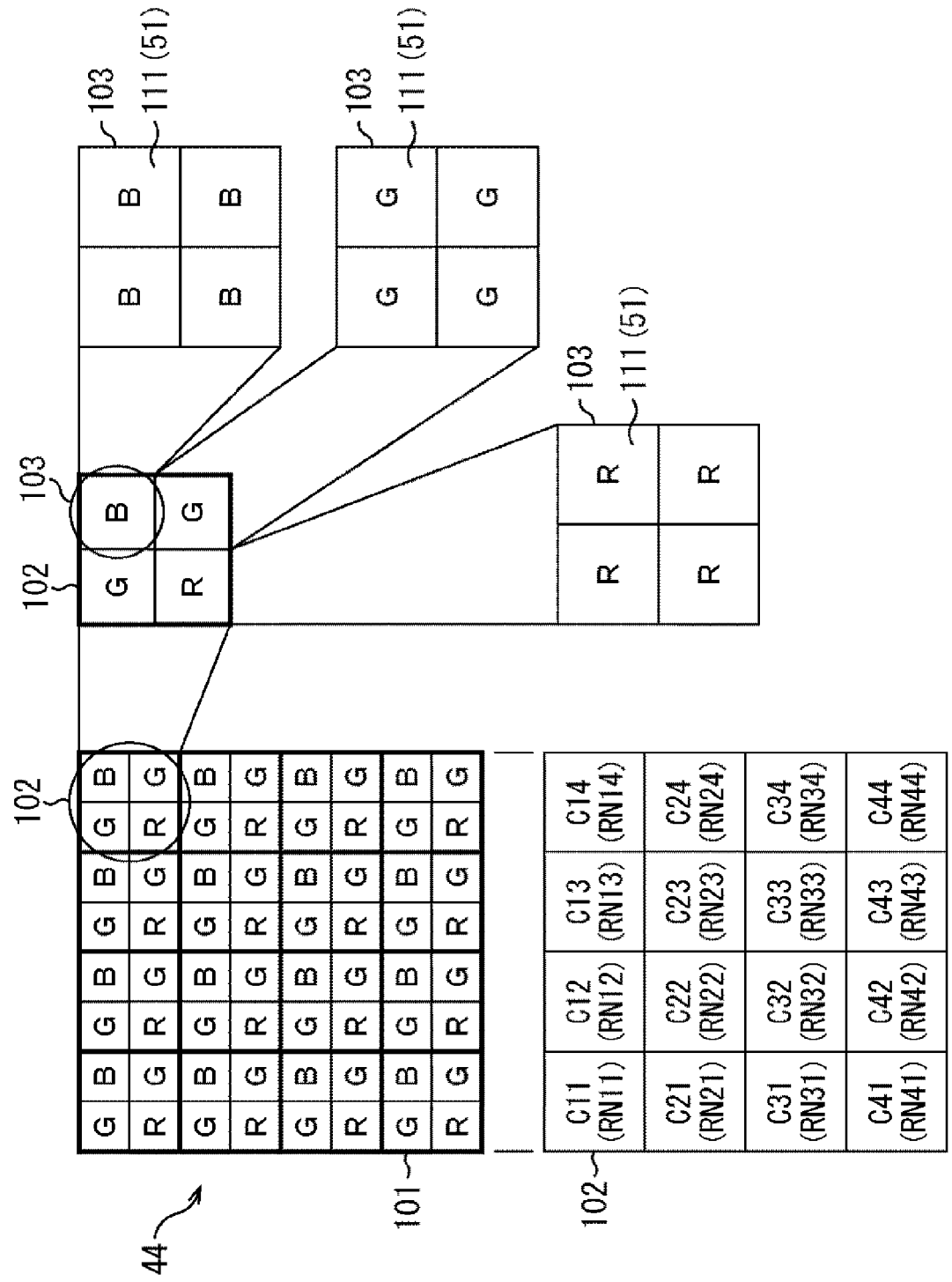
FIG. 3 is a diagram illustrating a planar configuration example of an embodiment of the image sensor to which the present technology is applied.

FIG. 3 is a diagram illustrating a planar configuration example of an embodiment of the image sensor to which the present technology is applied. Specifically, FIG. 3 shows an arrangement of the pixels 51. That is, in the present embodiment, the pixel array unit 44 captures the image of the subject using an imaging region 101. The imaging region 101 includes a plurality of blocks 102 disposed in a matrix form of M/4×N/4. This block 102 configures a unit of the captured image. That is, the subject is imaged as a set of units of a predetermined color (a color synthesized with red (R), green (G), and blue (B)) for each block 102 and is displayed (that is, recognized by a human eye).

In a case of this embodiment, the block 102 is configured by arranging sub blocks 103 in a Bayer arrangement. That is, the block 102 includes four sub blocks 103 disposed in a 2×2 matrix form including one red (R) sub block 103, two green (G) sub blocks 103, and one blue (B) sub block 103.

In this example, the green (G) sub block 103 is disposed at an upper left and lower right of the block 102, the red (R) sub block 103 is disposed at a lower left of the block 102, and the blue (B) sub block 103 is disposed at an upper right of the block 102, respectively. In all the blocks 102, a disposition pattern of the sub blocks 103 is the same. In addition, in the following description, the red (R), green (G), and blue (B) sub blocks 103 are described as an R sub block 103, a G sub block 103, and a B sub block 103, respectively, as occasion demands.

A color of the image of the subject of a corresponding position is imaged and expressed as an image, by the color synthesized by a total of four sub blocks 103 of one lower left R sub block 103, two upper left and lower right G sub blocks 103, and one upper right B sub block 103. That is, as shown in FIG. 3, each region corresponding to the plurality of blocks 102 disposed in the matrix form in M/4×N/4 is set as $RN_{ij}$ (i and j denotes row and column positions of the block 102). In addition, the color of the subject is imaged and expressed as a color $C_{ij}$ for each region $RN_{ij}$. That is, the $C_{ij}$ synthesized by the total of the four sub blocks 103 of the one lower left R sub block 103, the two upper left and lower right G sub blocks 103, and the one upper right B sub block 103 configuring the block 102 is imaged as the color of the region $RN_{ij}$ of the subject.

In addition, in this embodiment, the sub block 103 includes 2×2 pixels 111 of the same color of a matrix form that are adjacent to each other. The pixel 111 corresponds to the pixel 51 of FIGS. 1 and 2. In the following description, the pixels 111 of red (R), green (G), and blue (B) are described as an R pixel 111, a G pixel 111, and a B pixel 111, respectively, as occasion demands. That is, the R sub block 103 includes 2×2 R pixels 111 of the matrix form. The G sub block 103 includes 2×2 G pixels 111 of the matrix form. The B sub block 103 includes 2×2 B pixels 111 of the matrix form. Although the 2×2 pixels 111 of the same color configuring the one sub block 103 are able to be read independently, the 2×2 pixels 111 are also able to be read collectively as one sub block 103.

Figure 4:
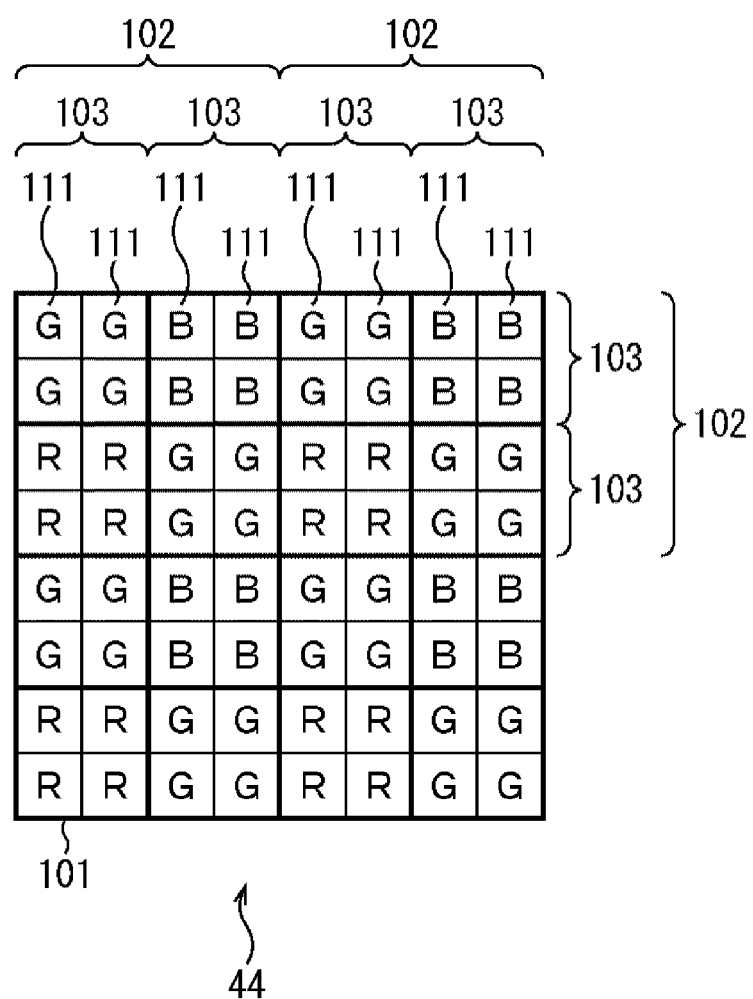
FIG. 4 is a diagram illustrating a planar configuration example of an embodiment of the image sensor to which the present technology is applied.

FIG. 4 is a diagram illustrating a planar configuration example of an embodiment of the image sensor to which the present technology is applied. That is, in a case where the imaging region 101 of FIG. 3 is expressed by the pixel 111, the imaging region 101 is as shown in FIG. 4. The one sub block 103 includes the 2×2 pixels 111 of the same color. Specifically, the one R sub block 103 includes 2×2 R pixels 111. Similarly, the one G sub block 103 includes 2×2 G pixels 111, and the one B sub block 103 includes 2×2 B pixels 111.

In addition, the one block 102 includes the 2×2 sub blocks 103 (the one R sub block 103, the two G sub blocks 103, and the one B sub block 103).

That is, in the imaging region 101, the sub block 103 includes the plurality of pixels 111 of the same color, and the block 102 includes the plurality of sub blocks 103 including different colors. In addition, the synthesized color of the block 102 in which the different colors of the plurality of sub blocks 103 are synthesized is recognized by a person as a color of an imaging point of the subject of a position corresponding to the block 102.

(2) First Configuration Example (Phase Difference Detection Pixels of Horizontal Direction and Vertical Direction are Disposed in 1/4 Pixel, B Pixel, and R Pixel)

Figure 5:
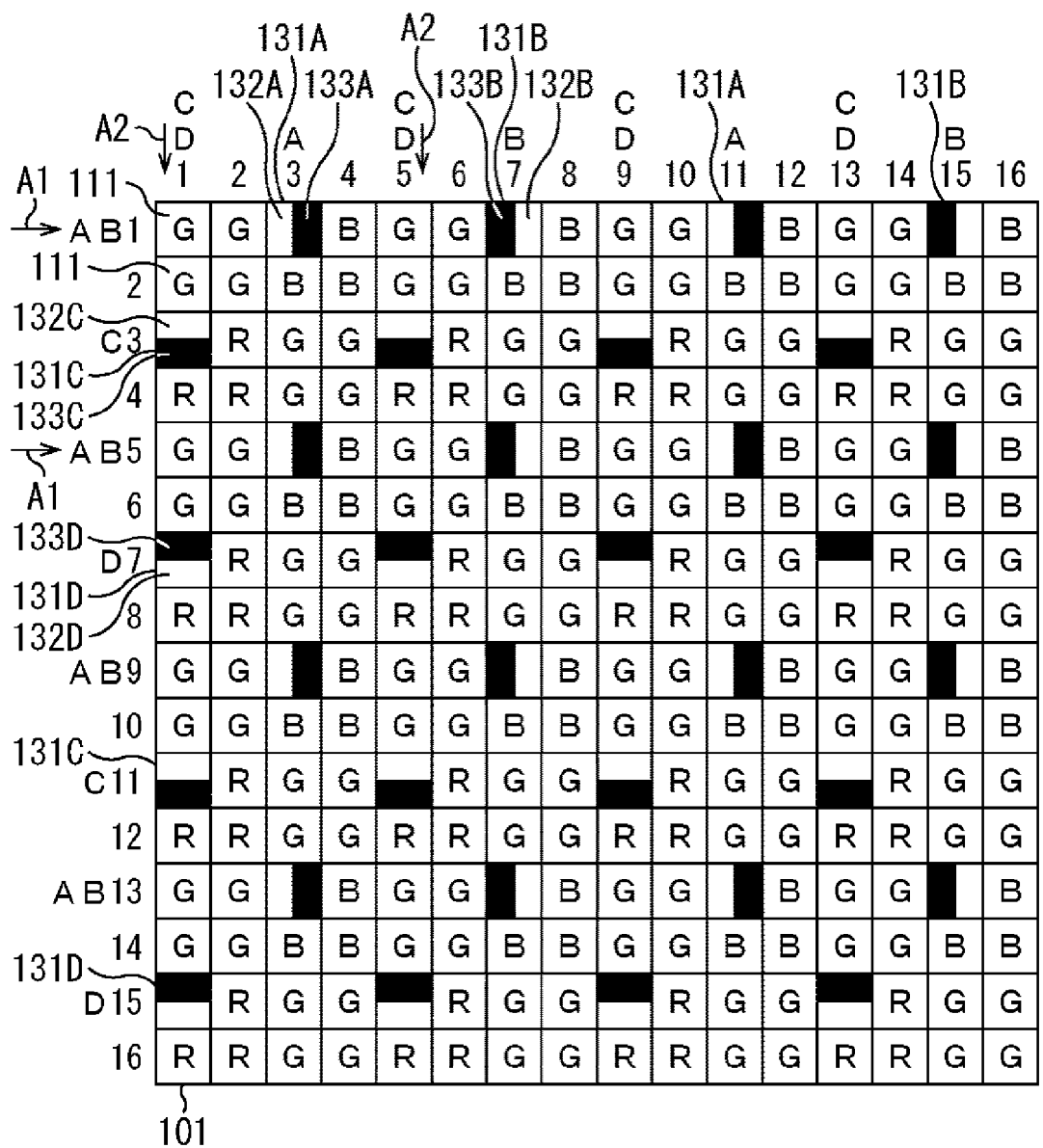
FIG. 5 is a diagram illustrating a planar configuration example of an embodiment of the image sensor to which the present technology is applied.

FIG. 5 is a diagram illustrating a planar configuration example of an embodiment of the image sensor to which the present technology is applied. In the first configuration example, m×n pixels 111 are regularly arranged in the imaging region 101 of the image sensor 41. In this example, although m=n=16 is set, a value of m is an arbitrary integer equal to or greater than 1 and equal to or less than M and a value of n is an arbitrary integer equal to or greater than 1 and equal to or less than N.

In the configuration example of FIG. 5, the pixels where the G pixels are disposed are the pixels 111 of intersection points of each row of a first row and a second row, a fifth row and a sixth row, a ninth row and a tenth row, and a thirteenth row and a fourteenth row, and each column of a first column and a second column, a fifth column and a sixth column, a ninth column and a tenth column, and a thirteenth column and a fourteenth column. These configure the upper left G sub block 103 in the block 102. In addition, the G pixels are disposed at intersection points of each row of a third row and a fourth row, a seventh row and an eighth row, an eleventh row and a twelfth row, and a fifteenth row and a sixteenth row, and each column of a third column and a fourth column, a seventh column and an eighth column, an eleventh column and a twelfth column, and a fifteenth column and a sixteenth column. These configure the lower right G sub block 103 in the block 102.

The pixels where the B pixels are disposed are the pixels 111 of intersection points of each row of the first row and the second row, the fifth row and the sixth row, the ninth row and the tenth row, and the thirteenth row and the fourteenth row, and each column of the third column and the fourth column, the seventh column and the eighth column, the eleventh column and the twelfth column, and the fifteenth column and the sixteenth column. These configure the upper right B sub block 103 in the block 102.

The pixels where the R pixels are disposed are the pixels 111 of intersection points of each row a third row and a fourth row, a seventh row and an eighth row, an eleventh row and a twelfth row, and a fifteenth row and a sixteenth row, and each column of a first column and a second column, a fifth column and a sixth column, a ninth column and a tenth column, and a thirteenth column and a fourteenth column. These configure the lower left R sub block 103 in the block 102.

The disposition of the pixels 111 of R, G and B is the same in the other configuration examples in or after FIG. 16, and the description thereof will be omitted.

Basically, the m×n pixels 111 are the imaging pixels of the R, G, and B, but in the sub block 103 in which the phase difference detection pixels 131 are disposed, some of the pixels 111 may be substituted to the phase difference detection pixels 131. Therefore, the phase difference detection pixels 131 are regularly disposed in a specific pattern as a whole. In the configuration example of FIG. 5, a plurality of phase difference detection pixels 131 in which half of the pixels are indicated by a black rectangle and other half is indicated by a white rectangle are scattered and disposed in the plurality of pixels 111 that are two-dimensionally disposed in the matrix form.

In the configuration example of FIG. 5, in any of the B sub block 103 and the R sub block 103, the pixel 111 of the upper left that is relatively same position (corresponding position) is set as the phase difference detection pixel 131 among 2×2 pixels 111. Specifically, in the B sub block 103, the phase difference detection pixel 131 for detecting a phase difference of a horizontal direction (a horizontal direction) is disposed in the pixel 111 of the upper left.

In addition, in the pixels 111 of the third row and the eleventh row, a phase difference detection pixel 131A configuring one of a pair of phase difference detection pixels 131A and 131B for detecting a phase difference of a horizontal direction is disposed. In the pixels 111 of the seventh row and the fifteenth row, the phase difference detection pixel 131B configuring the other of the pair for detecting the phase difference of the horizontal direction is disposed.

Figure 6:
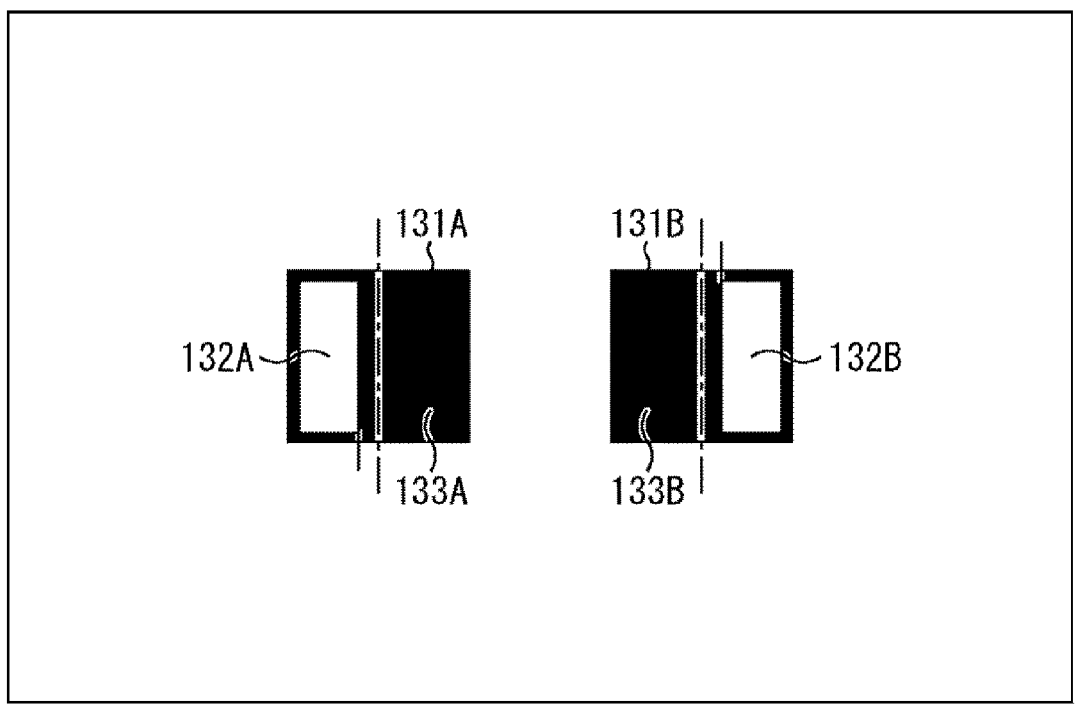
FIG. 6 is a diagram illustrating a configuration of an opening of an embodiment of the image sensor to which the present technology is applied.

FIG. 6 is a diagram illustrating a configuration of an opening of an embodiment of the image sensor to which the present technology is applied. On a left side of FIG. 6, the phase difference detection pixel 131A of the pair of phase difference detection pixels 131A and 131B for detecting the phase difference of the horizontal direction is shown. In the phase difference detection pixel 131A, a light shielding portion 133A is formed on a right side thereof and a light transmitting portion 132A is formed on a left side thereof. In this example, the light shielding portion 133A that shields light facing from the subject to the photodiode 61 includes, for example, a metal film such as copper. In addition, the light transmitting portion 132A that transmits the light from the subject to the photodiode 61 is formed by opening a part of the metal film forming the light shielding portion 133A. That is, the opening is also able to be formed by not forming the light shielding portion 133A.

On the other hand, in the phase difference detection pixel 131B shown in a right side of FIG. 6 that is paired with the phase difference detection pixel 131A, a light shielding portion 133B is formed on a left side thereof and a light transmitting portion 132B is formed on a right side thereof. Also in this example, the light shielding portion 133B that shields the light facing from the subject to the photodiode 61 includes, for example, a metal film such as copper, and the light transmitting portion 132B that transmits the light from the subject to the photodiode 61 is formed by opening a part of the metal film forming the light shielding portion 133B. That is, the opening is also able to be formed by not forming the light shielding portion 133B.

As shown in FIG. 5, in the R sub block 103, the phase difference detection pixel 131 for detecting the phase difference of a vertical direction (a vertical direction) is disposed in the pixel 111 of the upper left among the 2×2 pixels 111. That is, in the pixels 111 of the third row and the eleventh row, a phase difference detection pixel 131C configuring one of a pair of phase difference detection pixels 131C and 131D for detecting the phase difference of the vertical direction is disposed. In the pixels 111 of the seventh row and the fifteenth row, the phase difference detection pixel 131D configuring the other of the pair for detecting the phase difference of the vertical direction is disposed. In a case in which the phase difference detection pixels 131 are disposed, the number of the phase difference detection pixels 131 is one in the one sub block 103 and two in the one block 102.

Figure 7:
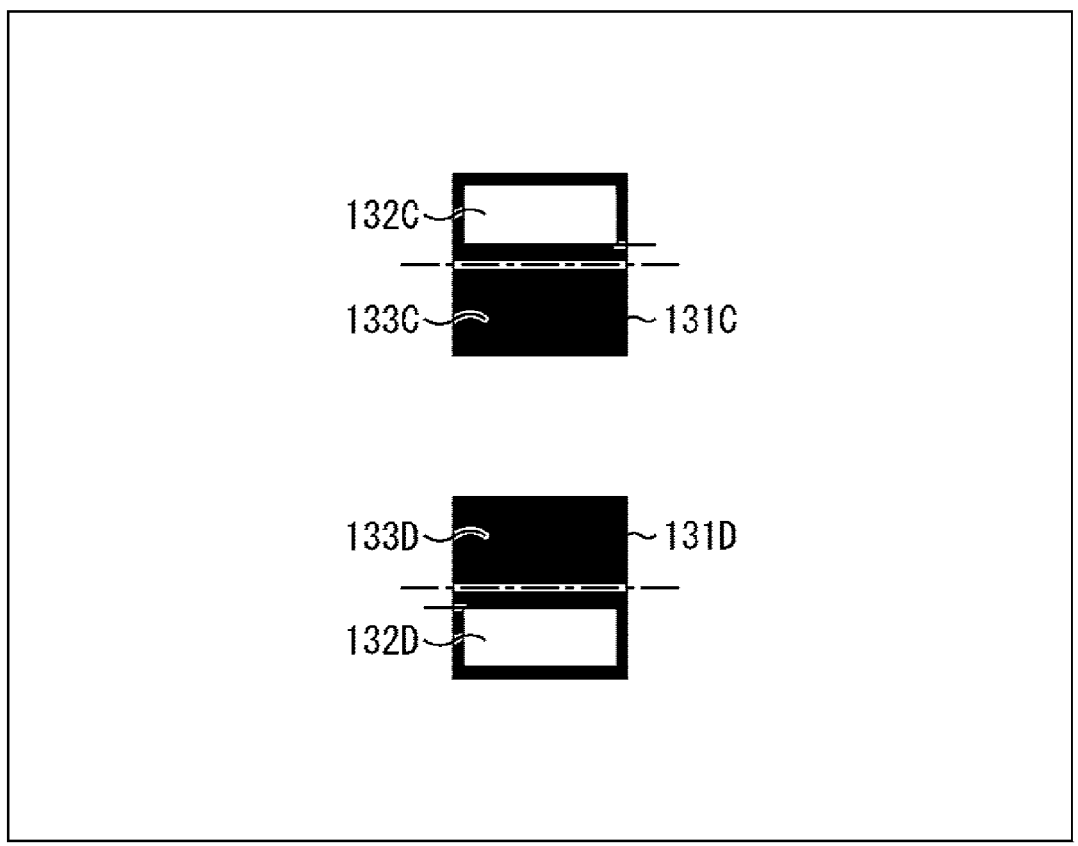
FIG. 7 is a diagram illustrating a configuration of an opening of an embodiment of the image sensor to which the present technology is applied.

FIG. 7 is a diagram illustrating a configuration of an opening of an embodiment of the image sensor to which the present technology is applied. On an upper side of FIG. 7, the phase difference detection pixel 131C of the pair of phase difference detection pixels 131C and 131D for detecting the phase difference of the vertical direction is shown. In the phase difference detection pixel 131C, a light shielding portion 133C is formed on a lower side thereof and a light transmitting portion 132C is formed on an upper side thereof. In this example, the light shielding portion 133C that shields light facing from the subject to the photodiode 61 includes, for example, a metal film such as copper. In addition, the light transmitting portion 132C that transmits the light from the subject to the photodiode 61 is formed by opening a part of the metal film forming the light shielding portion 133D. That is, the opening is also able to be formed by not forming the light shielding portion 133C.

On the other hand, in the phase difference detection pixel 131D shown in a lower side of FIG. 7 that is paired with the phase difference detection pixel 131C, a light shielding portion 133D is formed on an upper side thereof and a light transmitting portion 132D is formed on a lower side thereof. Also in this example, the light shielding portion 133D that shields the light facing from the subject to the photodiode 61 includes, for example, a metal film such as copper, and the light transmitting portion 132D that transmits the light from the subject to the photodiode 61 is formed by opening a part of the metal film forming the light shielding portion 133D. That is, the opening is also able to be formed by not forming the light shielding portion 133D.

In addition, in the first configuration example of FIG. 5, the detection of the phase difference of the horizontal direction is possible only with an output of the phase difference detection pixel 131 of the B pixel 111 and the detection of the phase difference of the vertical direction is possible only with an output of the phase difference detection pixel 131 of the R pixel 111. Therefore, signal processing becomes easy. The detection of the phase difference of the horizontal direction is possible by reading the phase difference detection pixel 131 of at least one row, but the detection of the phase difference of the vertical direction is possible by reading the phase difference detection pixel 131 of at least two rows. One of the phase difference detection pixels 131 of the R pixel 111 and the B pixel 111 may be omitted and only one of the phase difference of the horizontal direction and the phase difference of the vertical direction may be detected.

(3) Principle of Phase Difference Detection

Figure 8:
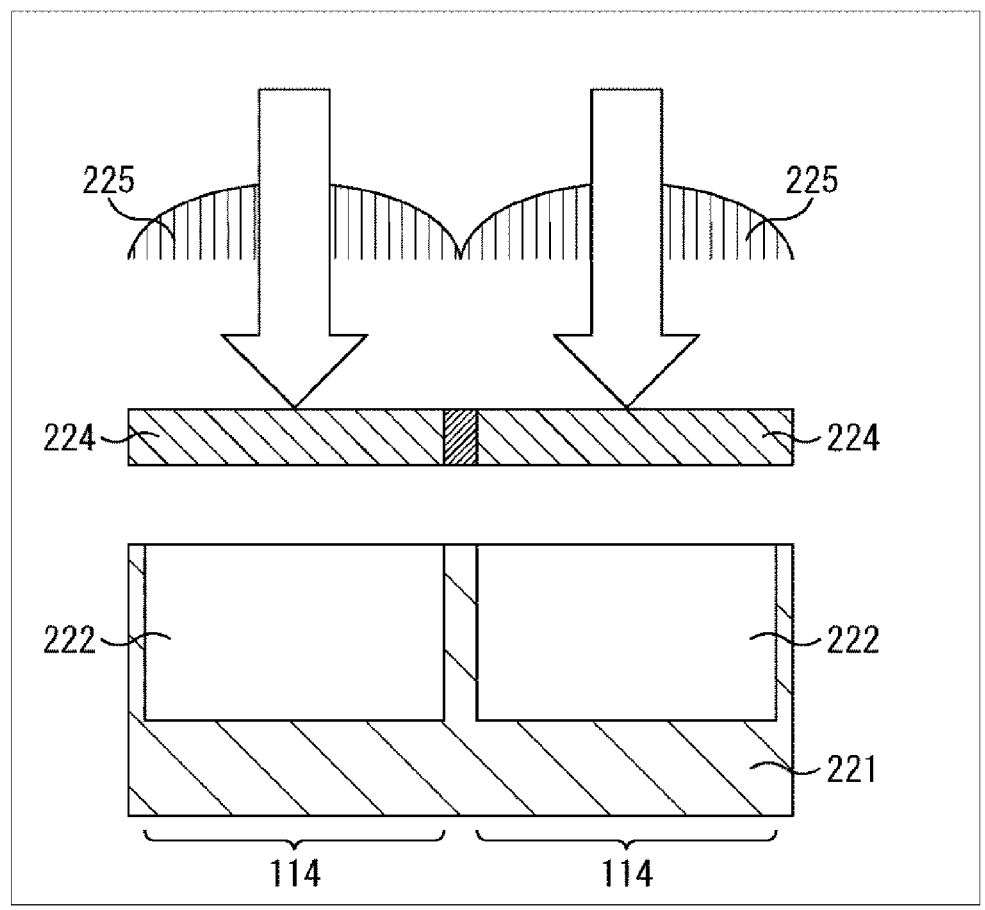
FIG. 8 is a cross-sectional view illustrating a configuration example of an imaging pixel of an embodiment of the image sensor to which the present technology is applied.

FIG. 8 is a cross-sectional view illustrating a configuration example of the imaging pixel of an embodiment of the image sensor to which the present technology is applied. FIG. 8 shows a sectional configuration of two imaging pixels 114 among the pixels 111. As shown in FIG. 8, for example, in the imaging pixel 114, a photodiode 222 (corresponding to the photodiode 61 of FIG. 2) as a photoelectric conversion unit is formed on a semiconductor substrate 221 of Si (silicon). An R, G or B color filter 224 is formed on an upper layer of the semiconductor substrate 221 and an on-chip lens 225 is formed in an upper layer thereof.

The light from the subject is condensed by the on-chip lens 225, passes through the R, G or B color filter 224, and light of a color corresponding to the color filter 224 is incident on the photodiode 222. Therefore, a color signal (a pixel signal) of a light component of the color corresponding to the color filter 224 is output from the photodiode 222.

Figure 9:
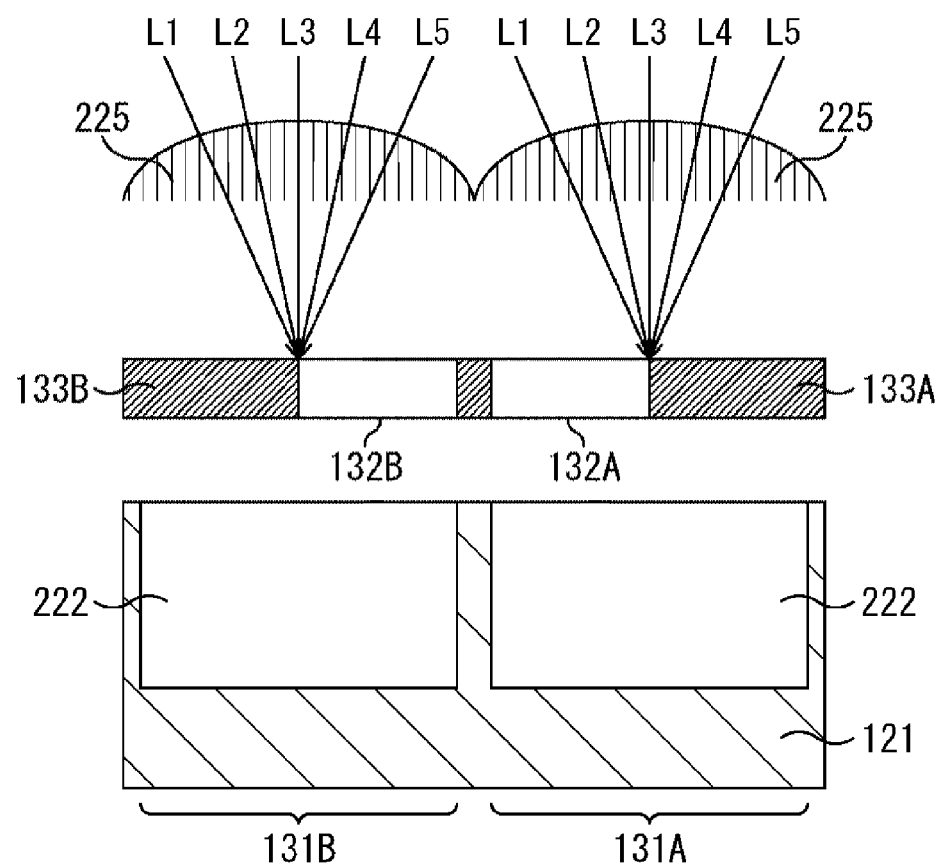
FIG. 9 is a cross-sectional view illustrating a configuration example of a phase difference detection pixel of an embodiment of the image sensor to which the present technology is applied.

FIG. 9 is a cross-sectional view illustrating a configuration example of the phase difference detection pixel of an embodiment of the image sensor to which the present technology is applied. For the sake of convenience, FIG. 9 shows cross-sectional configurations of the two phase difference detection pixels 131A and 131B side by side. As shown in FIG. 9, the configuration of the phase difference detection pixel 131 is basically the same as that of the imaging pixel 114 shown in FIG. 8, but instead of the color filter 224 of FIG. 8, the light shielding portions 133A and 133B and the light transmitting portions 132A and 132B are disposed. The configurations of the light shielding portions 133A and 133B and the light transmitting portions 132A and 132B are the same as those described with reference to FIGS. 6 and 7.

Therefore, for example, in the phase difference detection pixel 131A, some of the light condensed by the on-chip lens 225 passes through the light transmitting portion 132A and is incident on the photodiode 222. However, some of the light condensed by the on-chip lens 225 is shielded by the light shielding portion 133A disposed on the right side of the light transmitting portion 132A in FIG. 9 and does not enter the photodiode 222.

In addition, in the phase difference detection pixel 131B, some of the light condensed by the on-chip lens 225 passes through the light transmitting portion 132B and is incident on the photodiode 222. However, some of the light condensed by the on-chip lens 225 is shielded by the light shielding portion 133B disposed on the left side of the light transmitting portion 132B in FIG. 9 and does not enter the photodiode 222.

Figure 10:
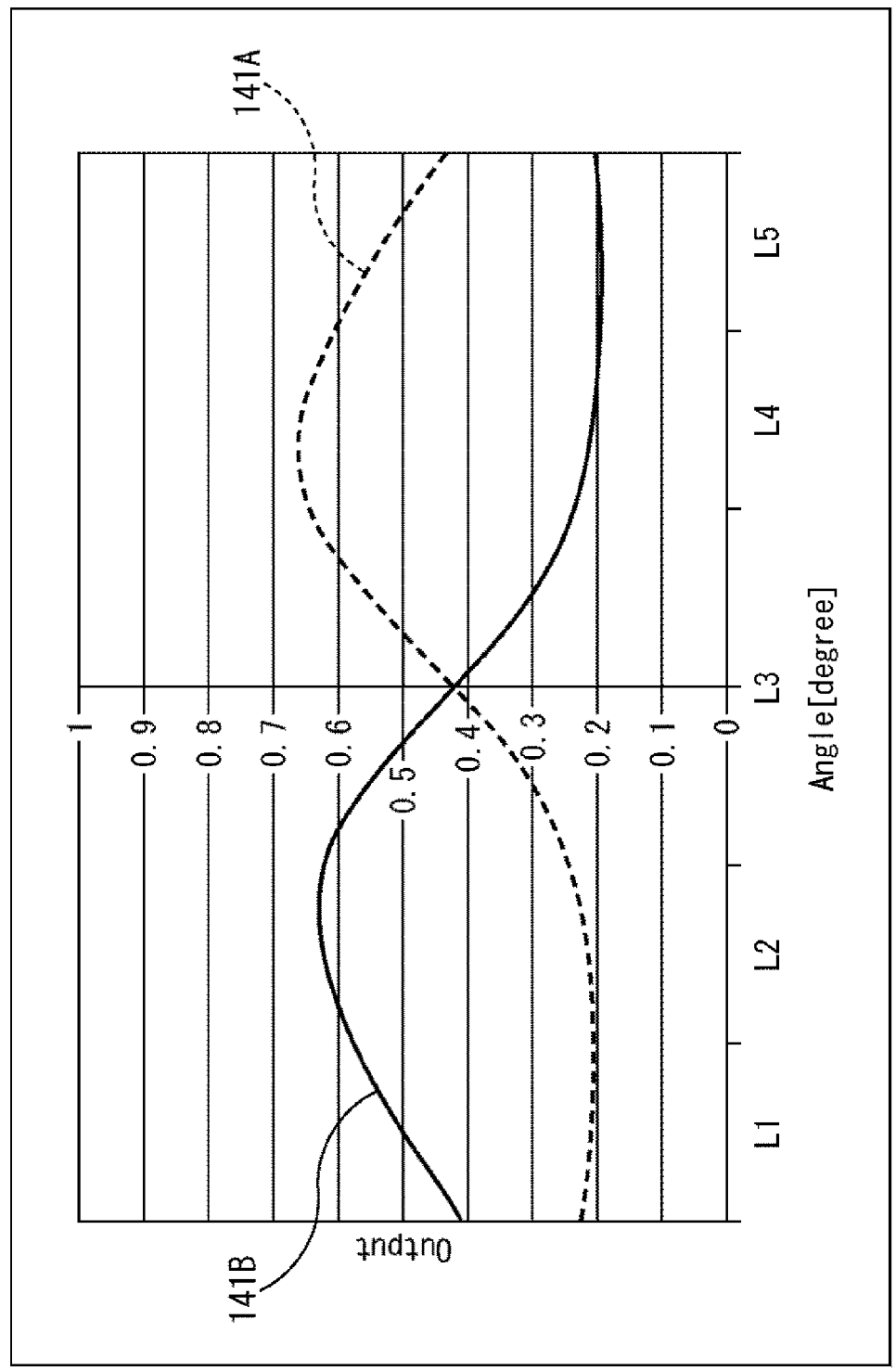
FIG. 10 is a diagram for explaining phase difference characteristics of the phase difference detection pixel of an embodiment of the image sensor to which the present technology is applied.

FIG. 10 is a diagram for explaining phase difference characteristics of the phase difference detection pixel of an embodiment of the image sensor to which the present technology is applied. Hereinafter, the principle of the phase difference detection will be described with reference to FIGS. 9 and 10.

As shown in FIG. 9, it is assumed that incident light L1 to L5 from five directions are incident on the phase difference detection pixels 131A and 131B. A graph of FIG. 10 shows pixel signal outputs of the phase difference detection pixels 131A and 131B at that time.

In the graph of FIG. 10, a horizontal axis shows an incident angle of the incident light, and a vertical axis shows the pixel signal outputs of the phase difference detecting pixels 131A and 131B. Note that a solid line 141B indicates the pixel signal output of the phase difference detection pixel 131B, and a broken line 141A indicates the pixel output of the phase difference detection pixel 131A.

As shown in this graph, in a case in which an angle of the incident light is given to a left side (a minus side), the output of the phase difference detection pixel 131B of a left side light shielding is increased, and in a case in which an angle of the incident light is given to a right side (a plus side), the output of the phase difference detection pixel 131A of a right side light shielding is increased. That is, in a case in which an angle component of a minus direction is large in the incident light as incident light L1, the output of the phase difference detection pixel 131B is larger than the output of the phase difference detection pixel 131A. In addition, in a case in which an angle component of a plus direction is large in the incident light like incident light L5, the pixel signal output of the phase difference detection pixel 131A is larger than the pixel signal output of the phase difference detection pixel 131B.

The defocus amount is detected using such a phase difference characteristic of the pixel signal outputs of each of the phase difference detection pixels 131 with respect to the incident angle of the incident light in the pair of phase difference detection pixels 131. [0085]

(4) Configuration Example of Electronic Apparatus

Figure 11:
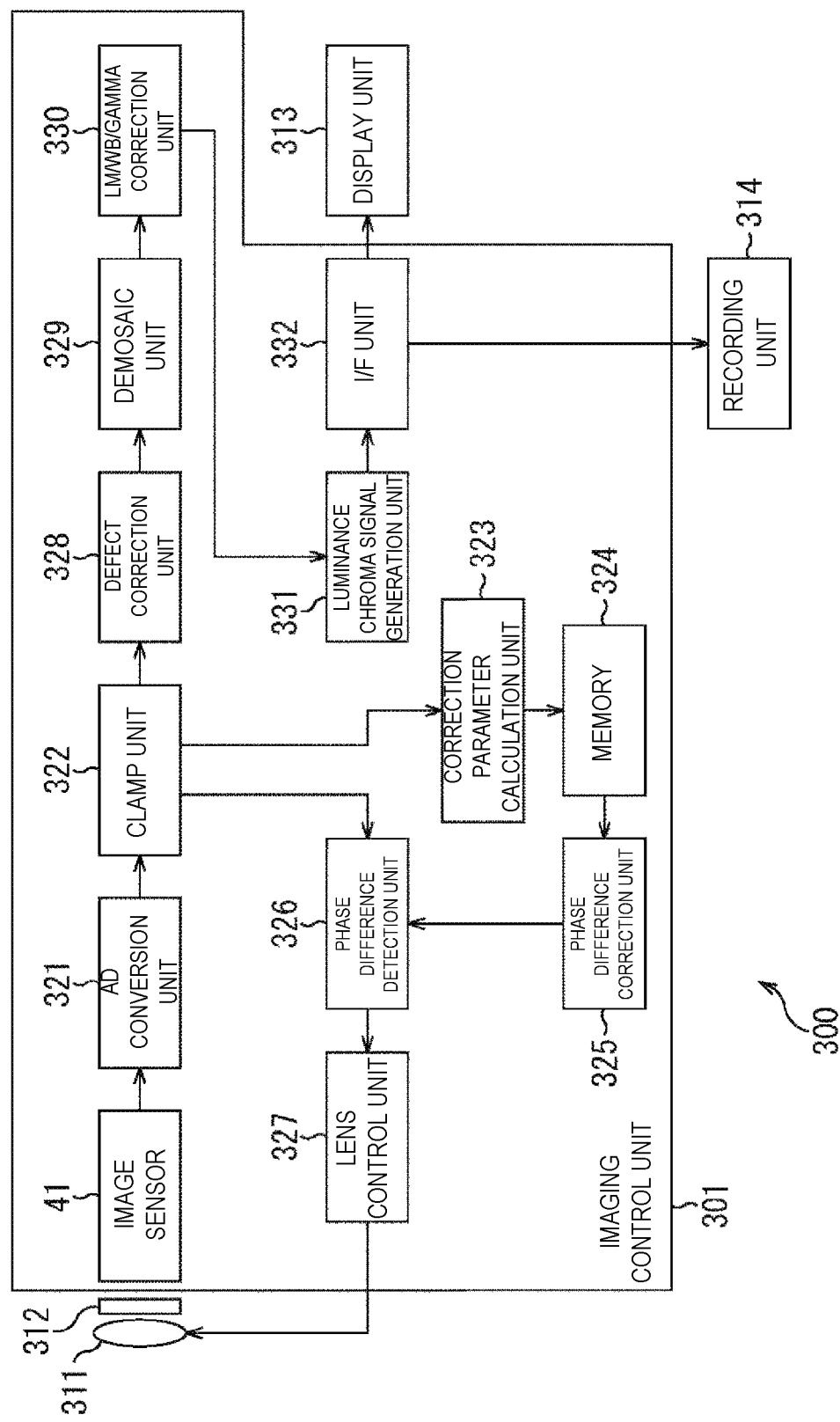
FIG. 11 is a block diagram illustrating a configuration example of an electronic apparatus to which the present technology is applied.

FIG. 11 is a diagram illustrating a configuration example of an electronic apparatus to which the present technology is applied. The electronic apparatus 300 shown in FIG. 11 is a device that performs AF (phase difference AF) of a phase difference detection method to image the subject and output the image of the subject as an electric signal. The electronic apparatus 300 includes, for example, a portable terminal such as a compact digital camera, a digital single lens reflex camera, a video camera, a smartphone (a multifunctional mobile phone) provided with an imaging function, an endoscope, and the like.

The electronic apparatus 300 shown in FIG. 11 includes a lens 311, an optical filter 312, an imaging control unit 301, a display unit 313, and a recording unit 314. The imaging control unit 301 includes an image sensor 41, an AD conversion unit 321, a clamp unit 322, a correction parameter calculation unit 323, a memory 324, a phase difference correction unit 325, a phase difference detection unit 326, a lens control unit 327, a defect correction unit 328, and a demosaic unit 329. In addition, the imaging control unit 301 has a linear matrix (LM)/white balance (WB)/gamma correction unit 330, a luminance chroma signal generation unit 331, and an interface (I/F) unit 332. In this example, the display unit 313 and the recording unit 314 are provided outside the imaging control unit 301, but the display unit 313 and the recording unit 314 are also able to be provided inside the imaging control unit 301.

The lens 311 adjusts a focal distance of subject light incident on the image sensor 41. A diaphragm (not shown) for adjusting an amount of light of the subject light incident on the image sensor 41 is provided at a rear stage of the lens 311. A specific configuration of the lens 311 is arbitrary, and for example, the lens 311 may include a plurality of lenses.

For example, the subject light having passed through the lens 311 is incident on the image sensor 41 through an optical filter 312 including an IR cut filter or the like that cuts infrared light and transmits light other than the infrared light.

The image sensor 41 includes the plurality of pixels 111 (the imaging pixel 114 and the phase difference detection pixel 131) having a photoelectric conversion element such as a photodiode that performs photoelectric conversion on the subject light. Each pixel 111 converts the subject light into an electric signal and supplies the electric signal to the AD conversion unit 321.

Note that the image sensor 41 forms a solid-state imaging device of the present technology together with a signal processing circuit that realizes the AD conversion unit 321, the clamp unit 322, the phase difference correction unit 325, and the phase difference detection unit 326. The individual imaging device may include a one-chip module, or the image sensor 41 and the signal processing circuit may be configured as separate chips. In addition, the signal processing circuit may include the correction parameter calculation unit 323, the memory 324, or the lens control unit 327.

For example, the image sensor 41 of the present technology is a CCD image sensor that performs transmission using a circuit element referred to as a charge coupled device (CCD) in order to read the charge generated on the basis of the subject light by the photoelectric conversion element, or may be a CMOS image sensor having an amplifier for each unit cell using a complementary metal oxide semiconductor (CMOS), or the like.

The AD conversion unit 321 converts RGB electric signals (analog signals) supplied from the image sensor 41 into digital data (image data). The AD conversion unit 321 supplies the image data (RAW data) of the digital data to the clamp unit 322.

The clamp unit 322 subtracts a black level that is a level determined to be black from the image data. The clamp unit 322 supplies data output from a monitor pixel to the correction parameter calculation unit 323, among the image data (pixel values) obtained by subtracting the black level. The monitor pixel is the phase difference detection pixel 131 of a non-image output region.

Figure 12:
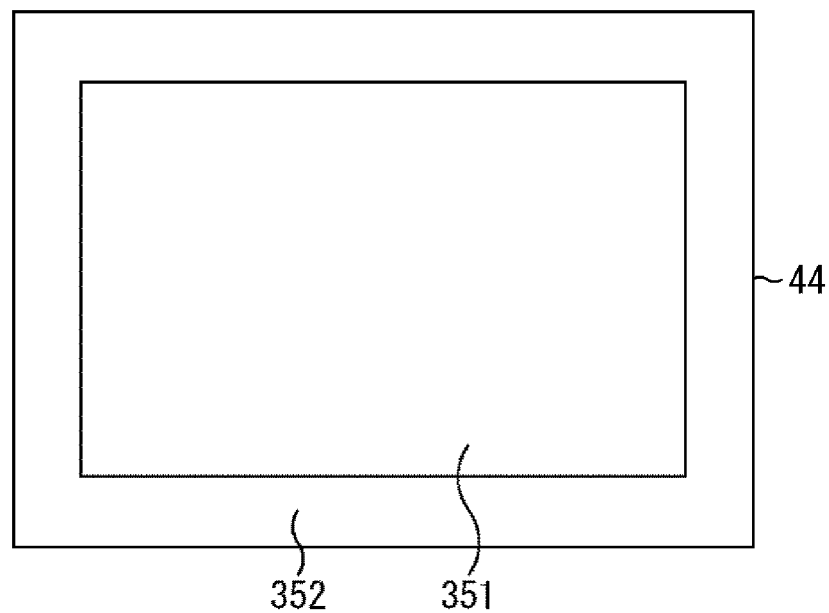
FIG. 12 is a diagram illustrating an image output region and a non-image output region to which the present technology is applied.

Here, an image output region and a non-image output region will be described with reference to FIG. 12. FIG. 12 is a diagram illustrating the image output region and the non-image output region to which the present technology is applied. As shown in FIG. 12, in the pixel array unit 44, an image output region 351 is provided substantially in a center thereof, and a non-image output region 352 is provided around the image output region 351. The output of the pixel 111 of the image output region 351 is used as the image data, but the output of the pixel 111 of the non-image output region 352 is not used as the image data. Among the phase difference detection pixels 131 disposed in the image output region 351 and the non-image output region 352, the phase difference detection pixel 131 of the non-image output region 352 is the monitor pixel.

In addition, the clamp unit 322 supplies the image data (the pixel value) output from the phase difference detection pixel 131 among the image data (the pixel values) obtained by subtracting the black level to the phase difference detection unit 326 and supplies all the pixels of the image data obtained by subtracting the black level to the defect correction unit 328.

That is, the output of the phase difference detection pixel 131 is used in the phase difference detection itself, but in generating the image, not only the output of the imaging pixel 114 but also the output of the phase difference detection pixel 131 are used. Here, as shown in FIGS. 5 to 7 or FIG. 9, in a case in which the phase difference detection pixel 131 is shielded from light by half of the photoelectric conversion unit by the light shielding portions 133 (133A to 133D), since the output of the phase difference detection pixel 131 is smaller than the output of the imaging pixel 114, defect correction is performed as described later.

The correction parameter calculation unit 323 calculates a correction parameter using data of the phase difference characteristic data obtained in a test process after manufacturing the image sensor 41, a test process after attaching the lens 311 to the image sensor 41, or the like. The correction parameter is used in correcting the phase difference detected by the phase difference detection unit 326.

The correction parameter calculated by the correction parameter calculation unit 323 is stored in the memory 324.

The phase difference detection unit 326 performs phase difference detection processing on the basis of the image data (the pixel value) from the clamp unit 322 to determine whether or not an object to be focused (a focused object) is in focus or not. In a case where the object in a focus area is in focus, the phase difference detection unit 326 supplies information indicating that the object is in focus to the lens control unit 327 as a focus determination result. In addition, in a case in which the focus object is not in focus, the phase difference detection unit 326 calculates the amount of the deviation of the focus (the defocus amount) and supplies information indicating the calculated defocus amount to the lens control unit 327 as the focus determination result.

The phase difference correction unit 325 corrects the phase difference detected by the phase difference detection unit 326 using the correction parameter stored in the memory 324. The phase difference detection unit 326 supplies the focus determination result corresponding to the corrected phase difference to the lens control unit 327.

The lens control unit 327 controls driving of the lens 311. Specifically, the lens control unit 327 calculates a drive amount of the lens 311 on the basis of the focus determination result supplied from the phase difference detection unit 326 and moves the lens 311 according to the calculated drive amount.

For example, in a case in which the focus object is in focus, the lens control unit 327 maintains a current position of the lens 311. In addition, in a case in which the focus object is not in focus, the lens control unit 327 calculates the drive amount on the basis of the focus determination result indicating the defocus amount and a position of the lens 311, and moves the lens 311 according to the drive amount.

The defect correction unit 328 performs correction of the pixel value of a defective pixel (for example, the phase difference detection pixels 131) of which a correct pixel value is not able to be obtained, that is, performs defect correction on the basis of the image data from the clamp unit 322. The defect correction unit 328 supplies the image data corrected for the defective pixel to the demosaic unit 329.

The demosaic unit 329 performs demosaic processing on the RAW data from the defect correction unit 328, performs supplementation of color information, and converts the RAW data into RGB data. The demosaic unit 329 supplies the image data (the RGB data) after the demosaic processing to the LM/WB/gamma correction unit 330.

The LM/WB/gamma correction unit 330 corrects the color characteristics of the RGB data from the demosaic unit 329. Specifically, in order to fill in a difference between a chromaticity point of a primary color (RGB) specified by the standard and an actual chromaticity point of the camera, the LM/WB/gamma correction unit 330 corrects each color signal of the image data by using a matrix coefficient and performs processing of changing color reproducibility. In addition, the LM/WB/gamma correction unit 330 adjusts a white balance by setting a gain for white with respect to a value of each channel of the RGB data. In addition, the LM/WB/gamma correction unit 330 adjusts a relative relationship between a color of the image data and an output device characteristic and performs gamma correction for obtaining a display closer to an original. The LM/WB/gamma correction unit 330 supplies the image data (RGB data) after the correction to the luminance chroma signal generation unit 331.

The luminance chroma signal generation unit 331 generates a luminance signal (Y) and color difference signal (Cr and Cb) from the RGB data supplied from the LM/WB/gamma correction unit 330. Upon generating the luminance chroma signals (Y, Cr, and Cb), the luminance chroma signal generation unit 331 supplies the luminance signal and the color difference signal to the I/F unit 332.

The I/F unit 332 supplies the supplied image data (the luminance chroma signals) to the recording unit 314 such as a recording device for recording the image data, causes the recording unit 314 to record the image data, or outputs the supplied image data to the display unit 313 such as a display device that displays an image of the image data, and causes the display unit 313 to display the image data.

(5) Phase Difference Autofocus Processing

Figure 13:
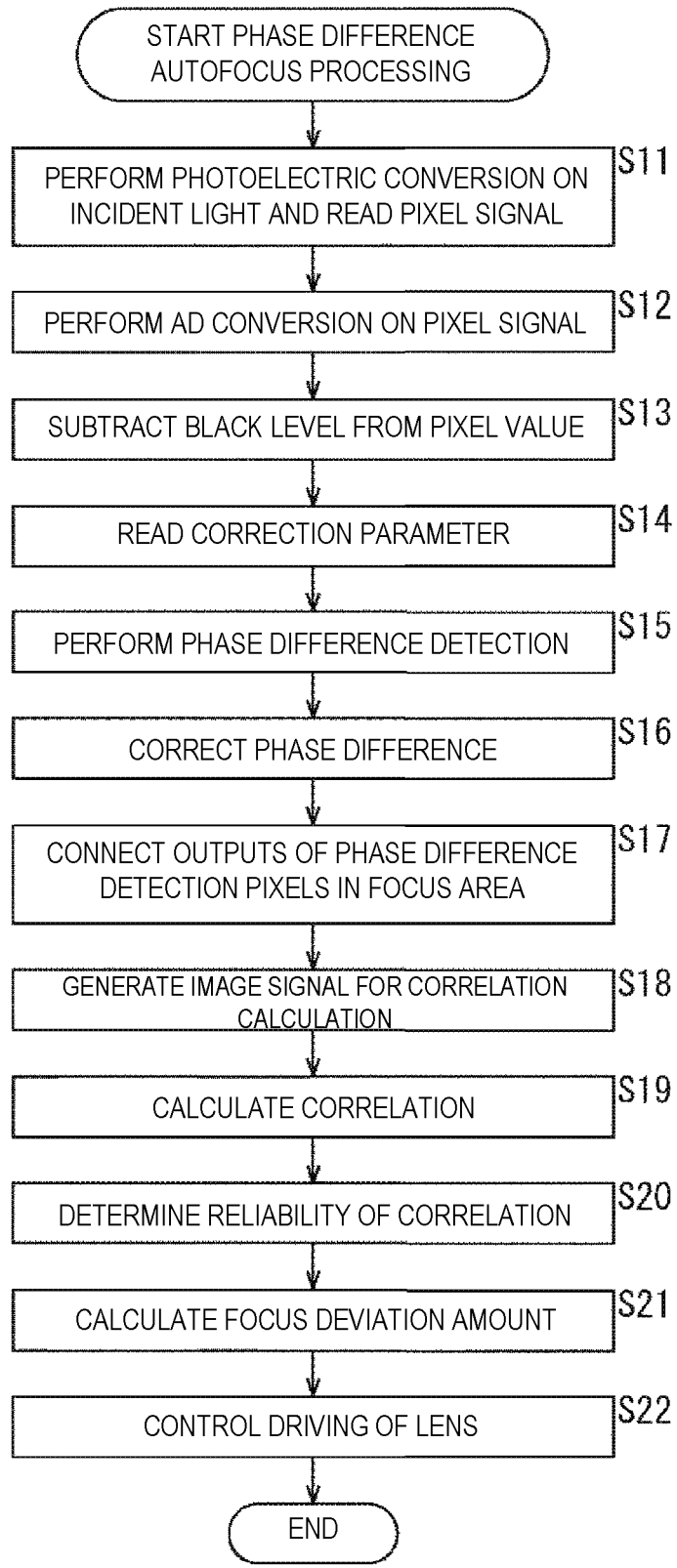
FIG. 13 is a flowchart for explaining phase difference autofocus processing of the electronic apparatus to which the present technology is applied.

FIG. 13 is a flowchart for explaining the phase difference autofocus processing of the electronic apparatus to which the present technology is applied. Hereinafter, the phase difference autofocus processing by the electronic apparatus 300 will be described with reference to FIG. 13. The phase difference autofocus processing is executed by the electronic apparatus 300 before or during the imaging processing when imaging the subject.

First, in step S11, the image sensor 41 performs the photoelectric conversion on the incident light of each pixel 111, reads each pixel signal thereof, and supplies each pixel signal to the AD conversion unit 321. Note that the phase difference detection pixel 131 is able to be read at a timing different from that of the imaging pixel 114.

In step S12, the AD conversion unit 321 performs the AD conversion on each pixel signal from the image sensor 41 and supplies each pixel signal on which the AD conversion is performed to the clamp unit 322.

In step S13, the clamp unit 322 subtracts the black level detected in an optical black (OPB) region provided outside an effective pixel region from each pixel signal (the pixel value) from the AD conversion unit 321. The clamp unit 322 supplies the image data (the pixel value) output from the phase difference detection pixel 131 to the phase difference detection unit 326 among the image data obtained by subtracting the black level.

In step S14, the phase difference correction unit 325 reads the correction parameter that is calculated in advance and stored in the memory 324.

In step S15, the phase difference detection unit 326 performs the phase difference detection on the basis of the image data (the pixel value) from the clamp unit 322. That is, the outputs of the phase difference detection pixels 131 for detecting the phase differences of the vertical direction (the vertical direction) and the horizontal direction (the horizontal direction) are read, respectively.

In step S16, the phase difference correction unit 325 corrects the phase difference detected by the phase difference detection unit 326 using the correction parameter read in the processing of step S14. That is, the correction parameter is supplied to the phase difference detection unit 326, and the detected phase difference is corrected.

In step S17, the phase difference detection unit 326 connects with each other the outputs of the phase difference detection pixels 131 in the focus area. That is, the outputs of the phase difference detection pixels 131 in the focus area are connected with each other according to the pixel position, and the AF pixel signal is generated. In step S18, the phase difference detection unit 326 implements shading correction (correction of falling off of an amount of light of a peripheral screen), restoration correction of distortion of two images by vignetting, or the like on the AF pixel signal generated in step S17, and generates a pair of image signals for correlation calculation.

Figure 14A:
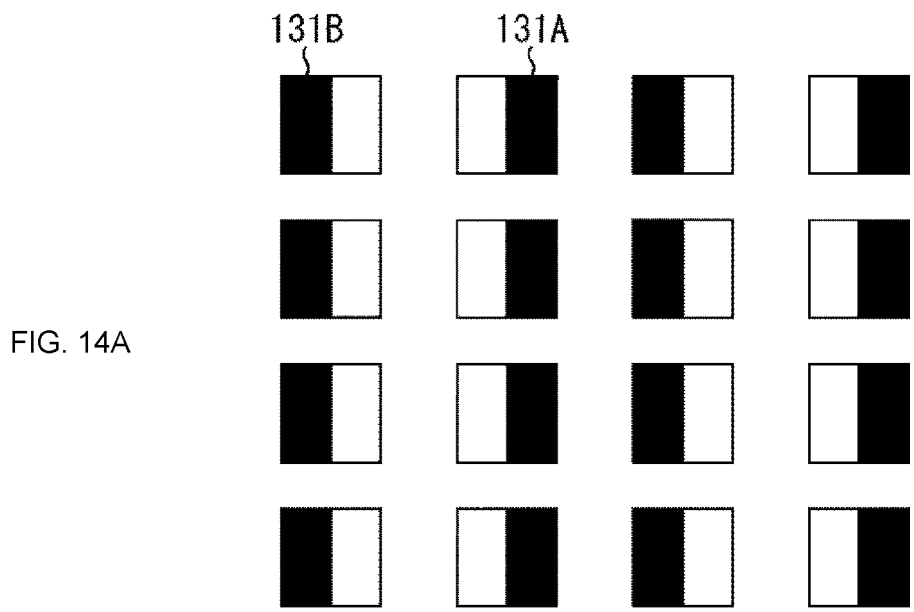
FIGS. 14A and 14B are diagrams illustrating a configuration of the phase difference detection pixel of an embodiment of the image sensor to which the present technology is applied.
Figure 14B:
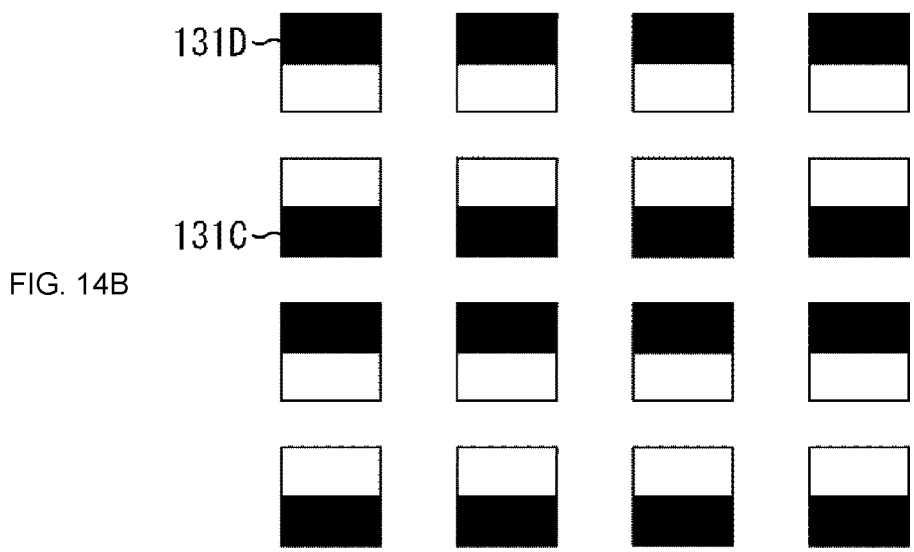

FIGS. 14A and 14B are diagrams illustrating a configuration of the phase difference detection pixel of an embodiment of the image sensor to which the present technology is applied. As shown in FIG. 14A, the image sensor 41 of the present embodiment has the phase difference detection pixel 131A for detecting the phase difference of the horizontal direction and the phase difference detection pixel 131B for detecting the phase difference of the horizontal direction that is paired with the phase difference detection pixel 131A. In addition, as shown in FIG. 14B, the image sensor 41 has the phase difference detection pixel 131C for detecting the phase difference of the vertical direction and the phase difference detection pixel 131D for detecting the phase difference of the vertical direction that is paired with the phase difference detection pixel 131C. In addition, as shown in FIG. 5, the phase difference detection pixels 131A and 131B and the phase difference detection pixels 131C and 131D are disposed dispersedly all over at an equal density.

The signals of the phase difference detection pixels 131 are grouped. As shown in FIG. 5, the phase difference detection pixels 131A and 131B for detecting the phase difference of the horizontal direction are grouped along a straight line of a direction indicated by an arrow A1 in the figure (that is, in the horizontal direction), for example, for each first row, fifth row, ninth row, and thirteenth row. Similarly, the phase difference detection pixels 131C and 131D for detecting the phase difference of the vertical direction are grouped along a straight line of a direction indicated by an arrow A2 in the figure (that is, in the vertical direction), for example, for each first column, fifth column, ninth column, and thirteenth column.

Specifically, a phase difference detection image signal SIGh(A) obtained by connecting the pixel signals that are obtained by the phase difference detection pixels 131A included in the focus area Rh for detecting the phase difference of the horizontal direction in the horizontal direction is generated. In addition, similarly, a phase difference detection image signal SIGh(B) obtained by connecting the pixel signals that are obtained by the phase difference detection pixels 131B included in the focus area Rh in the horizontal direction is generated.

In addition, a phase difference detection image signal SIGv(C) obtained by connecting the pixel signals that are obtained by the phase difference detection pixels 131C included in the focus area Rv for detecting the phase difference of the vertical direction in the vertical direction is generated. In addition, similarly, a phase difference detection image signal SIGv(D) obtained by connecting the pixel signals that are obtained by the phase difference detection pixels 131D included in the focus area Rv in the vertical direction is generated.

In step S19, the phase difference detection unit 326 calculates a correlation of a pair of image signals for the phase difference detection. That is, the correlation of the phase difference between the image signal SIGh(A) and the image signal SIGh(B) are calculated. In addition, the correlation of the phase difference between the image signal SIGv(C) and the image signal SIGv(D) is calculated.

In step S20, the phase difference detection unit 326 determines reliability of the correlation. That is, the reliability of a calculation result of the correlation calculated in step S19 is determined. Here, the reliability refers to a coincidence degree (a waveform similarity) between the pair of image signals, and in a case in which the coincidence degree is good, generally the reliability of the focus detection result is high.

For example, the focus deviation amount (the defocus amount) in the horizontal direction is able to be obtained by calculating the phase difference between the image signal SIGh(A) and the image signal SIGh(B) in the focus area Rh by known correlation calculation. Similarly, the focus deviation amount (the defocus amount) in the vertical direction is able to be obtained by calculating the phase difference between the image signal SIGv(C) and the image signal SIGv(D) in the focus area Rv by the correlation calculation.

In step S21, the phase difference detection unit 326 calculates the focus deviation amount. That is, a final focus deviation amount is calculated on the basis of the phase difference obtained from the pair of image signals determined of which the reliability is high in step S20.

In step S22, the lens control unit 327 controls the driving of the lens 311 on the basis of the focus determination result from the phase difference detection unit 326.

The focus control is performed as described above. This processing is repeatedly executed as occasion demands.

Note that the lens control unit 327 may control the driving of the lens 311 by performing contrast autofocus in addition to the phase difference autofocus as described above. For example, in a case in which the information indicating the focus deviation amount (the defocus amount) is supplied as the focus determination result from the phase difference detection unit 326, the lens control unit 327 may determine a direction of the focus deviation (a front pin or a rear pin) and perform contrast AF in the direction.

(6) Imaging Processing

Figure 15:
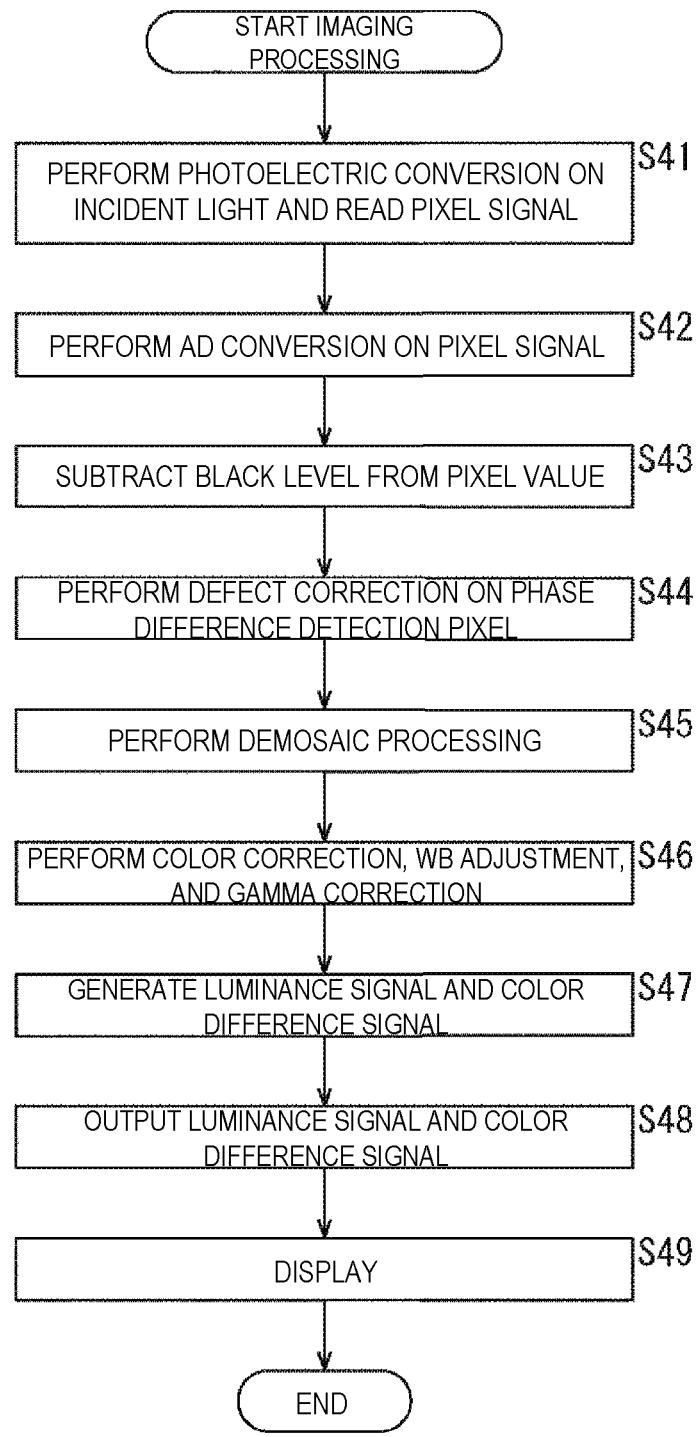
FIG. 15 is a flowchart for explaining imaging processing of the electronic apparatus to which the present technology is applied.

Next, the imaging processing by the electronic apparatus 300 will be described with reference to the flowchart of FIG. 15. FIG. 15 is a flowchart for explaining the imaging processing of the electronic apparatus to which the present technology is applied.

First, in step S41, the image sensor 41 performs the photoelectric conversion on the incident light of each pixel 111, reads each pixel signal thereof, and supplies each pixel signal to the AD conversion unit 321.

In step S42, the AD conversion unit 321 performs the AD conversion on each pixel signal from the image sensor 41 and supplies each pixel signal on which the AD conversion is performed to the clamp unit 322.

In step S43, the clamp unit 322 subtracts the black level detected in the optical black (OPB) region provided outside the effective pixel region from each pixel signal (the pixel value) from the AD conversion unit 321. The clamp unit 322 supplies the image data (the pixel value) of all the pixels of which the black level is subtracted to the defect correction unit 328.

The processing of steps S41 to S43 described above is basically the same as the processing of steps S11l to S13 of the flowchart of FIG. 13.

In step S44, the defect correction unit 328 performs the correction (the defect correction) on the pixel value of the defective pixel, for example, the phase difference detection pixel 131, of which a correct pixel value is not able to be obtained, on the basis of the image data from the clamp unit 322. In the present technology, since the imaging pixel 114 is present in the sub block 103 where the phase difference detection pixel 131 is present (that is, in the vicinity thereof), this correction processing becomes easy. The image data on which the defective pixel is corrected is supplied to the demosaic unit 329.

In step S45, the demosaic unit 329 performs the demosaic processing, converts the RAW data into the RGB data, and supplies the RGB data to the LM/WB/gamma correction unit 330.

In step S46, the LM/WB/gamma correction unit 330 performs the color correction, the white balance adjustment, and the gamma correction on the RGB data from the demosaic unit 329, and supplies the RGB data on which the color correction, the white balance adjustment, and the gamma correction are performed to the luminance chroma signal generation unit 331.

In step S47, the luminance chroma signal generation unit 331 generates the luminance signal and the color difference signal (that is, YCrCb data) from the RGB data.

In addition, in step S48, the I/F unit 332 outputs the luminance signal and the color difference signal generated by the luminance chroma signal generation unit 331 to the recording unit 314 or the display unit 313.

In step S49, the display unit 313 displays the image of the subject on the basis of the signal supplied from the I/F unit 332. In addition, the recording unit 314 records the signal supplied from the I/F unit 332 on the basis of an instruction from a user.

As described above, as shown in FIG. 5, even in a case in which the phase difference detection pixel 131 is disposed at a predetermined position of the predetermined sub block 103 in the block 102, as shown in FIG. 3, It is possible to image and express the color Cij of each region RNij with high definition.

According to the above processing, it is possible to improve the accuracy of the AF and to suppress deterioration of image quality.

2. Second Configuration Example (Phase Difference Detection Pixels of Horizontal Direction and Vertical Direction are Disposed in 1/4 Pixel, B Pixel, and R Pixel)

Next, another configuration example of the imaging region 101 of the image sensor 41 will be described. FIG. 16 is a diagram illustrating a planar configuration example of an embodiment of the image sensor to which the present technology is applied. In the second configuration example shown in FIG. 16, in any of the B sub block 103 and the R sub block 103, the pixel 111 of the upper left is set as the phase difference detection pixel 131 among the 2×2 pixels 111.

Specifically, in the B sub block 103, the phase difference detection pixel 131 for detecting the phase difference of the vertical direction is disposed in the pixel 111 of the upper left. In addition, in the pixels 111 of the first row and the ninth row, the phase difference detection pixel 131C configuring one of the pair of phase difference detection pixels 131C and 131D for detecting the phase difference of the vertical direction is disposed. In the pixels 111 of the fifth row and the thirteenth row, the phase difference detection pixels 131D configuring the other of the pair for detecting the phase difference of the vertical direction is disposed.

As shown in FIG. 16, in the R sub block 103, the phase difference detection pixel 131 for detecting the phase difference of a horizontal direction is disposed in the pixel 111 of the upper left among the 2×2 pixels 111. In the pixels 111 of the first column and the ninth column, a phase difference detection pixel 131A configuring one of a pair of phase difference detection pixels 131A and 131B for detecting the phase difference of the horizontal direction is disposed. In the pixels 111 of the fifth column and the thirteenth column, the phase difference detection pixel 131B configuring the other of the pair for detecting the phase difference of the horizontal direction is disposed. In a case in which the phase difference detection pixels 131 are disposed, the number of the phase difference detection pixels 131 is one in the one sub block 103 and two in the one block 102.

In addition, in the second configuration example of FIG. 16, the detection of the phase difference of the horizontal direction is possible only with an output of the phase difference detection pixel 131 of the R pixel 111 and the detection of the phase difference of the vertical direction is possible only with an output of the phase difference detection pixel 131 of the B pixel 111. Therefore, signal processing becomes easy. The detection of the phase difference of the horizontal direction is possible by reading the phase difference detection pixel 131 of at least one row, but the detection of the phase difference of the vertical direction is possible by reading the phase difference detection pixel 131 of at least two rows. One of the phase difference detection pixels 131 of the R pixel 111 and the B pixel 111 may be omitted and only one of the phase difference of the horizontal direction and the phase difference of the vertical direction may be detected.

3. Third Configuration Example (Phase Difference Detection Pixels of Horizontal Direction and Vertical Direction are Disposed in 1/4 Pixel, B Pixel, and R Pixel in Mixed Manner)

Next, the third configuration example of the imaging region 101 of the image sensor 41 will be described with reference to FIG. 17.

Figure 17:
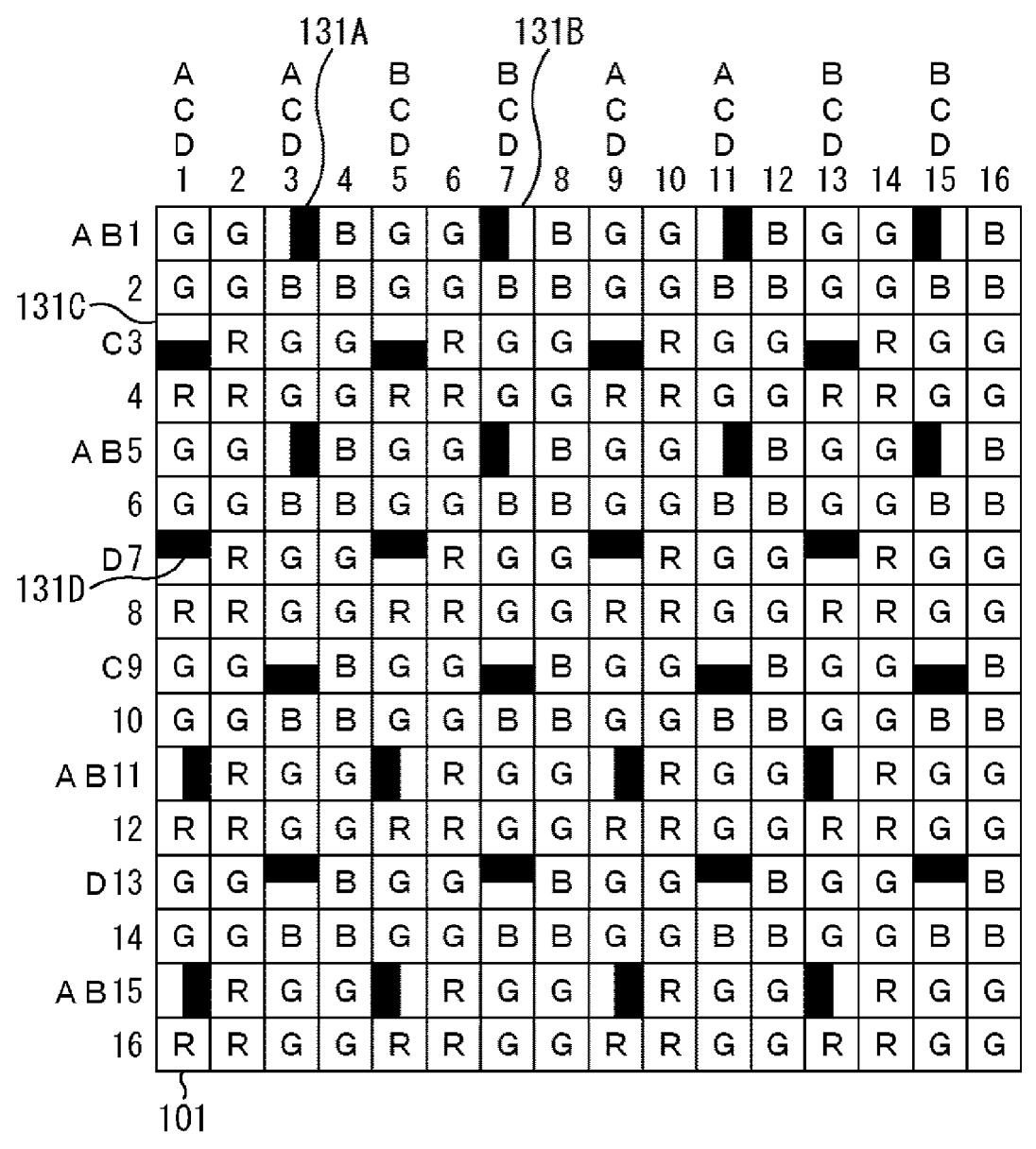

FIG. 17 is a diagram illustrating a planar configuration example of an embodiment of the image sensor to which the present technology is applied. In the third configuration example shown in FIG. 17, in any of the B sub block 103 and the R sub block 103, the pixel 111 of the upper left is set as the phase difference detection pixel 131 among the 2×2 pixels 111.

In the B sub block 103, the phase difference detection pixel 131 for detecting the phase difference of the horizontal direction or the vertical direction is disposed in the pixel 111 of the upper left. Specifically, in the third column and the eleventh column of the first row and the fifth row, one phase difference detection pixel 131A of the pair for detecting the phase difference of the horizontal direction is disposed, and in the seventh column and the fifteenth column, the other phase difference detection pixel 131B of the pair for detecting the phase difference of the horizontal direction is disposed.

In the ninth row, one phase difference detection pixel 131C of the pair for detecting the phase difference of the vertical direction is disposed, and in the thirteenth row, the other phase difference detection pixel 131D of the pair for detecting the phase difference of the vertical direction is disposed.

Next, in the R sub block 103, the phase difference detection pixel 131 for detecting the phase difference of the horizontal direction or the vertical direction is disposed in the pixel 111 of the upper left. Specifically, in the pixel 111 of the third row, one phase difference detection pixel 131C of the pair for detecting the phase difference of the vertical direction is disposed, and in the pixel 111 of the seventh row, the other phase difference detection pixel 131D of the pair for detecting the phase difference of the vertical direction is disposed.

In the eleventh row and the fifteenth row, the pair of phase difference detection pixels 131A and 131B for detecting the phase difference of the horizontal direction are disposed. In the first column and the ninth column of the eleventh row and the fifteenth row, one phase difference detection pixel 131A of the pair of phase difference detection pixels 131A and 131B for detecting the phase difference of the horizontal direction is disposed, and in the fifth column and the thirteenth column, the other phase difference detection pixel 131B for detecting the phase difference of the horizontal direction of the pair is disposed. In a case in which the phase difference detection pixels 131 are disposed, the number of the phase difference detection pixels 131 is one in the one sub block 103 and two in the one block 102.

In the third configuration example, in both of the B sub block 103 and the R sub block 103, the phase difference detection pixels 131A and 131B for detecting the phase difference of the horizontal direction and the phase difference detection pixels 131C and 131D for detecting the phase difference of the vertical direction are mixed in the row unit. The phase difference detection pixels 131A and 131B for detecting the phase difference of the horizontal direction and the phase difference detection pixels 131C and 131D for detecting the phase difference of the vertical direction are mixed also in the column unit. There are a row in which the phase difference detection pixels 131A and 131B for detecting the phase difference of the horizontal direction are disposed and a row in which the phase difference detection pixel 131C or the phase difference detection pixel 131D for detecting the phase difference of the vertical direction is disposed in the row unit.

In addition, in this configuration example, in a case in which the entire B sub block 103 is viewed, both of the phase difference detection pixels 131A and 131B of the horizontal direction and the phase difference detection pixels 131C and 131D of the vertical direction are disposed. Similarly, in a case in which the entire R sub block 103 is viewed, both of the phase difference detection pixels 131A and 131B of the horizontal direction and the phase difference detection pixels 131C and 131D of the vertical direction are disposed. Therefore, the phase difference detection is possible even though the phase difference detection pixel 131 is provided only in one of the B sub block 103 and the R sub block 103.

In addition, in the third configuration example of FIG. 17, focusing on the rows in both of the B pixel 111 and the R pixel 111, switching is regularly performed in the phase difference detection of the horizontal direction and the vertical direction for every two blocks 102. Therefore, the processing is able to be regularly repeated.

4. Fourth Configuration Example (Upper Left Diagonal and Upper Right Phase Difference Detection Pixels are Disposed in 1/4 Pixel, B Pixel, and R Pixel)

Next, the fourth configuration example of the imaging region 101 of the image sensor 41 will be described with reference to FIG. 18.

Figure 18:
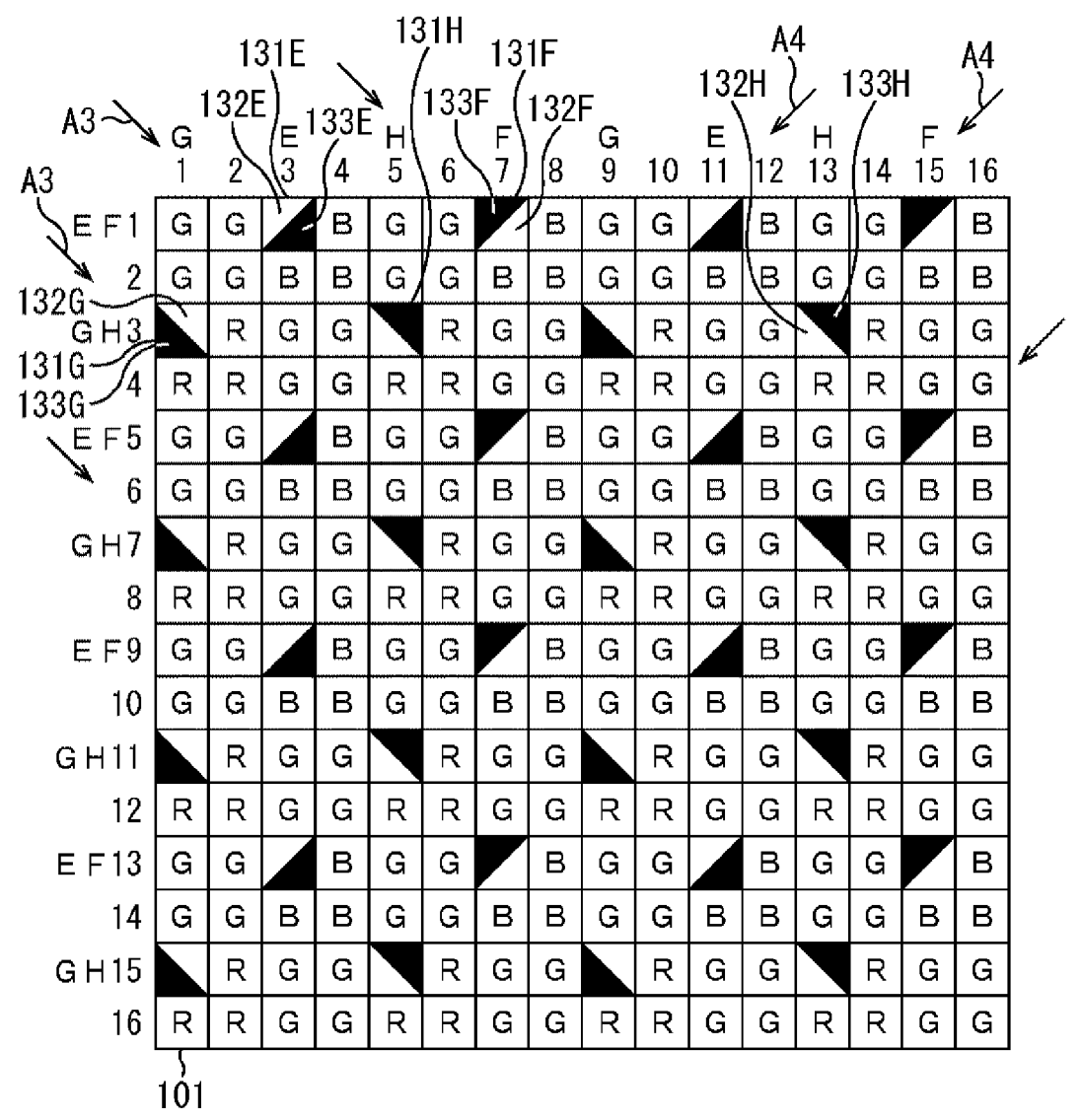

FIG. 18 is a diagram illustrating a planar configuration example of an embodiment of the image sensor to which the present technology is applied. In the fourth configuration example of FIG. 18, the pixels 111 are divided along a diagonal line of 45 degrees of an upper right (a lower the left) or a diagonal line of 45 degrees of an upper left (a lower right), and the phase difference detection pixels 131 are set. That is, in the phase difference detection pixel 131, the light shielding portion 133 is formed in one of a 1/2 triangular regions and the light transmitting portion 132 is formed in the remaining 1/2 triangular region. In FIG. 18, the light shielding portion 133 is shown by a black triangle, and the light transmitting portion 132 is shown by a white triangle.

A phase difference detection pixel 131E of which an upper left triangle is a light transmitting portion 132E and a lower right triangle is a light shielding portion 133E and a phase difference detection pixel 131F of which an upper left triangle is a light shielding portion 133F and a lower right triangle is a light transmitting portion 132F are paired. The phase difference detection pixels 131E and 131F detect a phase difference (an upper left diagonal phase difference) of a direction shown by an upper left (lower right) diagonal arrow A3 (a direction of a straight line at an angle of 45 degrees of the upper left) in FIG. 18.

A phase difference detection pixel 131G of which an upper right triangle is a light transmitting portion 132G and a lower left triangle is a light shielding portion 133G and a phase difference detection pixel 131H of which an upper right triangle is a light shielding portion 133H and a lower left triangle is a light transmitting portion 132H are paired. The phase difference detection pixels 131G and 131H detect a phase difference (an upper right diagonal phase difference) of a direction shown by an upper right (lower left) diagonal arrow A4 (a direction of a straight line at an angle of 45 degrees of the upper right) in FIG. 18.

In the example of FIG. 18, in both of the B sub block 103 and the R sub block 103, the pixel 111 of the upper left is set as the phase difference detection pixel 131 among the 2×2 pixels 111.

Specifically, in the B sub block 103, the phase difference detection pixel 131 for detecting an upper left diagonal phase difference is disposed in the pixel 111 of the upper left. A phase difference detection pixel 131E configuring one of a pair of phase difference detection pixels 131E and 131F for detecting the upper left diagonal phase difference is disposed in the pixels 111 of the third column and the eleventh column among the upper left pixels 111. The phase difference detection pixels 131F configuring the other of the pair for detecting the upper left diagonal phase difference is disposed in the pixels 111 of the seventh column and the fifteenth column.

Next, in the R sub block 103, the phase difference detection pixel 131 for detecting the upper right diagonal phase difference is disposed in the pixel 111 of the upper left of 2×2 pixels 111. That is, a phase difference detection pixel 131G of one of the pair for detecting the upper right diagonal phase difference is disposed in the pixels 111 of the first column and the ninth column. A phase difference detection pixel 131H configuring the other of the pair for detecting the upper right diagonal phase difference is disposed in the pixels 111 of the fifth column and the thirteenth column. In a case in which the phase difference detection pixels 131 are disposed, the number of the phase difference detection pixels 131 is one in the one sub block 103 and two in the one block 102.

In the fourth configuration example of FIG. 18, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, the detection of the upper left diagonal phase difference is possible only with the output of the phase difference detection pixel 131 of the B pixel 111, and the detection of the upper right diagonal phase difference is possible only with the output of the phase difference detection pixel 131 of the R pixel 111. Therefore, signal processing becomes easy. The detection of the upper left diagonal phase difference and the detection of the upper right diagonal phase difference are possible by reading the phase difference detection pixels 131 of at least one row, respectively. It is also possible to omit the phase difference detection pixel 131 of the R pixel 111 or the B pixel 111 and detect only one of the upper left diagonal phase difference and the upper right diagonal phase difference.

5. Fifth Configuration Example (Upper Right Diagonal and Upper Left Diagonal Phase Difference Detection Pixels are Disposed in 1/4 Pixel, B Pixel, and R Pixel)

Next, the fifth configuration example of the imaging region 101 of the image sensor 41 will be described with reference to FIG. 19.

Figure 19:
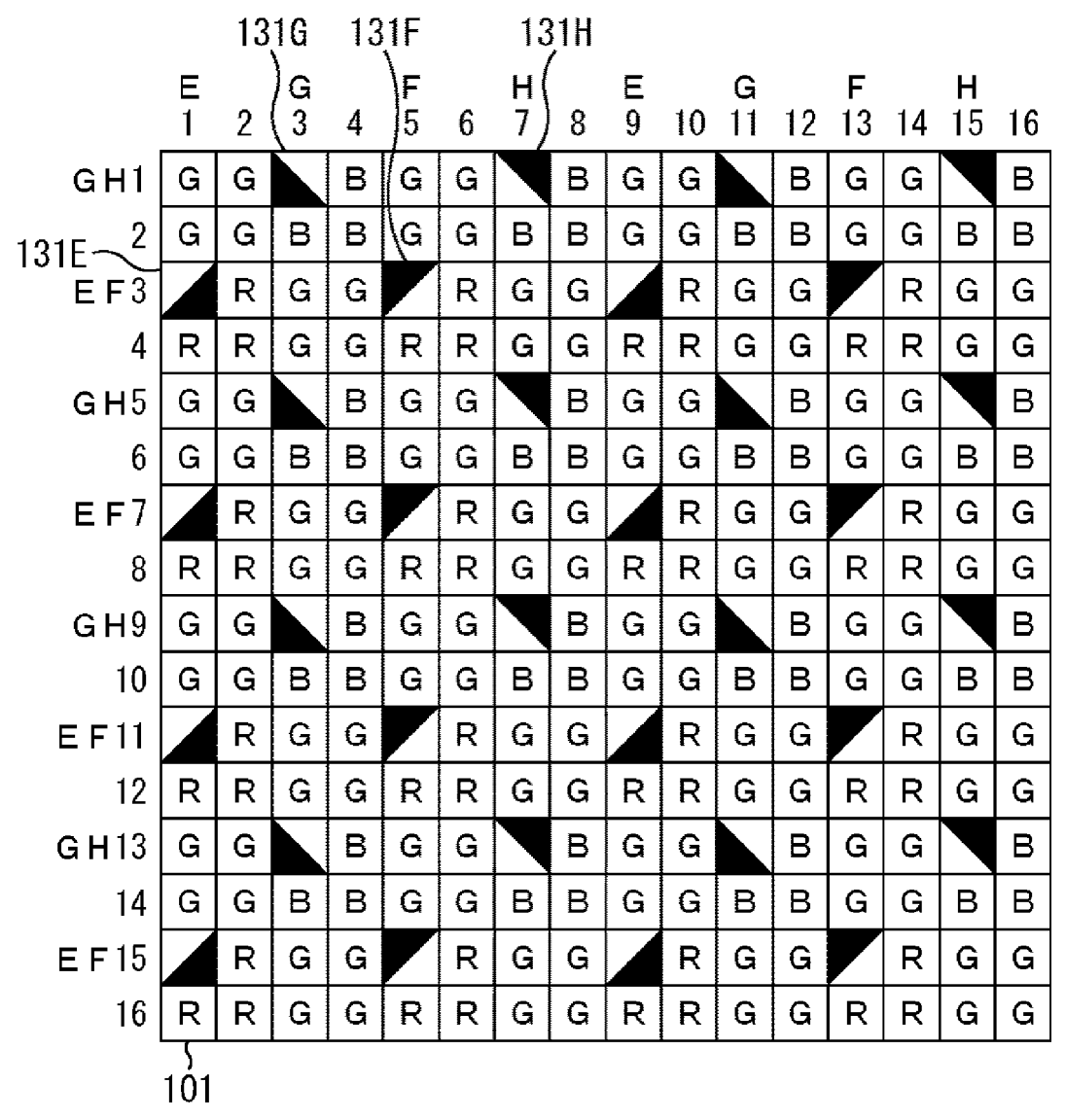

FIG. 19 is a diagram illustrating a planar configuration example of an embodiment of the image sensor to which the present technology is applied. In the fifth configuration example shown in FIG. 19, in any of the B sub block 103 and the R sub block 103, the pixel 111 of the upper left is set as the phase difference detection pixel 131 among the 2×2 pixels 111.

Specifically, in the B sub block 103, the phase difference detection pixel 131 for detecting an upper right diagonal phase difference is disposed in the pixel 111 of the upper left. That is, a phase difference detection pixel 131G configuring one of a pair of phase difference detection pixels 131G and 131H for detecting the upper right diagonal phase difference is disposed in the pixels 111 of the third column and the eleventh column. The phase difference detection pixels 131H configuring the other of the pair for detecting the upper right diagonal phase difference is disposed in the pixels 111 of the seventh column and the fifteenth column.

Next, in the R sub block 103, the phase difference detection pixel 131 for detecting the upper left diagonal phase difference is disposed in the pixel 111 of the upper left of 2×2 pixels 111. That is, a phase difference detection pixel 131E of one of the pair for detecting the upper left diagonal phase difference is disposed in the pixels 111 of the first column and the ninth column. A phase difference detection pixel 131F configuring the other of the pair for detecting the upper left diagonal phase difference is disposed in the pixels 111 of the fifth column and the thirteenth column. In a case in which the phase difference detection pixels 131 are disposed, the number of the phase difference detection pixels 131 is one in the one sub block 103 and two in the one block 102.

In the fifth configuration example of FIG. 19, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, the detection of the upper left diagonal phase difference is possible only with the output of the phase difference detection pixel 131 of the R pixel 111, and the detection of the upper right diagonal phase difference is possible only with the output of the phase difference detection pixel 131 of the B pixel 111. Therefore, signal processing becomes easy. The detection of the upper left diagonal phase difference and the detection of the upper right diagonal phase difference are possible by reading the phase difference detection pixels 131 of at least one row, respectively. It is also possible to omit the phase difference detection pixel 131 of the R pixel 111 or the B pixel 111 and detect only one of the upper left diagonal phase difference and the upper right diagonal phase difference.

6. Sixth Configuration Example (Upper Left Diagonal and Upper Right Diagonal Phase Difference Detection Pixels are Disposed in 1/4 Pixel, B Pixel, and R Pixel in Mixed Manner)

Hereinafter, the sixth configuration example of the imaging region 101 of the image sensor 41 will be described with reference to FIG. 20.

Figure 20:
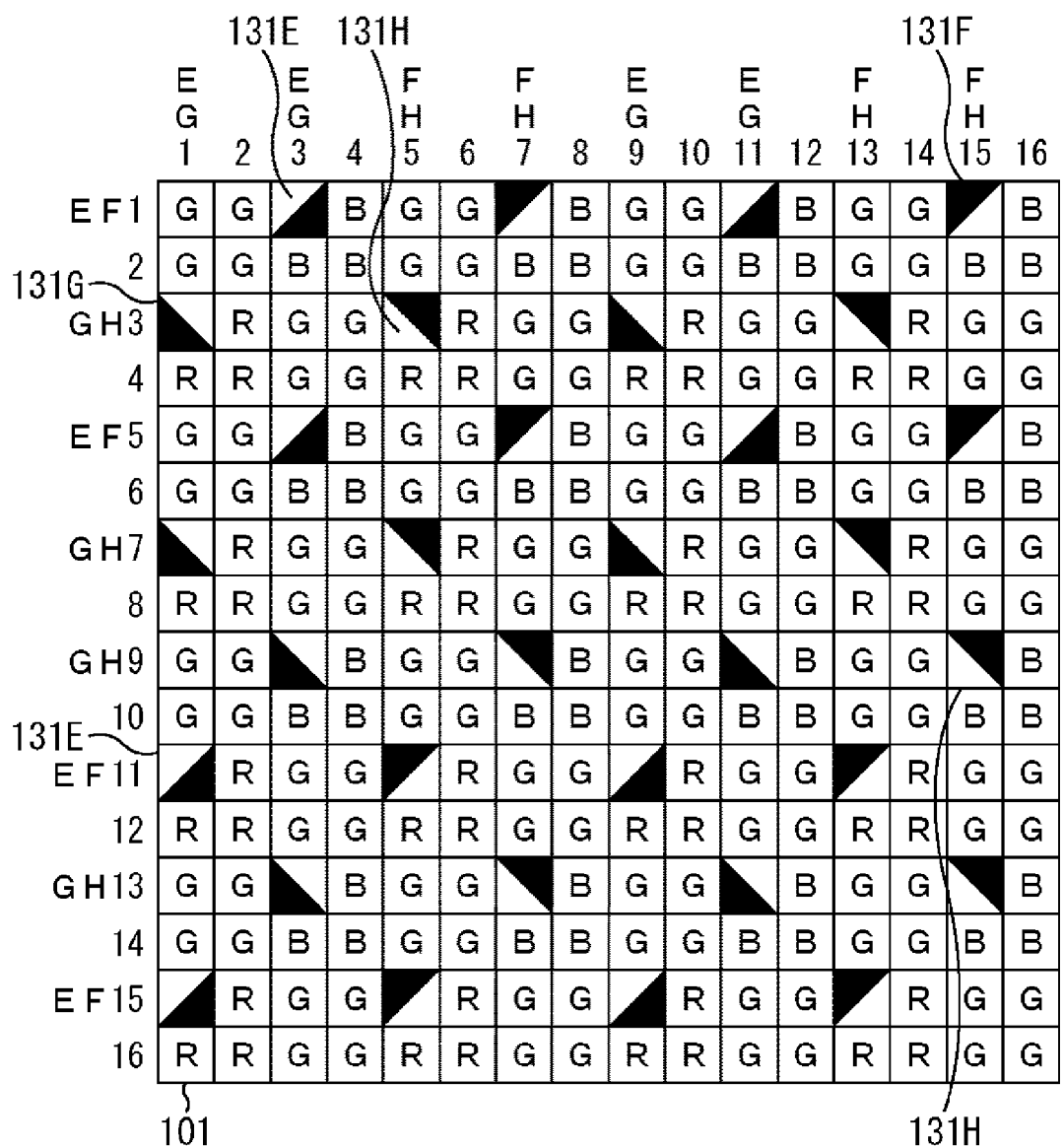
FIG. 20 is a diagram illustrating a planar configuration example of an embodiment of the image sensor to which the present technology is applied.

FIG. 20 is a diagram illustrating a planar configuration example of an embodiment of the image sensor to which the present technology is applied. In the sixth configuration example shown in FIG. 20, in any of the B sub block 103 and the R sub block 103, the pixel 111 of the upper left is set as the phase difference detection pixel 131 among the 2×2 pixels 111.

Specifically, in the B sub block 103, the phase difference detection pixel 131 for detecting the upper left diagonal phase difference or the upper right diagonal phase difference is disposed in the pixel 111 of the upper left. That is, one of the pair of phase difference detection pixels 131E and 131F for detecting the upper left diagonal phase difference is disposed in the pixels 111 of the first row and the fifth row. The phase difference detection pixel 131E that is one of the pair for detecting the upper left diagonal phase difference is disposed in the third column and the eleventh column and the phase difference detection pixel 131F that is the other of the pair for detecting the upper left diagonal phase difference is disposed in the seventh column and the fifteenth column among these.

One of the pair of phase difference detection pixels 131G and 131H for detecting the upper right diagonal phase difference is disposed in the pixels 111 of the ninth row and the thirteenth row. That is, the phase difference detection pixel 131G that is one of the pair for detecting the upper right diagonal phase difference is disposed in the third column and the eleventh column and the phase difference detection pixel 131H that is the other of the pair for detecting the upper right diagonal phase difference is disposed in the seventh column and the fifteenth column.

Next, in the R sub block 103, the phase difference detection pixel 131 for detecting the upper left diagonal phase difference or the upper right diagonal phase difference is disposed in the pixel 111 of the upper left. That is, one of the pair of phase difference detection pixels 131G and 131H for detecting the upper right diagonal phase difference is disposed in the pixels 111 of the third row and the seventh row. The phase difference detection pixel 131G that is one of the pair for detecting the upper right diagonal phase difference is disposed in the first column and the ninth column and the phase difference detection pixel 131H that is the other of the pair for detecting the upper right diagonal phase difference is disposed in the fifth column and the thirteenth column among these.

One of the pair of phase difference detection pixels 131E and 131F for detecting the upper left diagonal phase difference is disposed in the pixels 111 of the eleventh row and the fifteenth row. That is, the phase difference detection pixel 131E that is one of the pair for detecting the upper left diagonal phase difference is disposed in the first column and the ninth column and the phase difference detection pixel 131F that is the other of the pair for detecting the upper left diagonal phase difference is disposed in the fifth column and the thirteenth column. In a case in which the phase difference detection pixels 131 are disposed, the number of the phase difference detection pixels 131 is one in the one sub block 103 and two in the one block 102.

In the sixth configuration example, in both of the B sub block 103 and the R sub block 103, the phase difference detection pixels 131E and 131F for detecting the upper left diagonal phase difference and the phase difference detection pixels 131G and 131H for detecting the upper right diagonal phase difference are mixed. The phase difference detection pixels 131E and 131F for detecting the upper left diagonal phase difference and the phase difference detection pixels 131G and 131H for detecting the upper right diagonal phase difference are mixed also in the column unit. There are a row in which the phase difference detection pixels 131E and 131F for detecting the upper left diagonal phase difference are disposed and a row in which the phase difference detection pixels 131G and 131H for detecting the upper right diagonal phase difference are disposed in the row unit.

In the sixth configuration example of FIG. 20, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, in both of the B pixel 111 and the R pixel 111, switching is regularly performed in the upper left diagonal phase difference detection and the upper right diagonal phase difference detection for every two blocks 102. Therefore, the processing is able to be regularly repeated.

In the first to sixth configuration examples described above, the phase difference detection pixel 131 is disposed in the R pixel 111 and the B pixel 111, and the phase difference detection pixel 131 is not disposed in the G pixel 111. As a result, since it is not necessary to reduce the number of G pixels 111 that requires a greater amount of light compared to the B pixel 111 and the R pixel 111 to capture a high quality image, it is possible to obtain a high quality captured image with high visibility.

In addition, regarding structure, a sensitivity of the R pixel 111 tends to be higher than that of the B pixel 111, but it is not necessary to consider a relationship with the G pixel 111, and thus balance adjustment between the R pixel 111 and the B pixel 111 becomes easy.

7. Seventh Configuration Example (Phase Difference Detection Pixels of Horizontal Direction and Vertical Direction are Disposed in 1/4 Pixel, G Pixel in Row of B Pixel, and G Pixel in Row of R Pixel)

Next, a seventh configuration example of the imaging region 101 of the image sensor 41 will be described with reference to FIG. 21.

Figure 21:
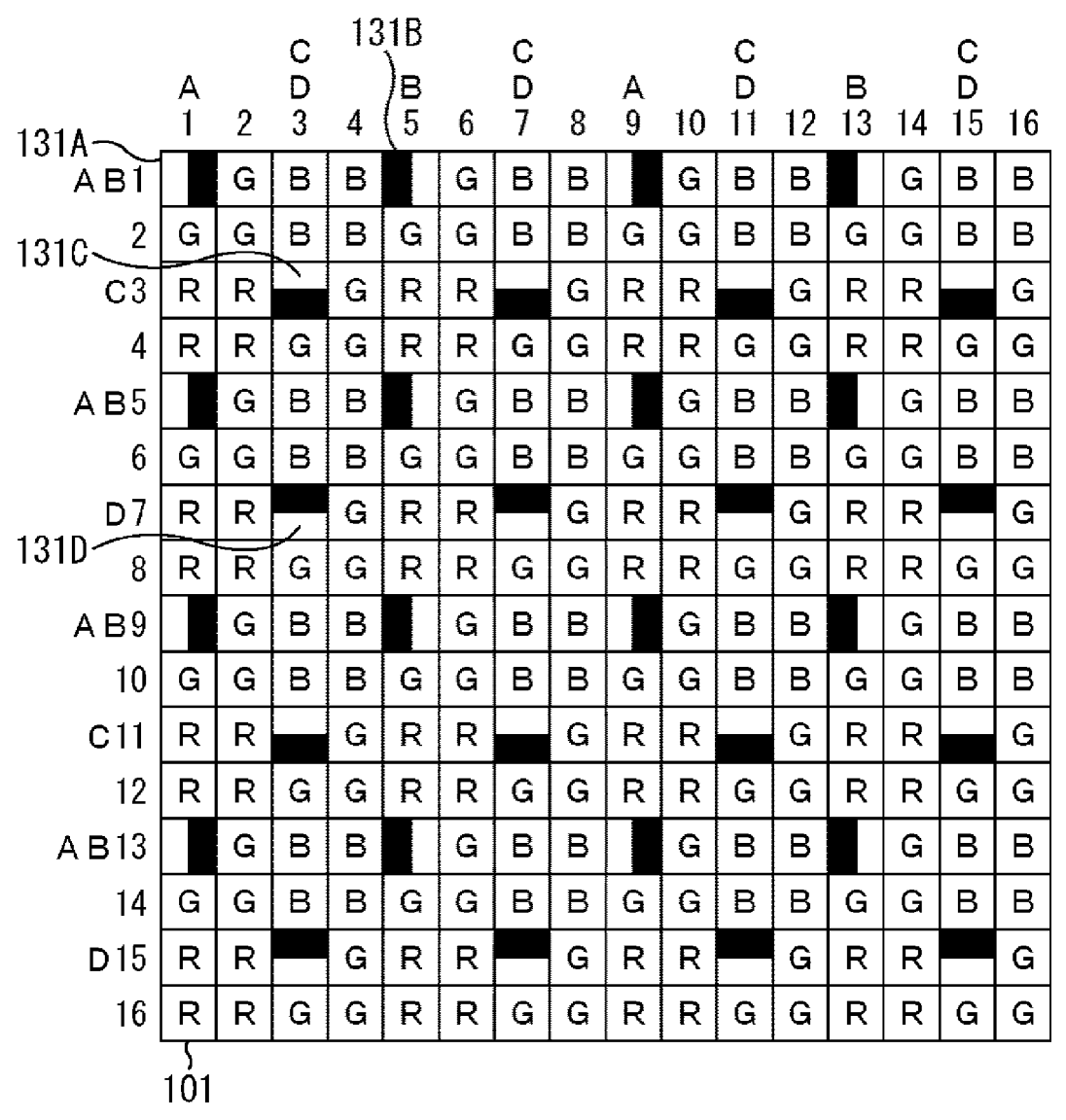

FIG. 21 is a diagram illustrating a planar configuration example of an embodiment of the image sensor to which the present technology is applied. In the seventh configuration example of FIG. 21, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the horizontal direction is disposed in the pixel 111 of the upper left among the 2×2 pixels 111. That is, in the pixels 111 of the first column and the ninth column, the phase difference detection pixel 131A configuring one of the pair of phase difference detection pixels 131A and 131B for detecting the phase difference of the horizontal direction is disposed. In the pixels 111 of the fifth column the thirteenth column, the phase difference detection pixel 131B configuring the other of the pair for detecting the phase difference of the horizontal direction is disposed.

In the G sub block 103 (in the same row as the R sub block 103) of the lower right, the phase difference detection pixel 131 for detecting the phase difference of a vertical direction is disposed in the pixel 111 of the upper left. That is, in the pixels 111 of the third row and the eleventh row, a phase difference detection pixel 131C configuring one of a pair of phase difference detection pixels 131C and 131D for detecting the phase difference of the vertical direction is disposed. In the pixels 111 of the seventh row and the fifteenth row, the phase difference detection pixel 131D configuring the other of the pair for detecting the phase difference of the vertical direction is disposed. In a case in which the phase difference detection pixels 131 are disposed, the number of the phase difference detection pixels 131 is one in the one sub block 103 and two in the one block 102.

In addition, in the seventh configuration example of FIG. 21, the detection of the phase difference of the horizontal direction is possible only with an output of the phase difference detection pixel 131 of the left upper G pixel 111 and the detection of the phase difference of the vertical direction is possible only with an output of the phase difference detection pixel 131 of the lower right G pixel 111. Therefore, signal processing becomes easy. The detection of the phase difference of the horizontal direction is possible by outputting the phase difference detection pixel 131 of the upper left G pixel of one row, and the detection of the phase difference of the vertical direction is possible by outputting the phase difference detection pixel 131 of the lower right G pixels 111 of two rows.

The positions of the phase difference detection pixel 131 of the horizontal direction and the phase difference detection pixel 131 of the vertical direction may be reversed. That is, the phase difference detection pixel 131 of the horizontal direction may be disposed in the lower right G pixel 111 and the phase difference detection pixel 131 of the vertical direction may be disposed in the upper left G pixel 111. In addition, one of the phase difference detection pixels 131 of the upper left G pixel 111 and the lower right G pixel 111 may be omitted and only one of the phase difference of the horizontal direction and the phase difference of the vertical direction may be detected.

8. Eighth Configuration Example (Phase Difference Detection Pixels of Horizontal Direction and Vertical Direction are Disposed in 1/4 Pixel, G Pixel in Row of B Pixel, and G Pixel in Row of R Pixel)

Next, an eighth configuration example of the imaging region 101 of the image sensor 41 will be described with reference to FIG. 22.

Figure 22:
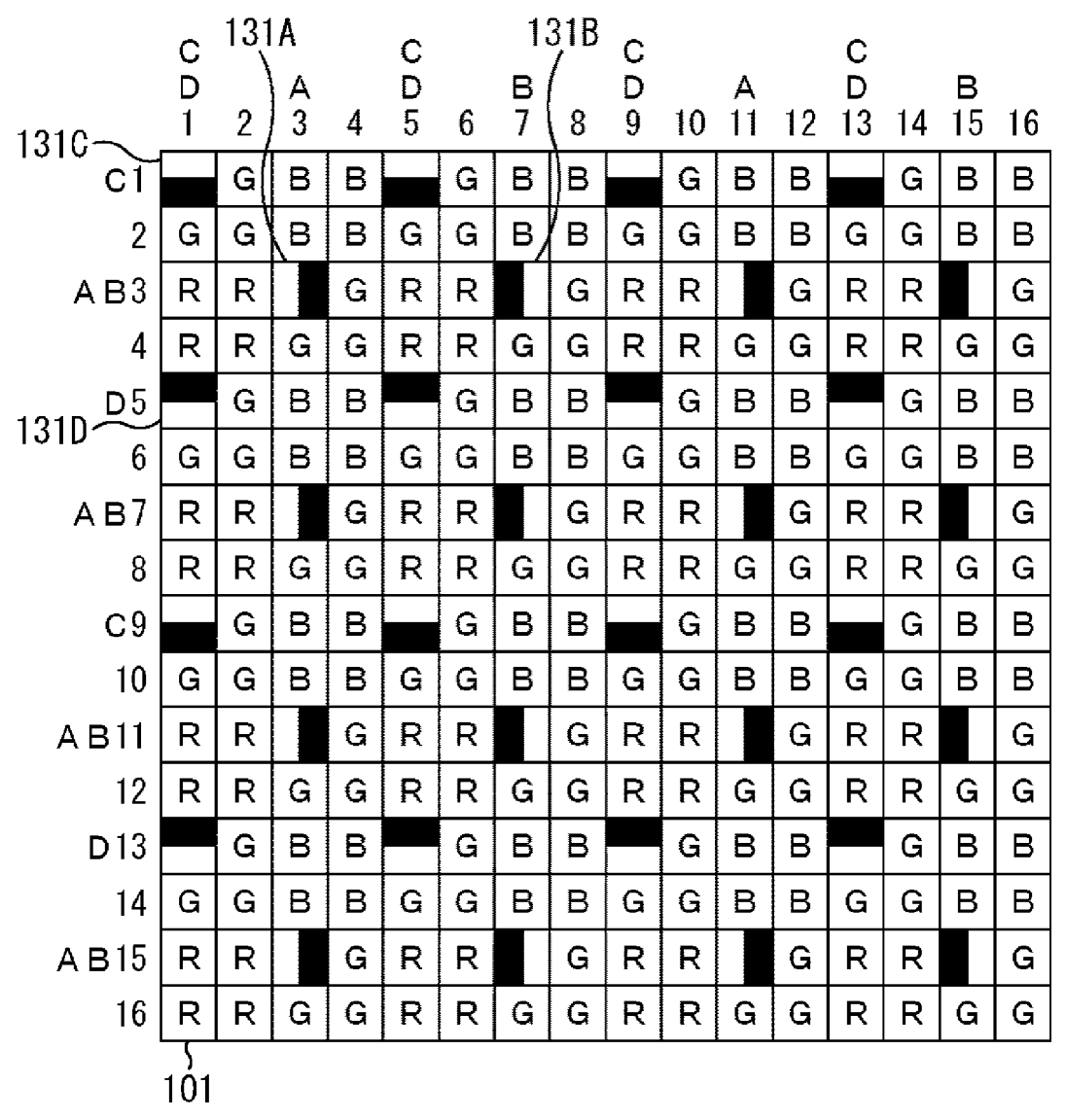

FIG. 22 is a diagram illustrating a planar configuration example of an embodiment of the image sensor to which the present technology is applied. In the eighth configuration example of FIG. 22, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the vertical direction is disposed in the pixel 111 of the upper left among the 2×2 pixels 111. That is, in the pixels 111 of the first row and the ninth row, the phase difference detection pixel 131C configuring one of the pair of phase difference detection pixels 131C and 131D for detecting the phase difference of the vertical direction is disposed. In the pixels 111 of the fifth row and the thirteenth row, the phase difference detection pixels 131D configuring the other of the pair for detecting the phase difference of the vertical direction is disposed.

In the G sub block 103 (in the same row as the R sub block 103) of the lower right, the phase difference detection pixel 131 for detecting the phase difference of a horizontal direction is disposed in the pixel 111 of the upper left. That is, in the pixels 111 of the third column and the eleventh column, a phase difference detection pixel 131A configuring one of a pair of phase difference detection pixels 131A and 131B for detecting the phase difference of the horizontal direction is disposed. In the pixels 111 of the seventh column and the fifteenth column, the phase difference detection pixel 131B configuring the other of the pair for detecting the phase difference of the horizontal direction is disposed. In a case in which the phase difference detection pixels 131 are disposed, the number of the phase difference detection pixels 131 is one in the one sub block 103 and two in the one block 102.

In addition, in the eighth configuration example of FIG. 22, the detection of the phase difference of the vertical direction is possible only with an output of the phase difference detection pixel 131 of the G pixel 111 of the upper left and the detection of the phase difference of the horizontal direction is possible only with an output of the phase difference detection pixel 131 of the G pixel 111 of the lower right. Therefore, signal processing becomes easy. The detection of the phase difference of the horizontal direction is possible by reading the phase difference detection pixel 131 of at least one row, but the detection of the phase difference of the vertical direction is possible by reading the phase difference detection pixel 131 of at least two rows. One of the phase difference detection pixels 131 of the G pixel 111 of the upper left and the G pixel 111 of the lower right may be omitted and only one of the phase difference of the horizontal direction and the phase difference of the vertical direction may be detected.

9. Ninth Configuration Example (Phase Difference Detection Pixels of Horizontal Direction and Vertical Direction are Disposed in 1/4 Pixel, G Pixel in Row of B Pixel, and G Pixel in Row of R Pixel in Mixed Manner)

Next, a ninth configuration example of the imaging region 101 of the image sensor 41 will be described with reference to FIG. 23.

FIG. 23 is a diagram illustrating a planar configuration example of an embodiment of the image sensor to which the present technology is applied. In the ninth configuration example of FIG. 23, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the horizontal direction and the vertical direction is disposed in the pixel 111 of the upper left among the 2×2 pixels 111. That is, in the first row and the fifth row, in the pixels 111 of the first column and the ninth column, the phase difference detection pixel 131A configuring one of the pair of phase difference detection pixels 131A and 131B for detecting the phase difference of the horizontal direction is disposed. In the pixels 111 of the fifth column the thirteenth column, the phase difference detection pixel 131B configuring the other of the pair for detecting the phase difference of the horizontal direction is disposed.

In the ninth row, the phase difference detection pixel 131C configuring one of the pair of phase difference detection pixels 131C and 131D for detecting the phase difference of the vertical direction is disposed. In the thirteenth row, the phase difference detection pixel 131D configuring the other of the pair is disposed.

Next, in the G sub block 103 (in the same row as the R sub block 103) of the lower right, the phase difference detection pixel 131 for detecting the phase difference of the vertical direction and the horizontal direction is disposed in the pixel 111 of the upper left. That is, in the pixels 111 of the third row, the phase difference detection pixel 131C configuring one of the pair of phase difference detection pixels 131C and 131D for detecting the phase difference of the vertical direction is disposed. In the pixels 111 of the seventh row, the phase difference detection pixels 131D configuring the other of the pair for detecting the phase difference of the vertical direction is disposed.

In addition, in the pixels 111 of the third column and the eleventh column in the eleventh row and the fifteenth row, the phase difference detection pixel 131C configuring one of the pair of phase difference detection pixels 131A and 131B for detecting the phase difference of the horizontal direction is disposed. In the pixels 111 of the seventh column and the fifteenth column, the phase difference detection pixel 131B configuring the other of the pair for detecting the phase difference of the horizontal direction is disposed. In a case in which the phase difference detection pixels 131 are disposed, the number of the phase difference detection pixels 131 is one in the one sub block 103 and two in the one block 102.

In addition, in this configuration example, both of the phase difference detection pixels 131A and 131B of the horizontal direction and the phase difference detection pixels 131C and 131D of the vertical direction are disposed in the upper left G sub block 103. Similarly, both of the phase difference detection pixels 131A and 131B of the horizontal direction and the phase difference detection pixels 131C and 131D of the vertical direction are disposed also in the lower right left G sub block 103. Therefore, even if the phase difference detection pixel 131 is provided only in one of the upper left G sub block 103 and the lower right G sub block 103, the phase difference detection of the both directions is possible.

In addition, in both of the upper left G pixel 111 and the lower right G pixel 111, switching is regularly performed in phase difference detection of the horizontal direction and the phase difference detection of the vertical direction for every two blocks 102. Therefore, the processing is able to be regularly repeated.

10. Tenth Configuration Example (Phase Difference Detection Pixels of Upper Left Diagonal and Upper Right Diagonal are Disposed in 1/4 Pixel, G Pixel in Row of B Pixel, and G Pixel in Row of R Pixel)

Next, a tenth configuration example of the imaging region 101 of the image sensor 41 will be described with reference to FIG. 24.

Figure 24:
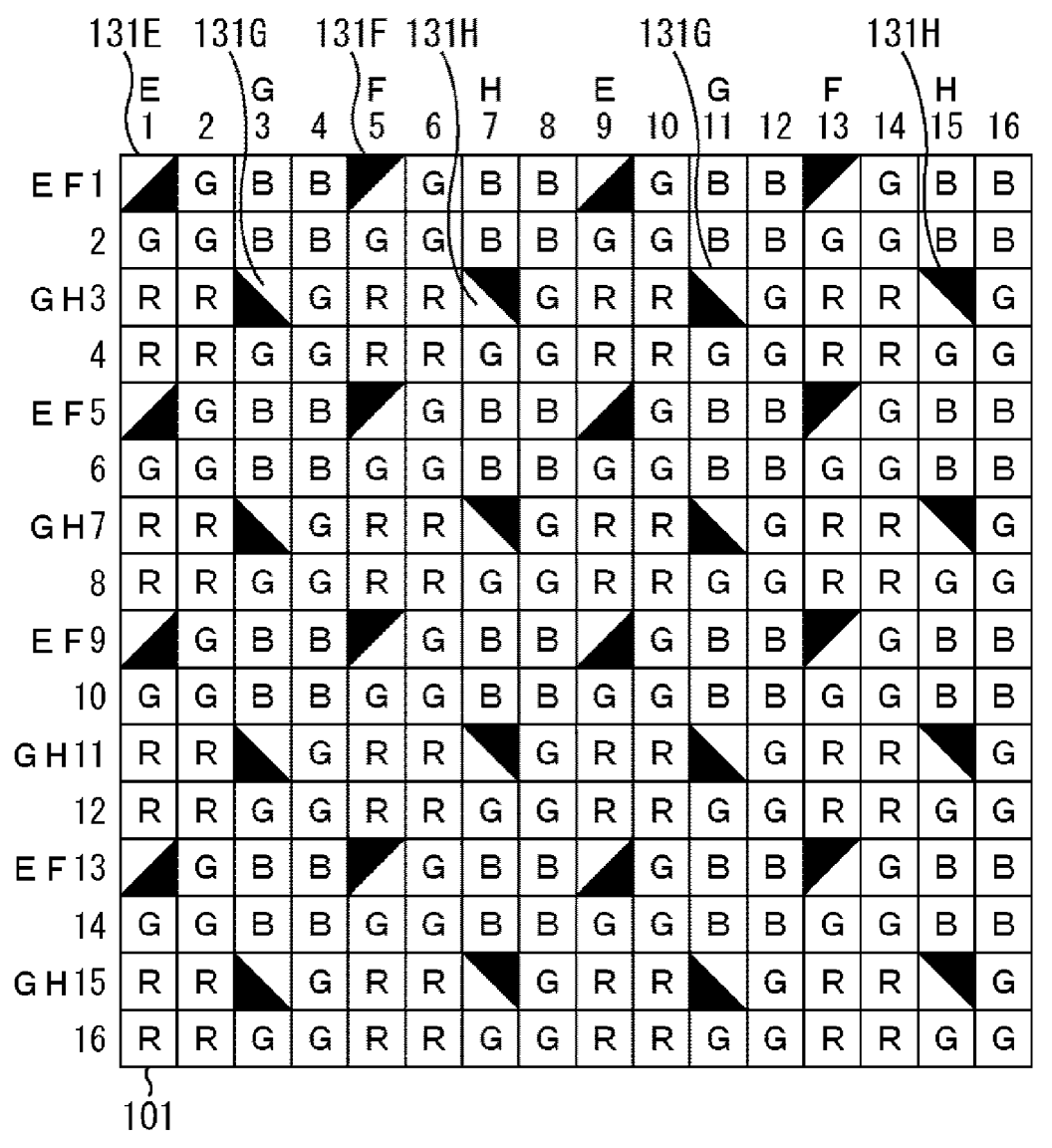

FIG. 24 is a diagram illustrating a planar configuration example of an embodiment of the image sensor to which the present technology is applied. In the tenth configuration example of FIG. 24, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the upper left diagonal direction is disposed in the pixel 111 of the upper left among the 2×2 pixels 111. That is, in the pixels 111 of the first column and the ninth column, the phase difference detection pixel 131E configuring one of the pair of phase difference detection pixels 131E and 131F for detecting the phase difference of the upper left diagonal direction is disposed. In the pixels 111 of the fifth column the thirteenth column, the phase difference detection pixel 131F configuring the other of the pair for detecting the phase difference of the upper left diagonal direction is disposed.

Next, in the G sub block 103 (in the same row as the R sub block 103) of the lower right, the phase difference detection pixel 131 for detecting the phase difference of a upper right diagonal direction is disposed in the pixel 111 of the upper left. That is, in the pixels 111 of the third column and the eleventh column, a phase difference detection pixel 131G configuring one of a pair of phase difference detection pixels 131G and 131H for detecting the phase difference of the upper right diagonal direction is disposed. In the pixels 111 of the seventh column and the fifteenth column, the phase difference detection pixel 131H configuring the other of the pair for detecting the phase difference of the upper right diagonal direction is disposed. In a case in which the phase difference detection pixels 131 are disposed, the number of the phase difference detection pixels 131 is one in the one sub block 103 and two in the one block 102.

In the tenth configuration example of FIG. 24, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, the detection of the upper left diagonal phase difference is possible only with the output of the phase difference detection pixel 131 of the G pixel 111 of the upper left, and the detection of the upper right diagonal phase difference is possible only with the output of the phase difference detection pixel 131 of the G pixel 111 of the lower right. Therefore, signal processing becomes easy. The detection of the upper left diagonal phase difference and the detection of the upper right diagonal phase difference are possible by reading the phase difference detection pixels 131 of at least one row, respectively. It is also possible to omit the phase difference detection pixel 131 of the G pixel 111 of the upper left or the G pixel 111 of the lower right and detect only one of the upper left diagonal phase difference and the upper right diagonal phase difference.

11. Eleventh Configuration Example (Phase Difference Detection Pixels of Upper Right Diagonal and Upper Left Diagonal are Disposed in 1/4 Pixel, G Pixel in Row of B Pixel, and G Pixel in Row of R Pixel)

Next, an eleventh configuration example of the imaging region 101 of the image sensor 41 will be described with reference to FIG. 25.

Figure 25:
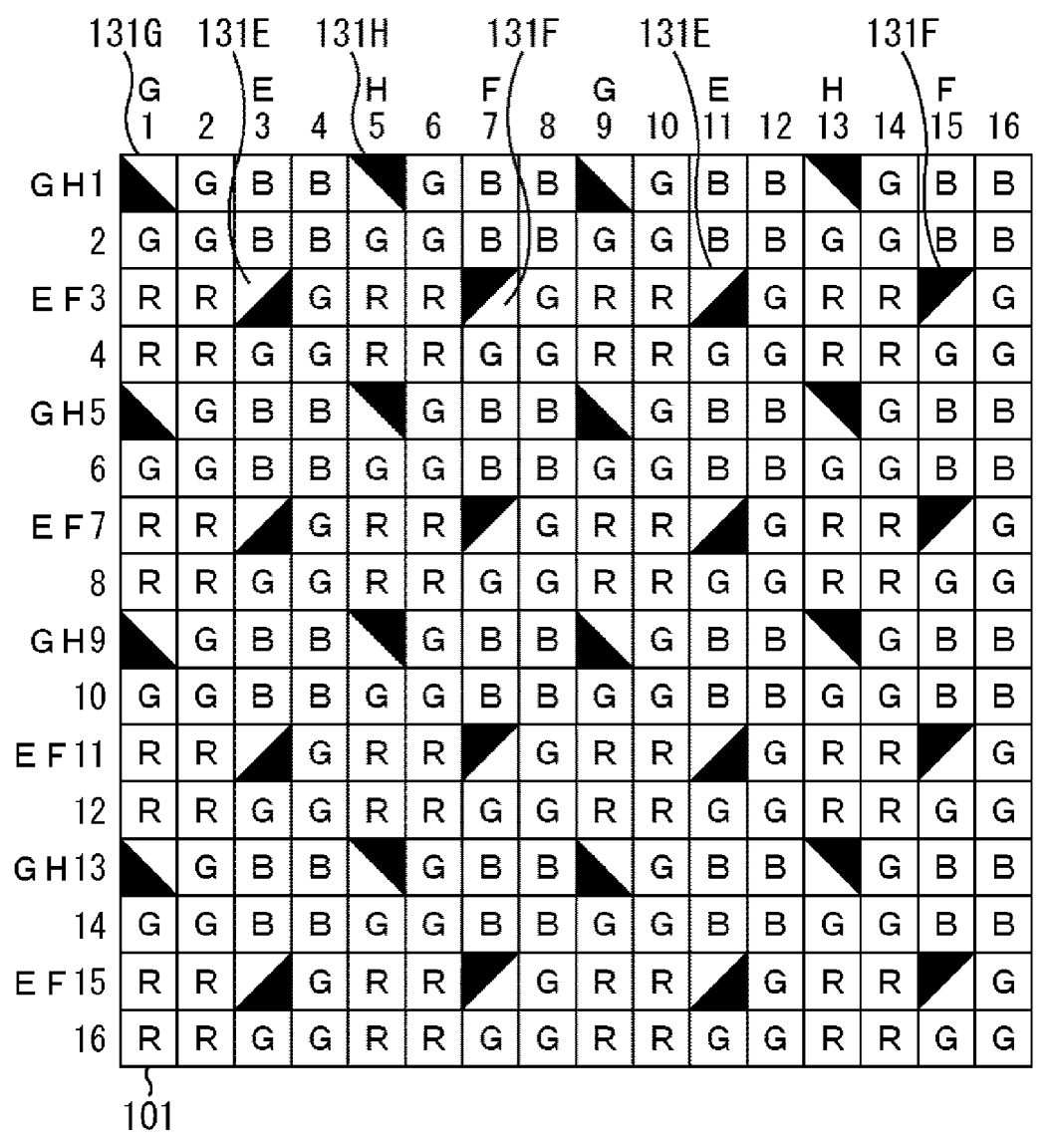

FIG. 25 is a diagram illustrating a planar configuration example of an embodiment of the image sensor to which the present technology is applied. In the eleventh configuration example of FIG. 25, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the upper right diagonal direction is disposed in the pixel 111 of the upper left among the 2×2 pixels 111. That is, in the pixels 111 of the first column and the ninth column, the phase difference detection pixel 131G configuring one of the pair of phase difference detection pixels 131G and 131H for detecting the phase difference of the upper right diagonal direction is disposed. In the pixels 111 of the fifth column and the thirteenth column, the phase difference detection pixel 131H configuring the other of the pair for detecting the phase difference of the upper right diagonal direction is disposed.

Next, in the G sub block 103 (in the same row as the R sub block 103) of the lower right, the phase difference detection pixel 131 for detecting the phase difference of a upper left diagonal direction is disposed in the pixel 111 of the upper left. That is, in the pixels 111 of the third column and the eleventh column, a phase difference detection pixel 131E configuring one of a pair of phase difference detection pixels 131E and 131F for detecting the phase difference of the upper left diagonal direction is disposed. In the pixels 111 of the seventh column and the fifteenth column, the phase difference detection pixel 131F configuring the other of the pair for detecting the phase difference of the upper left diagonal direction is disposed. In a case in which the phase difference detection pixels 131 are disposed, the number of the phase difference detection pixels 131 is one in the one sub block 103 and two in the one block 102.

In the eleventh configuration example of FIG. 25, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, the detection of the upper left diagonal phase difference is possible only with the output of the phase difference detection pixel 131 of the G pixel 111 of the lower right, and the detection of the upper right diagonal phase difference is possible only with the output of the phase difference detection pixel 131 of the G pixel 111 of the upper left. Therefore, signal processing becomes easy. The detection of the upper left diagonal phase difference and the detection of the upper right diagonal phase difference are possible by reading the phase difference detection pixels 131 of at least one row, respectively. It is also possible to omit the phase difference detection pixel 131 of the G pixel 111 of the upper left or the G pixel 111 of the lower right and detect only one of the upper left diagonal phase difference and the upper right diagonal phase difference.

12. Twelfth Configuration Example (Phase Difference Detection Pixels of Upper Left Diagonal and Upper Right Diagonal are Disposed in 1/4 Pixel, G Pixel in Row of B Pixel, and G Pixel in Row of R Pixel in Mixed Manner)

Next, a twelfth configuration example of the imaging region 101 of the image sensor 41 will be described with reference to FIG. 26.

Figure 26:
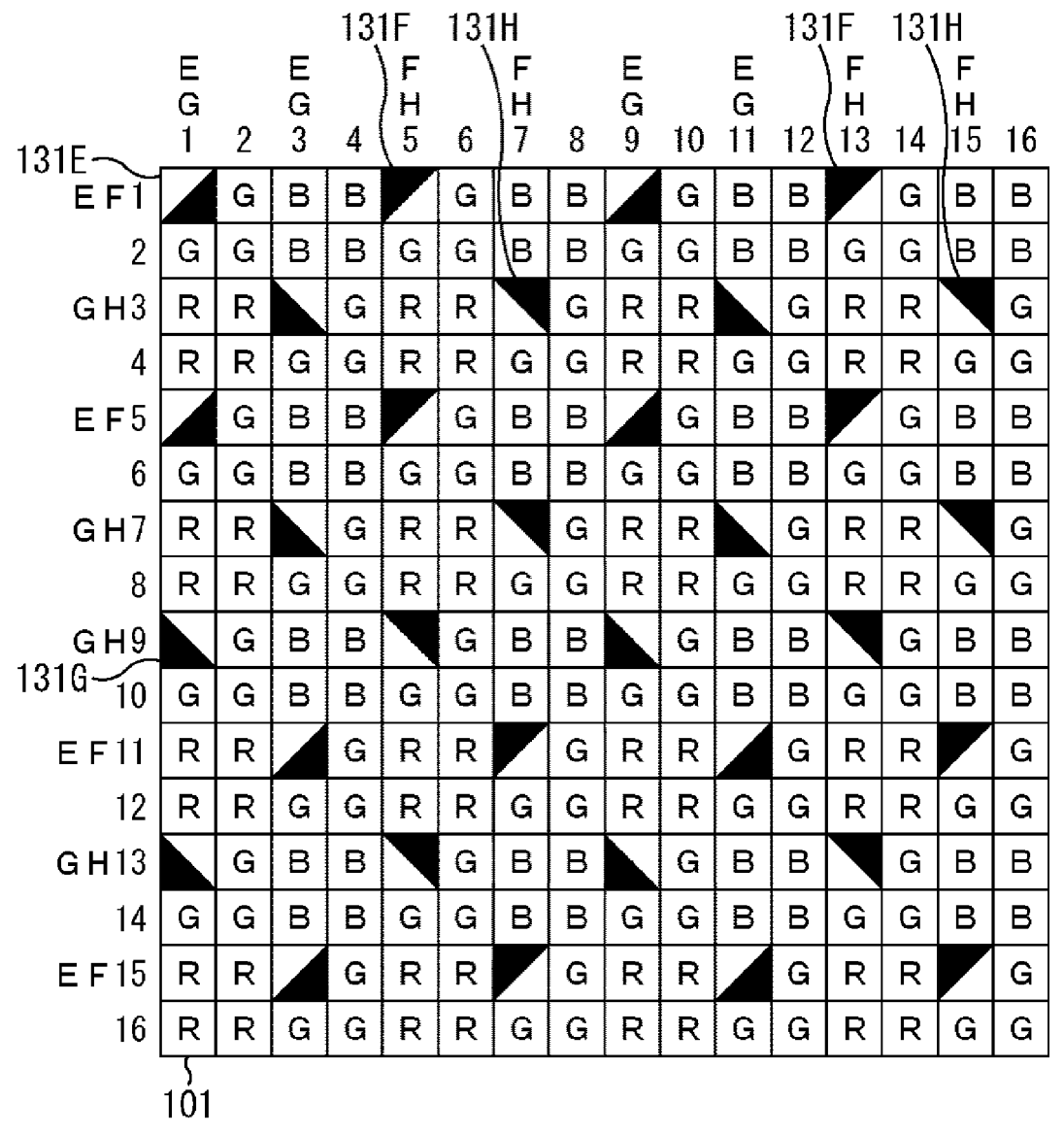

FIG. 26 is a diagram illustrating a planar configuration example of an embodiment of the image sensor to which the present technology is applied. In the twelfth configuration example of FIG. 26, in both of the upper left and lower right G sub blocks 103 in the block 102, the pixel 111 of the upper left is set as the phase difference detection pixel 131 among the 2×2 pixels 111.

Specifically, in the G sub block 103 (in the same row as the B sub block 103) of the upper left, the phase difference detection pixel 131 for detecting the phase difference of the upper left diagonal direction or the upper right diagonal direction is disposed in the pixel 111 of the upper left among the 2×2 pixels 111. That is, in the first row and the fifth row, in the pixels 111 of the first column and the ninth column, the phase difference detection pixel 131E configuring one of the pair of phase difference detection pixels 131E and 131F for detecting the phase difference of the upper left diagonal direction is disposed. In the pixels 111 of the fifth column the thirteenth column, the phase difference detection pixel 131F configuring the other of the pair for detecting the phase difference of the upper left diagonal direction is disposed.

In the pixels 111 of the first column and the ninth column in the ninth row and the thirteenth row, the phase difference detection pixel 131G configuring one of the pair of phase difference detection pixels 131G and 131H for detecting the upper right diagonal phase difference is disposed. In the pixels 111 of the fifth column and the thirteenth column, the phase difference detection pixel 131H configuring the other of the pair for detecting the upper right diagonal phase difference is disposed.

Next, in the G sub block 103 (in the same row as the R sub block 103) of the lower right, the phase difference detection pixel 131 for detecting the phase difference of the upper right diagonal direction or the upper left diagonal direction is disposed in the pixel 111 of the upper left among the 2×2 pixels 111. That is, in the third row and the seventh row, in the pixels 111 of the third column and the eleventh column, the phase difference detection pixel 131G configuring one of the pair of phase difference detection pixels 131G and 131H for detecting the phase difference of the upper right diagonal direction is disposed. In the pixels 111 of the seventh column the fifteenth column, the phase difference detection pixel 131H configuring the other of the pair for detecting the phase difference of the upper right diagonal direction is disposed.

In the pixels 111 of the third column and the eleventh column in the eleventh row and the fifteenth row, the phase difference detection pixel 131E configuring one of the pair of phase difference detection pixels 131E and 131F for detecting the phase difference of the upper left diagonal direction is disposed. In the pixels 111 of the seventh column and the fifteenth column, the phase difference detection pixel 131F configuring the other of the pair for detecting the phase difference of the upper left diagonal direction is disposed. In a case in which the phase difference detection pixels 131 are disposed, the number of the phase difference detection pixels 131 is one in the one sub block 103 and two in the one block 102.

In the twelfth configuration example of FIG. 26, the phase difference detection pixel is disposed at the upper left, the lower left, the upper right, or the lower right of the imaging region 101 as will be described later with reference to FIG. 38, and thus it is possible to reduce an influence of astigmatism with respect to the phase difference detection. In addition, in both of the G pixel 111 of the upper left and the G pixel 111 of the lower right, switching is regularly performed in the upper left diagonal phase difference detection and the upper right diagonal phase difference detection for every two blocks 102. Therefore, the processing is able to be regularly repeated.

In the configuration examples of FIGS. 21 to 26 described above, the phase difference detection pixel 131 is disposed in the G pixel 111. As a result, it is possible to prevent a reduction in amount of light in the B sub block 103 or the R sub block 103 that is only one sub block 103 in one block 102. Note that it is possible to reduce the influence on the G pixel 111 that requires a greater amount of light than the B pixel 111 and the R pixel 111 by correction.

13. Thirteenth Configuration Example (Phase Difference Detection Pixels of the Same Horizontal Direction are Disposed in 2/4 Pixel and B Pixel)

Next, a thirteenth configuration example of the imaging region 101 of the image sensor 41 will be described with reference to FIG. 27.

FIG. 27 is a diagram illustrating a planar configuration example of an embodiment of the image sensor to which the present technology is applied. In the thirteenth configuration example of FIG. 27, in any of the B sub blocks 103, the two pixels 111 of the upper left and the lower right are set as the phase difference detection pixels 131 among the 2×2 pixels 111.

In the upper left B pixel 111 of the third column and the lower right B pixel 111 of the fourth column, the phase difference detection pixel 131A configuring one of the pair of phase difference detection pixels 131A and 131B for detecting the phase difference of the horizontal direction is disposed. Similarly, in the upper left B pixel 111 of the eleventh column and the lower right B pixel 111 of the twelfth column, the phase difference detection pixel 131A configuring one of the pair for detecting the phase difference of the horizontal direction is disposed.

In the upper left B pixel 111 of the seventh column and the lower right B pixel 111 of the eighth column, the phase difference detection pixel 131B configuring the other of the pair of phase difference detection pixels 131A and 131B for detecting the phase difference of the horizontal direction is disposed. Similarly, in the upper left B pixel 111 of the fifteenth column and the lower right B pixel 111 of the sixteenth column, the phase difference detection pixel 131B configuring the other of the for detecting the phase difference of the horizontal direction is disposed. In a case in which the phase difference detection pixels 131 are disposed, the number of the phase difference detection pixels 131 is one in the one sub block 103 and two in the one block 102.

Regarding the B sub block 103, the phase difference detection pixel 131A for detecting the phase difference of the horizontal direction and the phase difference detection pixel 131B for detecting the phase difference of the horizontal direction of the same row that is paired with the phase difference detection pixel 131A are separated from each other by two when counting by the sub block 103. In addition, the phase difference detection pixel 131A for detecting the phase difference of the horizontal direction and the next phase difference detection pixel 131A for detecting the phase difference of the horizontal direction of the same phase in the same row are separated from each other by 4 when counting by the sub block 103 (2-4B).

In this configuration example, two upper left and the lower right pixels of four B pixels 111 are the same phase difference detection pixels 131A or the same phase difference detection pixels 131B. The phase difference detection pixel 131 at the upper left and the phase difference detection pixel 131 at the lower right (one row below) are adjacent to each other on a diagonal line and are close to each other. Therefore, since characteristics of the both are approximated, it is possible to detect the phase difference by block matching (line matching) with upper and lower phase difference columns Averaging processing is performed by adding the pixel values or values after the phase difference detection, and thus it is possible to improve immunity to noise and improve detection accuracy.

In addition, in this configuration example, the phase difference detection pixels 131A and 131B for detecting the phase difference of the horizontal direction may be disposed in the pixels 111 of the upper left and lower right in the R sub block 103. In addition, instead of the phase difference detection pixels 131A and 131B for detecting the phase difference of the horizontal direction, the phase difference detection pixels 131C and 131D for detecting the phase difference of the vertical direction may be disposed.

14. Fourteenth Configuration Example (Pair of Phase Difference Detection Pixels of Horizontal Direction are Disposed in 2/4 Pixel and B Pixel)

Next, a fourteenth configuration example of the imaging region 101 of the image sensor 41 will be described with reference to FIG. 28.

FIG. 28 is a diagram illustrating a planar configuration example of an embodiment of the image sensor to which the present technology is applied. In the fourteenth configuration example of FIG. 28, in any of the B sub blocks 103, the two pixels 111 of the upper left and the lower right are set as the phase difference detection pixels 131 among the 2×2 pixels 111.

In the configuration example of FIG. 27, in the same B sub block 103, the same phase difference detection pixel 131 for detecting the phase difference of the horizontal direction is disposed. That is, two phase difference detection pixels 131A or two phase difference detection pixels 131B are disposed. On the other hand, in the configuration example of FIG. 28, at the upper left and lower right in the same B sub block 103, the pair of phase difference detection pixels 131 for detecting the phase difference of the horizontal direction are disposed. That is, the phase difference detection pixel 131A and the phase difference detection pixel 131B are disposed.

In the upper left B pixel 111 of the third column and the lower right B pixel 111 of the fourth column, the phase difference detection pixel 131A that is one of the pair for detecting the phase difference of the horizontal direction and the phase difference detection pixel 131B that is the other of the pair are disposed. Also in the upper left B pixel 111 of the seventh column and the lower right B pixel 111 of the eighth column, the phase difference detection pixel 131A that is one of the pair for detecting the phase difference of the horizontal direction and the phase difference detection pixel 131B that is the other of the pair are disposed. Also in the upper left B pixel 111 of the eleventh column and the lower right B pixel 111 of the twelfth column, the phase difference detection pixel 131A that is one of the pair for detecting the phase difference of the horizontal direction and the phase difference detection pixel 131B that is the other of the pair are disposed. Also in the upper left B pixel 111 of the fifteenth column and the lower right B pixel 111 of the sixteenth column, the phase difference detection pixel 131A that is one of the pair for detecting the phase difference of the horizontal direction and the phase difference detection pixel 131B that is the other of the pair are disposed.

That is, in the upper left B pixel 111 of the first row, the fifth row, the ninth row, and the thirteenth row, the phase difference detection pixel 131A that is one of the pair for detecting the phase difference of the horizontal direction is disposed. In the lower right B pixel 111 of the second row, the sixth row, the tenth row, and the fourteenth row, the phase difference detection pixel 131B that is the other of the pair for detecting the phase difference of the horizontal direction is disposed. In a case in which the phase difference detection pixels 131 are disposed, the number of the phase difference detection pixels 131 is two in the one sub block 103 and two in the one block 102.

Regarding the B sub block 103, the phase difference detection pixel 131A for detecting the phase difference of the horizontal direction and the phase difference detection pixel 131B for detecting the phase difference of the horizontal direction that is shifted from the phase difference detection pixel 131A by one row but is paired with the phase difference detection pixel 131A are not separated from each other when counting by the sub block 103 (separated from each other by 0). In addition, the phase difference detection pixel 131A for detecting the phase difference of the horizontal direction and the next phase difference detection pixel 131A for detecting the phase difference of the horizontal direction of the same phase in the same row are separated from each other by 2 when counting by the sub block 103 (0-2B).

In addition, in this configuration example, the phase difference detection pixels 131A and 131B for detecting the phase difference of the horizontal direction may be disposed in the pixels 111 of the upper left and lower right in the R sub block 103. In addition, instead of the phase difference detection pixels 131A and 131B for detecting the phase difference of the horizontal direction, the phase difference detection pixels 131C and 131D for detecting the phase difference of the vertical direction may be disposed.

15. Fifteenth Configuration Example (Phase Difference Detection Pixels of Horizontal Direction and Vertical Direction are Disposed in 2/4 Pixel and B Pixel in Mixed Manner)

Next, a fifteenth configuration example of the imaging region 101 of the image sensor 41 will be described with reference to FIG. 29.

FIG. 29 is a diagram illustrating a planar configuration example of an embodiment of the image sensor to which the present technology is applied. In the fifteenth configuration example of FIG. 29, in any of the B sub blocks 103, the two pixels 111 of the upper left and the lower right are set as the phase difference detection pixels 131 among the 2×2 pixels 111.

In the upper left B pixel 111 of the third column and the upper left B pixel 111 of the eleventh column among the 2×2 pixels 111, the phase difference detection pixel 131A configuring one of the pair of phase difference detection pixels 131A and 131B for detecting the phase difference of the horizontal direction is disposed. In the upper left B pixel 111 of the seventh column and the upper left B pixel 111 of the fifteenth column, the phase difference detection pixel 131B configuring the other of the pair of phase difference detection pixels 131A and 131B for detecting the phase difference of the horizontal direction is disposed.

In the lower right B pixel 111 of the second row and the lower right B pixel 111 of the tenth row, the phase difference detection pixel 131C configuring one of the pair of phase difference detection pixels 131C and 131D for detecting the phase difference of the vertical direction is disposed. In the lower right B pixel 111 of the sixth row and the lower right B pixel 111 of the fourteenth row, the phase difference detection pixel 131D configuring the other of the pair of phase difference detection pixels 131C and 131D for detecting the phase difference of the vertical direction is disposed. In a case in which the phase difference detection pixels 131 are disposed, the number of the phase difference detection pixels 131 is two in the one sub block 103 and two in the one block 102.

In the fifteenth configuration example, in one B sub block 103, the pair of phase difference detection pixels 131A or 131B for detecting the phase difference of the horizontal direction and the pair of phase difference detection pixels for detecting the phase difference of the vertical direction pixel 131C or 131D are disposed in a mixed manner.

In addition, regarding the B sub block 103, the phase difference detection pixel 131A for detecting the phase difference of the horizontal direction and the phase difference detection pixel 131B for detecting the phase difference of the horizontal direction of the same row that is paired with the phase difference detection pixel 131A are separated from each other by two when counting by the sub block 103. In addition, the phase difference detection pixel 131A for detecting the phase difference of the horizontal direction and the next phase difference detection pixel 131A for detecting the phase difference of the horizontal direction of the same phase in the same row are separated from each other by 4 when counting by the sub block 103 (2-4B).

In addition, regarding the B sub block 103, the phase difference detection pixel 131C for detecting the phase difference of the vertical direction and the phase difference detection pixel 131D for detecting the phase difference of the vertical direction of the same column that is paired with the phase difference detection pixel 131C are separated from each other by two when counting by the sub block 103. In addition, the phase difference detection pixel 131C for detecting the phase difference of the vertical direction and the next phase difference detection pixel 131C for detecting the phase difference of the vertical direction of the same phase in the same column are separated from each other by 4 when counting by the sub block 103 (2-4B).

In addition, in this configuration example, the phase difference detection pixels 131A and 131B for detecting the phase difference of the horizontal direction may be replaced with the phase difference detection pixels 131C and 131D for detecting the phase difference of the vertical direction and disposed. In addition, the phase difference detection pixels 131A to 131D for detecting the phase difference of the horizontal direction and the vertical direction may be disposed in the pixels 111 of the upper left and the lower right of the R sub block 103.

16. Sixteenth Configuration Example (Phase Difference Detection Pixels of Upper Left Diagonal and Upper Right Diagonal are Disposed in 2/4 Pixel and B Pixel in Mixed Manner)

Next, a sixteenth configuration example of the imaging region 101 of the image sensor 41 will be described with reference to FIG. 30.

FIG. 30 is a diagram illustrating a planar configuration example of an embodiment of the image sensor to which the present technology is applied. In the sixteenth configuration example of FIG. 30, in any of the B sub blocks 103, the two pixels 111 of the upper left and the lower right are set as the phase difference detection pixels 131 among the 2×2 pixels 111.

In the upper left B pixel 111 of the third column and the upper left B pixel 111 of the eleventh column among the 2×2 pixels 111, the phase difference detection pixel 131E configuring one of the pair of phase difference detection pixels 131E and 131F for detecting the upper left diagonal phase difference is disposed. In the upper left B pixel 111 of the seventh column and the upper left B pixel 111 of the fifteenth column, the phase difference detection pixel 131F configuring the other of the pair of phase difference detection pixels 131E and 131F for detecting the upper left diagonal phase difference is disposed.

In the lower right B pixel 111 of the fourth column and the lower right B pixel 111 of the twelfth column, the phase difference detection pixel 131G configuring one of the pair of phase difference detection pixels 131G and 131H for detecting the upper right diagonal phase difference is disposed. In the lower right B pixel 111 of the eighth column and the lower right B pixel 111 of the sixteenth column, the phase difference detection pixel 131H configuring the other of the pair of phase difference detection pixels 131G and 131H for detecting the upper right diagonal phase difference is disposed. In a case in which the phase difference detection pixels 131 are disposed, the number of the phase difference detection pixels 131 is two in the one sub block 103 and two in the one block 102.

That is, in the sixteenth configuration example, in the one B sub block 103, the pair of the phase difference detection pixels 131E for detecting the upper left diagonal phase difference and the pair of the phase difference detection pixels 131G for detecting the upper right diagonal phase difference are disposed in a mixed manner. In addition, the pair of the phase difference detection pixels 131F for detecting the upper left diagonal phase difference and the pair of the phase difference detection pixels 131H for detecting the upper right diagonal phase difference are disposed in a mixed manner. In a case in which the entire B sub block 103 is viewed, the phase difference detection pixels 131E and 131F, and the phase difference detection pixels 131G and 131H are disposed in a mixed manner.

In addition, regarding the B sub block 103, the phase difference detection pixel 131E for detecting the upper left diagonal phase difference and the phase difference detection pixel 131F for detecting the upper left diagonal phase difference of the same row that is paired with the phase difference detection pixel 131E are separated from each other by two when counting by the sub block 103. In addition, the phase difference detection pixel 131E for detecting the upper left diagonal phase difference and the next phase difference detection pixel 131E for detecting the upper left diagonal phase difference of the same phase in the same row are separated from each other by 4 when counting by the sub block 103 (2-4B).

In addition, regarding the B sub block 103, the phase difference detection pixel 131G for detecting the upper right diagonal phase difference and the phase difference detection pixel 131H for detecting the upper right diagonal phase difference of the same row that is paired with the phase difference detection pixel 131G are separated from each other by two when counting by the sub block 103. In addition, the phase difference detection pixel 131G for detecting the upper right diagonal phase difference and the next phase difference detection pixel 131G for detecting the upper right diagonal phase difference of the same phase in the same row are separated from each other by 4 when counting by the sub block 103 (2-4B).

Note that the phase difference detection pixels 131E and 131F for detecting the upper left diagonal phase difference and the phase difference detection pixels 131G and 131H for detecting the upper right diagonal phase difference may be disposed in the pixels 111 of the upper left and lower right of the R sub block 103.

In addition, in the thirteenth to sixteenth configuration examples of FIGS. 27 to 30, the two phase difference detection pixels 131 are disposed in the B sub block 103. The B pixel 111 has lower visibility than the R pixel 111 or the G pixel 111. Therefore, deterioration of the image is suppressed as compared with a case in which the phase difference detection pixel 131 is disposed in the R pixel 111 or the G pixel 111.

In addition, in the thirteenth to sixteenth configuration examples of FIGS. 27 to 30, as in a case of the seventh to twelfth configuration examples of FIGS. 21 to 26, two types of phase difference detection pixels 131 may be disposed the two G sub blocks 103, respectively.

17. Seventeenth Configuration Example (Phase Difference Detection Pixels of the Same Horizontal Direction and the Same Vertical Direction are Disposed in 2/4 Pixel, B Pixel, and R Pixel)

Next, a seventeenth configuration example of the imaging region 101 of the image sensor 41 will be described with reference to FIG. 31.

FIG. 31 is a diagram illustrating a planar configuration example of an embodiment of the image sensor to which the present technology is applied. In the seventeenth configuration example of FIG. 31, in any of the B sub block 103 and the R sub block 103, the two pixels 111 of the upper left and the lower right are set as the phase difference detection pixels 131 among the 2×2 pixels 111.

In the B sub block 103, in the pixels 111 of the upper left of the third column, the lower right of the fourth column, the upper left of the eleventh column, and the lower right of the twelfth column, the phase difference detection pixel 131A configuring one of the pair of phase difference detection pixels 131A and 131B for detecting the phase difference of the horizontal direction is disposed. In the pixels 111 of the upper left of the seventh column, the lower right of the eighth column, the upper left of the fifteenth column, and the lower right of the sixteenth column, the phase difference detection pixel 131B configuring the other of the pair for detecting the phase difference of the horizontal direction is disposed.

In the R sub block 103, in the pixels 111 of the upper left of the third row, the lower right of the fourth row, the upper left of the eleventh row, and the lower right of the twelfth row, the phase difference detection pixel 131C configuring one of the pair of phase difference detection pixels 131C and 131D for detecting the phase difference of the vertical direction is disposed. In the pixels 111 of the upper left of the seventh row, the lower right of the eighth row, the upper left of the fifteenth row, and the lower right of the sixteenth row, the phase difference detection pixel 131D configuring the pair of phase difference detection pixels 131C and 131D for detecting the phase difference of the vertical direction is disposed. In a case in which the phase difference detection pixels 131 are disposed, the number of the phase difference detection pixels 131 is two in the one sub block 103 and four in the one block 102.

The seventeenth configuration example of FIG. 31 is a configuration example in which the phase difference detection pixels 131C and 131D for detecting the phase difference of the vertical direction are added to the R pixel 111 of the thirteenth configuration example of FIG. 27.

In this configuration example, two upper left and the lower right pixels 111 of four B pixels 111 of one B sub block 103 are the same phase difference detection pixels 131A or the same phase difference detection pixels 131B. The phase difference detection pixel 131 at the upper left and the phase difference detection pixel 131 at the lower right (one row below) are adjacent to each other on a diagonal line and are close to each other. Therefore, it is possible to detect the phase difference by block matching (line matching) with upper and lower phase difference columns. Averaging processing is performed by adding the pixel values or values after the phase difference detection, and thus it is possible to improve immunity to noise and improve accuracy.

In addition, in this configuration example, two upper left and the lower right pixels 111 of four R pixels 111 of one R sub block 103 are the same phase difference detection pixels 131C or the same phase difference detection pixels 131D. The phase difference detection pixel 131 at the upper left and the phase difference detection pixel 131 at the lower right (one row below) are adjacent to each other on a diagonal line and are close to each other. Therefore, it is possible to detect the phase difference by block matching (line matching) with left and right phase difference columns.

In this configuration example, regarding the B sub block 103, the phase difference detection pixel 131A for detecting the phase difference of the horizontal direction and the phase difference detection pixel 131B for detecting the phase difference of the horizontal direction of the same row that is paired with the phase difference detection pixel 131A are separated from each other by two when counting by the sub block 103. In addition, the phase difference detection pixel 131A for detecting the phase difference of the horizontal direction and the next phase difference detection pixel 131A for detecting the phase difference of the horizontal direction of the same phase in the same row are separated from each other by 4 when counting by the sub block 103 (2-4B).

In addition, regarding the R sub block 103, the phase difference detection pixel 131C for detecting the phase difference of the vertical direction and the phase difference detection pixel 131D for detecting the phase difference of the vertical direction of the same column that is paired with the phase difference detection pixel 131C are separated from each other by two when counting by the sub block 103. In addition, the phase difference detection pixel 131C for detecting the phase difference of the vertical direction and the next phase difference detection pixel 131C for detecting the phase difference of the vertical direction of the same phase in the same column are separated from each other by 4 when counting by the sub block 103 (2-4R).

In addition, in this configuration example, the pair of phase difference detection pixels 131A and 131B for detecting the phase difference of the horizontal direction is disposed in the B pixel 111, and the pair of phase difference detection pixels 131C and 131D for detecting the phase difference of the vertical direction is disposed in the R pixel 111. On the contrary, the pair of phase difference detection pixels 131C and 131D for detecting the phase difference of the vertical direction may be disposed in the B pixel 111, and the pair of phase difference detection pixels 131A and 131B for detecting the phase difference of the horizontal direction may be disposed in the R pixel 111.

18. Eighteenth Configuration Example (Phase Difference Detection Pixels of the Same Vertical Direction and the Same Horizontal Direction are Disposed in 2/4 Pixel, B Pixel, and R Pixel)

Next, the eighteenth configuration example of the imaging region 101 of the image sensor 41 will be described with reference to FIG. 32.

Figure 32:
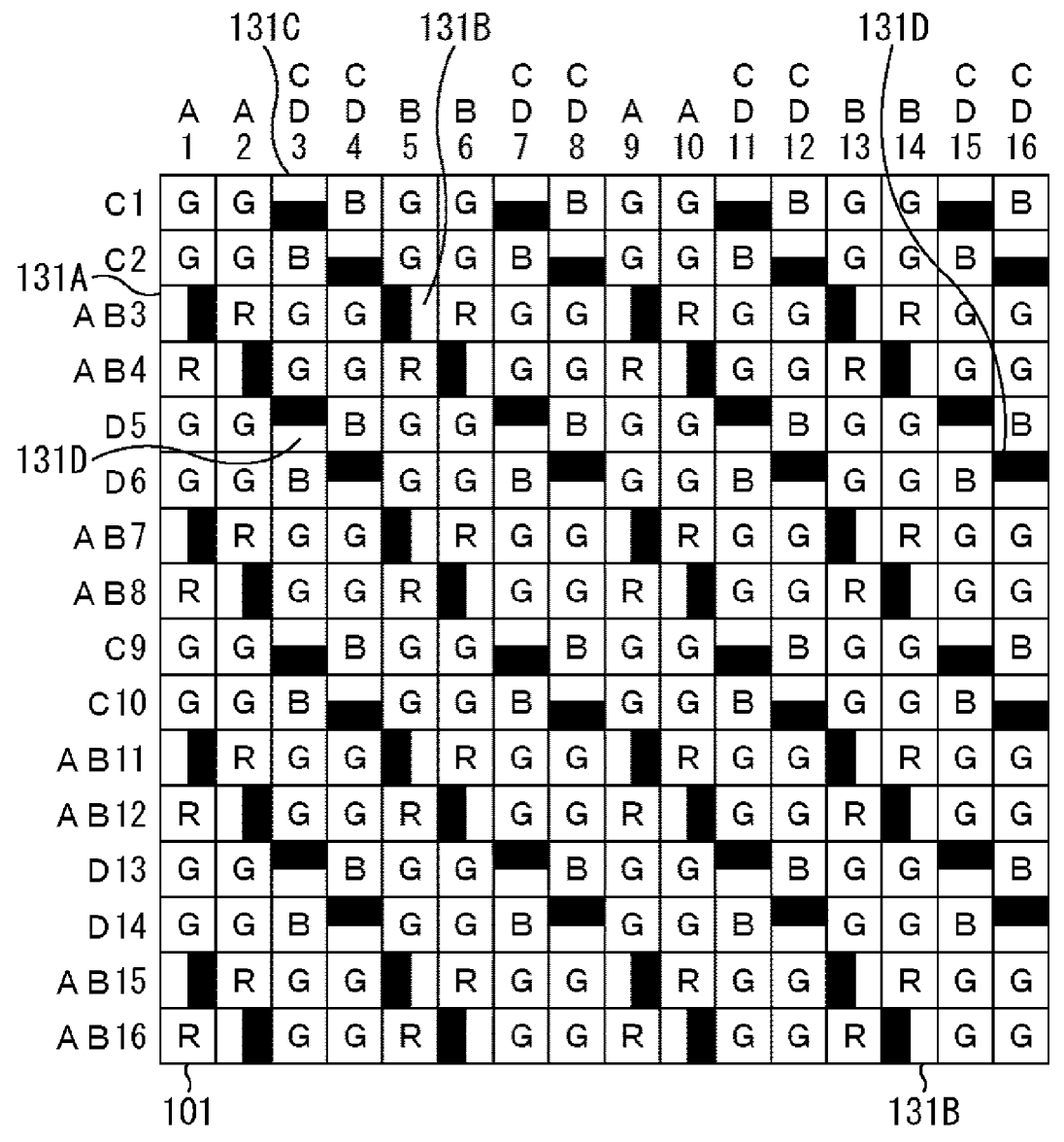

FIG. 32 is a diagram illustrating a planar configuration example of an embodiment of the image sensor to which the present technology is applied. In the eighteenth configuration example of FIG. 32, in both of the B sub block 103 and the R sub block 103, two pixels 111 of the upper left and the lower right of the 2×2 pixels 111 are set as the phase difference detection pixels 131.

In the R sub block 103, in the pixels 111 of the upper left of the first column, the lower right of the second column, the upper left of the ninth column, and the lower right of the tenth column, the phase difference detection pixel 131A configuring one of the pair of phase difference detection pixels 131A and 131B for detecting the phase difference of the horizontal direction is disposed. In the pixels 111 of the upper left of the fifth column, the lower right of the sixth column, the upper left of the thirteenth column, and the lower right of the fourteenth column, the phase difference detection pixel 131B configuring the other of the pair of phase difference detection pixels 131A and 131B for detecting the phase difference of the horizontal direction is disposed.

In the B sub block 103, in the pixels 111 of the upper left of the first row, the lower right of the second row, the upper left of the ninth row, and the lower right of the tenth row, the phase difference detection pixel 131C configuring one of the pair of phase difference detection pixels 131C and 131D for detecting the phase difference of the vertical direction is disposed. In the pixels 111 of the upper left of the fifth row, the lower right of the sixth row, the upper left of the thirteenth row, and the lower right of the fourteenth row, the phase difference detection pixel 131D configuring the pair of phase difference detection pixels 131C and 131D for detecting the phase difference of the vertical direction is disposed. In a case in which the phase difference detection pixels 131 are disposed, the number of the phase difference detection pixels 131 is two in the one sub block 103 and four in the one block 102.

In this configuration example, two upper left and the lower right pixels of four R pixels 111 of one R sub block 103 are the same phase difference detection pixels 131A or the same phase difference detection pixels 131B. The phase difference detection pixel 131 at the upper left and the phase difference detection pixel 131 at the lower right (one row below) are adjacent to each other on a diagonal line and are close to each other. Therefore, it is possible to detect the phase difference by block matching (line matching) with upper and lower phase difference columns. Averaging processing is performed by adding the pixel values or values after the phase difference detection, and thus it is possible to improve immunity to noise and improve accuracy.

In addition, in this configuration example, two upper left and the lower right pixels of four B pixels 111 of one B sub block 103 are the same phase difference detection pixels 131C or the same phase difference detection pixels 131D. The phase difference detection pixel 131 at the upper left and the phase difference detection pixel 131 at the lower right (one row below) are adjacent to each other on a diagonal line and are close to each other. Therefore, it is possible to detect the phase difference by block matching (line matching) with left and right phase difference columns.

In this configuration example, regarding the R sub block 103, the phase difference detection pixel 131A for detecting the phase difference of the horizontal direction and the phase difference detection pixel 131B for detecting the phase difference of the horizontal direction of the same row that is paired with the phase difference detection pixel 131A are separated from each other by two when counting by the sub block 103. In addition, the phase difference detection pixel 131A for detecting the phase difference of the horizontal direction and the next phase difference detection pixel 131A for detecting the phase difference of the horizontal direction of the same phase in the same row are separated from each other by 4 when counting by the sub block 103 (2-4R).

In addition, regarding the B sub block 103, the phase difference detection pixel 131C for detecting the phase difference of the vertical direction and the phase difference detection pixel 131D for detecting the phase difference of the vertical direction of the same column that is paired with the phase difference detection pixel 131C are separated from each other by two when counting by the sub block 103. In addition, the phase difference detection pixel 131C for detecting the phase difference of the vertical direction and the next phase difference detection pixel 131C for detecting the phase difference of the vertical direction of the same phase in the same column are separated from each other by 4 when counting by the sub block 103 (2-4B).

In addition, in this configuration example, the pair of phase difference detection pixels 131A and 131B for detecting the phase difference of the horizontal direction is disposed in the R pixel 111, and the pair of phase difference detection pixels 131C and 131D for detecting the phase difference of the vertical direction is disposed in the B pixel 111. On the contrary, the pair of phase difference detection pixels 131C and 131D for detecting the phase difference of the vertical direction may be disposed in the R pixel 111, and the pair of phase difference detection pixels 131A and 131B for detecting the phase difference of the horizontal direction may be disposed in the B pixel 111.

19. Nineteenth Configuration Example (Pair of Phase Difference Detection Pixels of Horizontal Direction and Vertical Direction are Disposed in 2/4 Pixel, B Pixel, and R Pixel)

Next, the nineteenth configuration example of the imaging region 101 of the image sensor 41 will be described with reference to FIG. 33.

Figure 33:
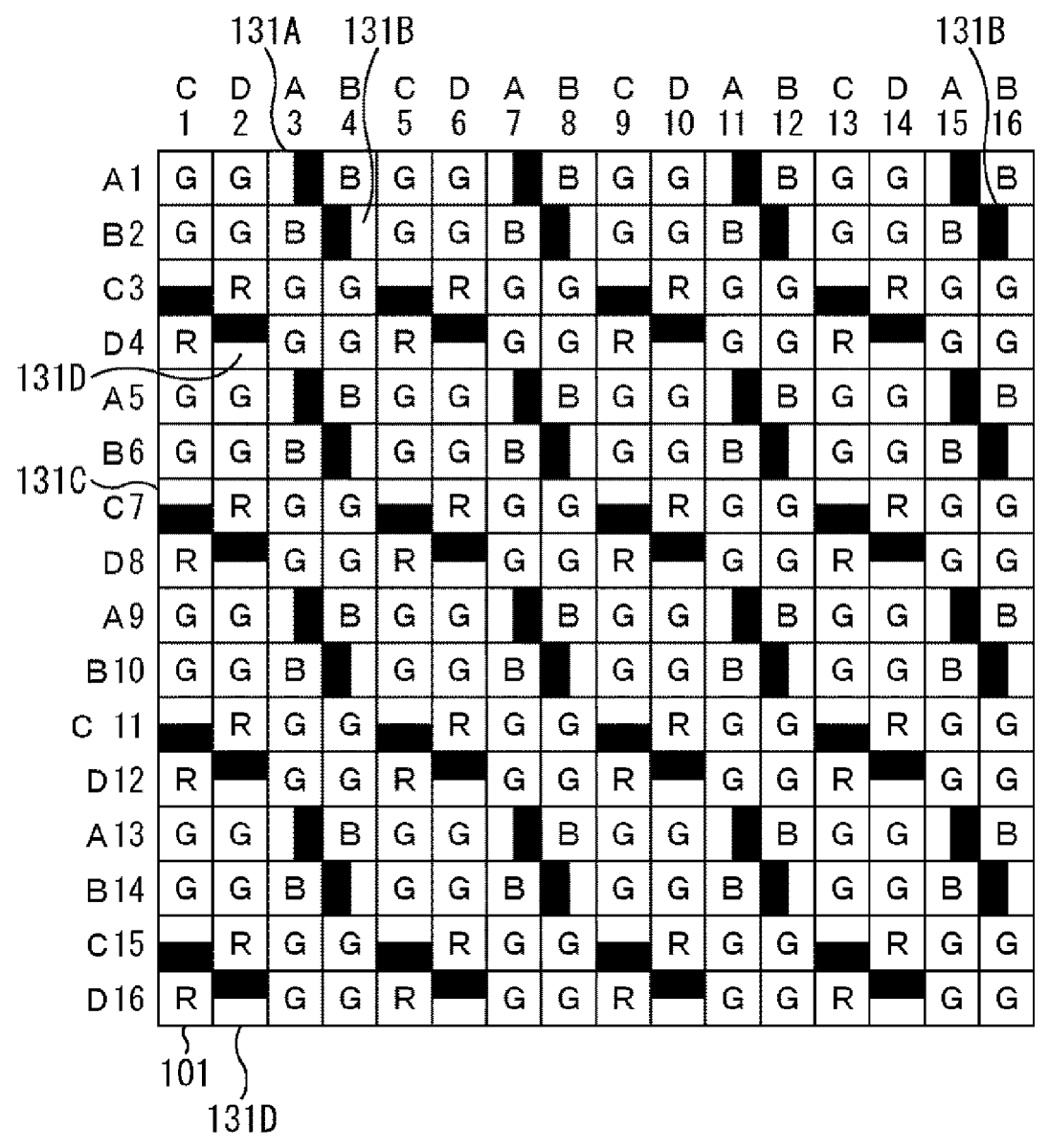

FIG. 33 is a diagram illustrating a planar configuration example of an embodiment of the image sensor to which the present technology is applied. In the nineteenth configuration example of FIG. 33, in both of the B sub block 103 and the R sub block 103, two pixels 111 of the upper left and the lower right of the 2×2 pixels 111 are set as the phase difference detection pixels 131.

In the configuration example of FIGS. 31 and 32, in the same sub block 103, the same phase difference detection pixel 131 for detecting the phase difference of the horizontal direction or the vertical direction is disposed. That is, in the B sub block 103, two phase difference detection pixels 131A or two phase difference detection pixels 131B are disposed, or two phase difference detection pixels 131C or two phase difference detection pixels 131D are disposed.

On the other hand, in the configuration example of FIG. 33, in the same sub block 103, the pair of phase difference detection pixels 131 for detecting the phase difference of the horizontal direction or the vertical direction are disposed. That is, the phase difference detection pixel 131A and the phase difference detection pixel 131B are disposed, or the phase difference detection pixel 131C and the phase difference detection pixel 131D are disposed.

In the B sub block 103, in the pixels 111 of the upper left of the first row, the fifth row, the ninth row, and the thirteenth row, the phase difference detection pixel 131A configuring one of the pair of phase difference detection pixels 131A and 131B for detecting the phase difference of the horizontal direction is disposed. In the pixels 111 of the lower right of the second row, the sixth row, the tenth row, and the fourteenth row, the phase difference detection pixel 131B configuring the other of the pair of phase difference detection pixels 131A and 131B for detecting the phase difference of the horizontal direction is disposed.

In the R sub block 103, in the pixels 111 of the upper left of the third row, the seventh row, the eleventh row, and the fifteenth row, the phase difference detection pixel 131C configuring one of the pair of phase difference detection pixels 131C and 131D for detecting the phase difference of the vertical direction is disposed. In the pixels 111 of the lower right of the fourth row, the eighth row, the twelfth row, and the sixteenth row, the phase difference detection pixel 131D configuring the other of the pair of phase difference detection pixels 131C and 131D for detecting the phase difference of the vertical direction is disposed. In a case in which the phase difference detection pixels 131 are disposed, the number of the phase difference detection pixels 131 is two in the one sub block 103 and four in the one block 102.

Regarding the B sub block 103, the phase difference detection pixel 131A for detecting the phase difference of the horizontal direction and the phase difference detection pixel 131B for detecting the phase difference of the horizontal direction that is shifted downward from the phase difference detection pixel 131A by one row and is paired with the phase difference detection pixel 131A are not separated from each other when counting by the sub block 103 (separated from each other by 0). In addition, the phase difference detection pixel 131A for detecting the phase difference of the horizontal direction and the next phase difference detection pixel 131A for detecting the phase difference of the horizontal direction of the same phase in the same row are separated from each other by 2 when counting by the sub block 103 (0-2B).

In addition, regarding the R sub block 103, the phase difference detection pixel 131C for detecting the phase difference of the vertical direction and the phase difference detection pixel 131D for detecting the phase difference of the vertical direction that is shifted rightward from the phase difference detection pixel 131C by one column and is paired with the phase difference detection pixel 131C are not separated from each other when counting by the sub block 103 (separated from each other by 0). In addition, the phase difference detection pixel 131C for detecting the phase difference of the vertical direction and the next phase difference detection pixel 131C for detecting the phase difference of the vertical direction of the same phase in the same column are separated from each other by 2 when counting by the sub block 103 (0-2R).

In addition, in this configuration example, the pair of phase difference detection pixels 131A and 131B for detecting the phase difference of the horizontal direction is disposed in the B pixel 111, and the pair of phase difference detection pixels 131C and 131D for detecting the phase difference of the vertical direction is disposed in the R pixel 111. On the contrary, the pair of phase difference detection pixels 131C and 131D for detecting the phase difference of the vertical direction may be disposed in the B pixel 111, and the pair of phase difference detection pixels 131A and 131B for detecting the phase difference of the horizontal direction may be disposed in the R pixel 111.

20. Twentieth Configuration Example (Pair of Phase Difference Detection Pixels of Upper Left Diagonal and Upper Right Diagonal are Disposed in 2/4 Pixel, B Pixel, and R Pixel)

Next, the twentieth configuration example of the imaging region 101 of the image sensor 41 will be described with reference to FIG. 34.

Figure 34:
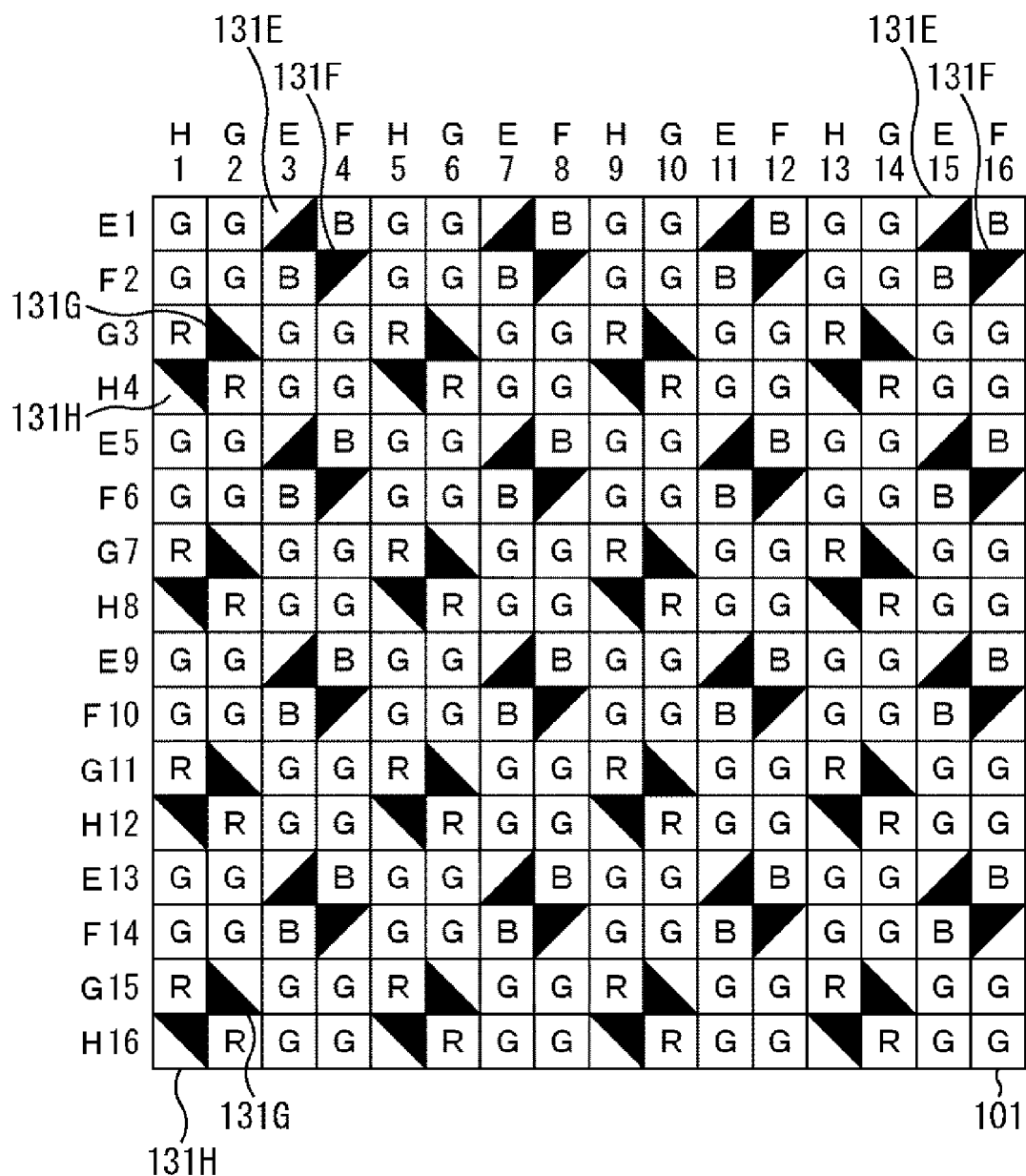
FIG. 34 is a diagram illustrating a planar configuration example of an embodiment of the image sensor to which the present technology is applied.

FIG. 34 is a diagram illustrating a planar configuration example of an embodiment of the image sensor to which the present technology is applied. In the configuration example so far, the phase difference detection pixels 131 are disposed in corresponding positions in the sub blocks 103 of all colors. However, in the sub block 103 of the same color, the phase difference detection pixels 131 may be disposed in different positions among the sub blocks 103 of different colors though the positions are corresponding positions. FIG. 34 shows a configuration example of this case.

In the twentieth configuration example of FIG. 34, the phase difference detection pixels 131 are disposed in the B sub block 103 and the R sub block 103. That is, in the B sub block 103, the pixels 111 of the upper left and the lower right among the 2×2 pixels 111 are set as the phase difference detection pixels 131. On the other hand, in the R sub block 103, the pixels 111 of the lower left and the upper right among the 2×2 pixels 111 are set as the phase difference detection pixels 131.

In the B sub block 103, in the pixels 111 of the upper left of the first row, the fifth row, the ninth row, and the thirteenth row, the phase difference detection pixel 131E configuring one of the pair of phase difference detection pixels 131E and 131F for detecting the upper left diagonal phase difference is disposed. In the pixels 111 of the lower right of the second row, the sixth row, the tenth row, and the fourteenth row, the phase difference detection pixel 131F configuring the other of the pair of phase difference detection pixels 131E and 131F for detecting the upper left diagonal phase difference is disposed.

In the R sub block 103, in the pixels 111 of the upper right of the third row, the seventh row, the eleventh row, and the fifteenth row, the phase difference detection pixel 131G configuring one of the pair of phase difference detection pixels 131G and 131H for detecting the upper right diagonal phase difference is disposed. In the pixels 111 of the lower left of the fourth row, the eighth row, the twelfth row, and the sixteenth row, the phase difference detection pixel 131H configuring the other of the pair of phase difference detection pixels 131G and 131H for detecting the upper right diagonal phase difference is disposed. In a case in which the phase difference detection pixels 131 are disposed, the number of the phase difference detection pixels 131 is two in the one sub block 103 and four in the one block 102.

In all the B sub blocks 103, the pixels 111 of the upper left and the lower right among the 2×2 pixels 111 are set as the phase difference detection pixels 131. On the other hand, in the R sub block 103, the pixels 111 of the upper right and the lower left set as the phase difference detection pixels 131.

In addition, regarding the B sub block 103, the phase difference detection pixel 131E for detecting the upper left diagonal phase difference and the phase difference detection pixel 131F for detecting the upper left diagonal phase difference that is shifted downward from the phase difference detection pixel 131E by one row and is paired with the phase difference detection pixel 131E are not separated from each other when counting by the sub block 103 (separated from each other by 0). In addition, the phase difference detection pixel 131E for detecting the upper left diagonal phase difference and the next phase difference detection pixel 131E for detecting the upper left diagonal phase difference of the same phase in the same row are separated from each other by 2 when counting by the sub block 103 (0-2B).

In addition, regarding the R sub block 103, the phase difference detection pixel 131G for detecting the upper right diagonal phase difference and the phase difference detection pixel 131H for detecting the upper right diagonal phase difference that is shifted leftward from the phase difference detection pixel 131G by one column and is paired with the phase difference detection pixel 131G are not separated from each other when counting by the sub block 103 (separated from each other by 0). In addition, the phase difference detection pixel 131G for detecting the upper right diagonal phase difference and the next phase difference detection pixel 131G for detecting the upper right diagonal phase difference of the same phase in the same column are separated from each other by 2 when counting by the sub block 103 (0-2R).

In addition, in this configuration example, the pair of phase difference detection pixels 131E and 131F for detecting the upper left diagonal phase difference is disposed in the B pixel 111, and the pair of phase difference detection pixels 131G and 131H for detecting the upper right diagonal phase difference is disposed in the R pixel 111. On the contrary, the pair of phase difference detection pixels 131G and 131H for detecting the upper right diagonal phase difference may be disposed in the B pixel 111, and the pair of phase difference detection pixels 131E and 131F for detecting the upper left diagonal phase difference may be disposed in the R pixel 111.

In addition, in the seventeenth to twentieth configuration examples of FIGS. 31 to 34, as in a case of the seventh to twelfth configuration examples of FIGS. 21 to 26, two types of phase difference detection pixels 131 may be disposed the two G sub blocks 103, respectively.

21. Twenty-First Configuration Example (Phase Difference Detection Pixels of Horizontal Direction are Disposed in 1/4 Pixel, B Pixel, G Pixel, and R Pixel)

Next, the twenty-first configuration example of the imaging region 101 of the image sensor 41 will be described with reference to FIG. 35.

FIG. 35 is a diagram illustrating a planar configuration example of an embodiment of the image sensor to which the present technology is applied. In the twenty-first configuration example of FIG. 35, in any of the B sub block 103, the R sub block 103, and the lower right G sub block 103 in one block 102, the pixel 111 of the upper left is set as the phase difference detection pixel 131 among the 2×2 pixels 111.

In the R sub block 103, in the pixels 111 of the upper left of the first column and the upper left pixel of the ninth column, the phase difference detection pixel 131A configuring one of the pair of phase difference detection pixels 131A and 131B for detecting the phase difference of the horizontal direction is disposed. In the pixels 111 of the upper left of the fifth column and the upper left pixel of the thirteenth column, the phase difference detection pixel 131B configuring the other of the pair of the phase difference detection pixels 131A and 131B for detecting the phase difference of the horizontal direction is disposed.

In the B sub block 103, in the pixels 111 of the upper left of the third column and the upper left pixel of the eleventh column, the phase difference detection pixel 131A configuring one of the pair of phase difference detection pixels 131A and 131B for detecting the phase difference of the horizontal direction is disposed. In the pixels 111 of the upper left of the seventh column and the upper left pixel of the fifteenth column, the phase difference detection pixel 131B configuring the other of the pair of the phase difference detection pixels 131A and 131B for detecting the phase difference of the horizontal direction is disposed.

In the lower right G sub block 103, in the pixels 111 of the upper left of the third column and the upper left of the eleventh column, the phase difference detection pixel 131A configuring one of the pair of phase difference detection pixels 131A and 131B for detecting the phase difference of the horizontal direction is disposed. In the pixels 111 of the upper left of the seventh column and the upper left of the fifteenth column, the phase difference detection pixel 131B configuring the other of the pair of phase difference detection pixels 131A and 131B for detecting the phase difference of the horizontal direction is disposed. In a case in which the phase difference detection pixels 131 are disposed, the number of the phase difference detection pixels 131 is one in the one sub block 103 and three in the one block 102.

Figure 36:
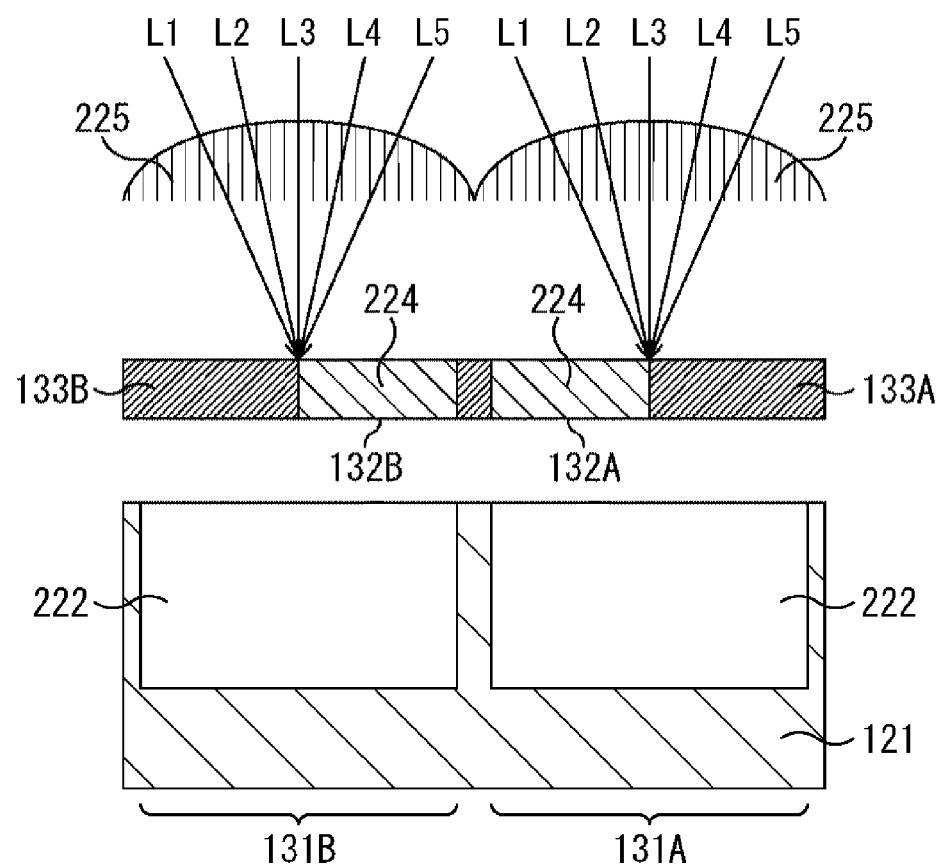
FIG. 36 is a cross-sectional view illustrating a configuration example of the phase difference detection pixel according to an embodiment of the image sensor to which the present technology is applied.

In the configuration example of FIG. 35, the light transmitting portions 132A and 132B and the light shielding portions 133A and 133 B are configured as shown in FIG. 36. FIG. 36 is a cross-sectional view illustrating a configuration example of the phase difference detection pixel of an embodiment of the image sensor to which the present technology is applied. For the sake of convenience, FIG. 36 shows cross-sectional configurations of two phase difference detection pixels 131A and 131B arranged side by side. The configuration of the phase difference detection pixel 131 in FIG. 36 is basically similar to the phase difference detection pixel 131 shown in FIG. 9, but the light transmitting portions 132A and 132B formed by the opening of FIG. 9 is formed by a color filter 224 instead of the opening.

A color of the color filter 224 corresponds to a color of the sub block 103. That is, in the phase difference detection pixel 131 of the R sub block 103, the color of the color filter 224 is red (R). Similarly, in the phase difference detection pixel 131 of the G sub block 103, the color of the color filter 224 is green (G), and in the phase difference detection pixel 131 of the B sub block 103, the color of the color filter 224 is blue (B). The rest of the configuration is the similar to a case shown in FIG. 9, so the descriptions thereof will be omitted.

In addition, the configuration of the imaging pixel 114 is similar to a case shown in FIG. 8.

In this example, for example, in the phase difference detection pixel 131A, some of the light condensed by the on-chip lens 225 passes through the light transmitting portion 132A and is incident on the photodiode 222. Since the color filter 224 is disposed in the light transmitting portion 132A, only light of a corresponding color component is incident on the photodiode 222. However, some of the light condensed by the on-chip lens 225 is shielded by the light shielding portion 133A disposed on the right side of the light transmitting portion 132A in FIG. 36 and does not enter the photodiode 222.

Similarly, also in the phase difference detection pixel 131B, some of the light condensed by the on-chip lens 225 passes through the light transmitting portion 132B and is incident on the photodiode 222. At this time, only a component of a corresponding color is extracted by the color filter 224 and is incident on the photodiode 222. However, some of the light condensed by the on-chip lens 225 is shielded by the light shielding portion 133B disposed on the left side of the light transmitting portion 132B in FIG. 36 and does not enter the photodiode 222.

In the configuration example of FIG. 35, the phase difference detection processing is separately performed for each color of R, G, and B, and the defocus amount is calculated. Therefore, it possible to correct light source dependency of the subject. That is, focus control is able to be performed with color as a main element.

Note that, in the example of FIG. 36, a color filter 224 is provided in the opening of the light shielding portion 133. That is, the color filter 224 is disposed in the same layer as the light shielding portion 133. However, the color filter 224 may be provided in an upper layer than the light shielding portion 133 (a position closer to the on-chip lens 225 than the light shielding portion 133) or in a lower layer (a position closer to the photodiode 222 than the light shielding portion 133). In this case, also in the imaging pixel 114, the position of the color filter 224 is able to be the same as the phase difference detection pixel 131.

In the twenty-first configuration example of FIG. 35, the phase difference detection pixel 131 having the color filter 224 is used. Therefore, an imaging pixel signal is also obtained from the phase difference detection pixel 131. However, in other configuration examples (the first to twentieth configuration examples described above and the twenty-second configuration example that will be described later), both of the phase difference detection pixel 131 having the color filter 224 and the phase difference detection pixel 131 that does not have the color filter 224 are able to be used.

In the twenty-first configuration example of FIG. 35, the phase difference detection pixels 131 for detecting the phase difference of the horizontal direction are disposed. However, it is also possible to dispose the phase difference detection pixel 131 for detecting the phase difference of the vertical direction, the upper left diagonal phase difference, or the upper right diagonal phase difference.

22. Twenty-Second Configuration Example (Phase Difference Detection Pixels of Horizontal Direction are Disposed in 1/4 Pixel, B Pixel, Two G Pixels, and R Pixel)

Next, the twenty-second configuration example of the imaging region 101 of the image sensor 41 will be described with reference to FIG. 37.

Figure 37:
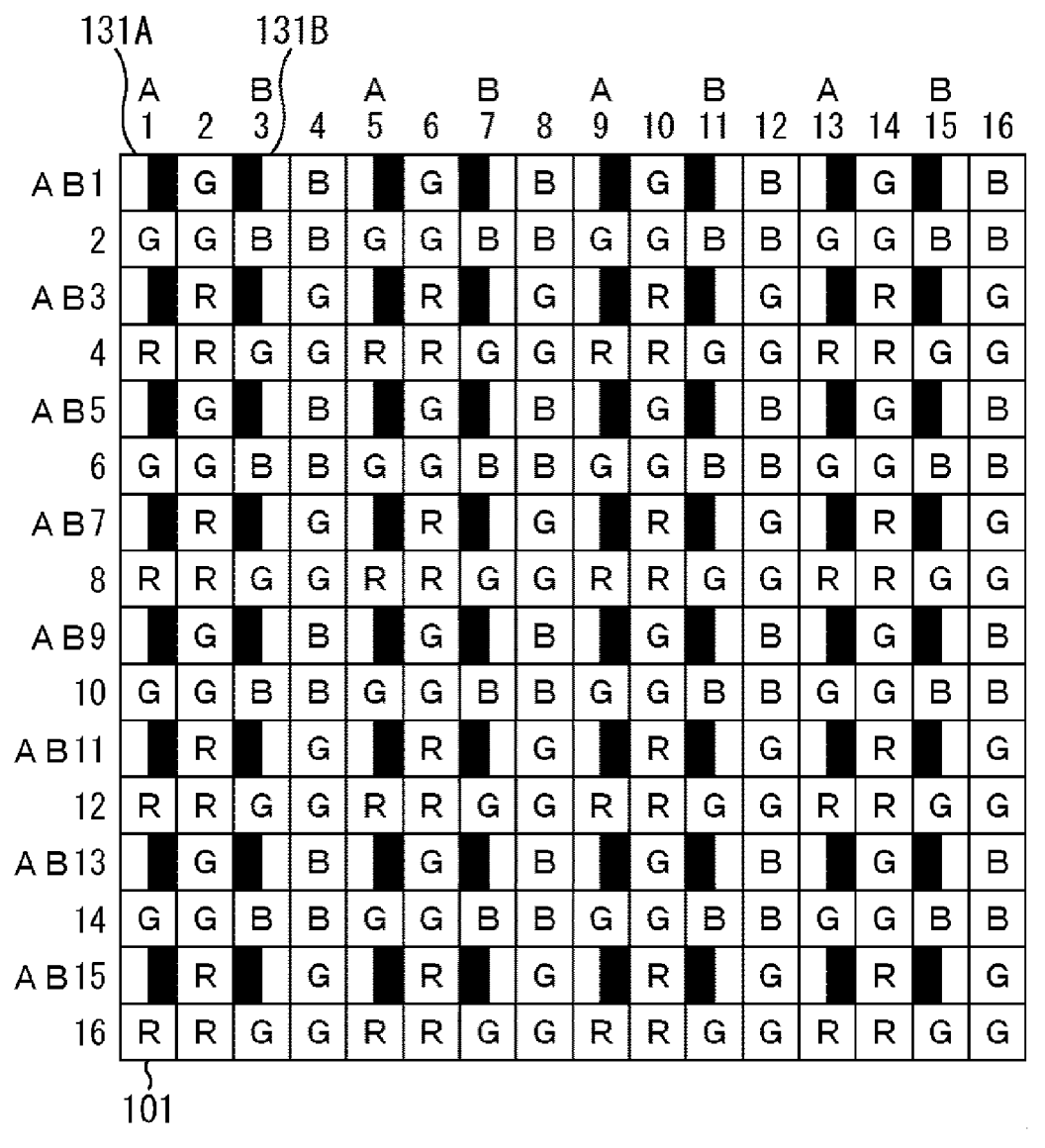

FIG. 37 is a diagram illustrating a planar configuration example of an embodiment of the image sensor to which the present technology is applied. In the twenty-second configuration example of FIG. 37, in all of the B sub block 103, the R sub block 103 and the two G sub blocks 103, the pixel 111 of the upper left among the 2×2 pixels 111 is set as the phase difference detection pixel 131.

In the first column, the fifth column, the ninth column, and the thirteenth column, all of the G sub block 103 and the R sub block 103 are similarly configured. That is, in the pixel 111 of the upper left, the phase difference detection pixel 131A configuring one of the pair of phase difference detection pixels 131A and 131B for detecting the phase difference of the horizontal direction is disposed. In the third column, the seventh column, the eleventh column, and the fifteenth column, all of the B sub block 103 and the G sub block 103 are similarly configured. That is, in the pixel 111 of the upper left, the phase difference detection pixel 131B configuring the other of the pair of phase difference detection pixels 131A and 131B for detecting the phase difference of the horizontal direction is disposed. In a case in which the phase difference detection pixels 131 are disposed, the number of the phase difference detection pixels 131 is one in the one sub block 103 and four in the one block 102.

In the twenty-second configuration example of FIG. 37, the phase difference detection pixels 131A and 131B for detecting more phase differences of the horizontal direction in one row. As a result, the phase difference detection accuracy is improved.

In the twenty-second configuration example of FIG. 37, the phase difference detection pixels 131 for detecting the phase difference of the horizontal direction are disposed. However, it is also possible to dispose the phase difference detection pixel 131 for detecting the phase difference of the vertical direction, the upper left diagonal phase difference, or the upper right diagonal phase difference.

23. Disposition of Phase Difference Detection Pixel

Next, the disposition of the phase difference detection pixel 131 will be described.

Figure 38:
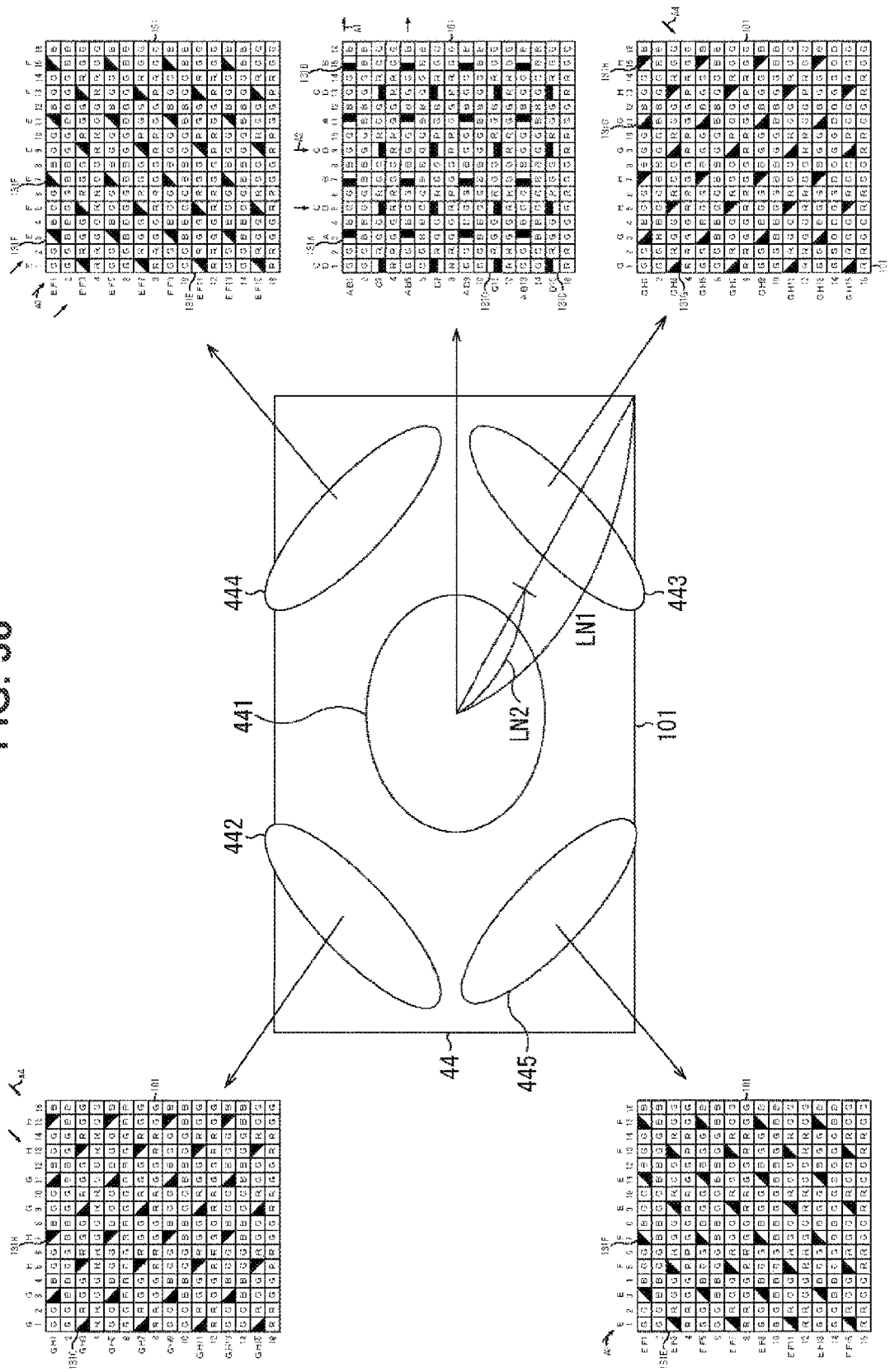
FIG. 38 is a diagram illustrating a disposition example of the phase difference detection pixel of an embodiment of the image sensor to which the present technology is applied.

FIG. 38 is a diagram illustrating a disposition example of the phase difference detection pixel of an embodiment of the image sensor to which the present technology is applied. In this example, the imaging region 101 of the pixel array unit 44 is divided into a substantially central region 441, an upper left region 442 of the substantially central region 441, a lower right region 443 on a diagonal line of the upper left region 442, an upper right region 444, and a lower left region 445 on a diagonal line of the upper right region 444. Note that although these regions 441 to 445 as the focus areas are elliptical, these regions 441 to 445 may be circular, rectangular, or other shapes.

A boundary between the central region 441 and the lower right region 443 is able to be set as follows. That is, when a distance LN 1 from the center of the imaging region 101 (the region 441) to a lower right corner of the imaging region 101 is set as 1, a distance LN 2 from the center of the imaging region 101 (the region 441) to the boundary is able to be set as 0.4 to 0.6. The same applies to the boundaries between the other regions 442, 444, and 445 and the central region 441.

In the central area 441, the phase difference detection pixel 131 of the configuration example shown in the center on the right side of FIG. 38 is arranged. This configuration example is the same as the configuration example of FIG. 5.

That is, in the central region 441, the phase difference detection pixel 131 for detecting the phase difference of a direction of a straight line indicated by an arrow A1, that is, the horizontal direction (the horizontal direction) is disposed in the first row, the fifth row, the ninth row, and the thirteenth row. In addition, the phase difference detection pixel 131 for detecting the phase difference in a direction of a straight line indicated by an arrow A2, that is, the vertical direction (the vertical direction) is disposed in the first column, the fifth column, the ninth column, and the thirteenth column.

In the upper left region 442, the phase difference detection pixel 131 of the configuration example shown in the upper left of FIG. 38 is disposed. In the lower right region 443, the phase difference detection pixel 131 of the configuration example shown in the lower right of FIG. 38 is disposed. The two configuration examples are the same. In this configuration example, the phase difference detection pixel 131 for detecting a direction of a straight line indicated by an arrow A4, that is, the upper right diagonal phase difference is disposed.

Specifically, configuration examples of the upper left region 442 and the lower right region 443 are as follows. In the first column and the ninth column of the R sub block 103, the phase difference detection pixel 131G that is one of the pair of phase difference detection pixels 131G and 131H for detecting the upper right diagonal phase difference is disposed. In the fifth column and the thirteenth column, the phase difference detection pixel 131H that is the other of the pair of phase difference detection pixels 131G and 131H for detecting the upper right diagonal phase difference is disposed.

In the third column and the eleventh column of the B sub block 103, the phase difference detection pixel 131G that is one of the pair of phase difference detection pixels 131G and 131H for detecting the upper right diagonal phase difference is disposed. In the seventh column and the fifteenth column, the phase difference detection pixel 131H that is the other of the pair of phase difference detection pixels 131G and 131H for detecting the upper right diagonal phase difference is disposed.

In the upper right region 444, the phase difference detection pixel 131 of the configuration example shown in the upper right of FIG. 38 is disposed. In the lower left region 445, the phase difference detection pixel 131 of the configuration example shown in the lower left of FIG. 38 is disposed. The two configuration examples are the same. In this configuration example, the phase difference detection pixel 131 for detecting a direction of a straight line indicated by an arrow A3, that is, the upper left diagonal phase difference is disposed.

In other words, in the configuration example of the upper right region 444 and the lower left region 445, in the first column and the ninth column of the R sub block 103, the phase difference detection pixel 131E that is one of the pair of phase difference detection pixels 131E and 131F for detecting the upper left diagonal phase difference is disposed. In the fifth column and the thirteenth column, the phase difference detection pixel 131F that is the other of the pair of phase difference detection pixels 131E and 131F for detecting the upper left diagonal phase difference is disposed.

In the third column and the eleventh column of the B sub block 103, the phase difference detection pixel 131E that is one of the pair of phase difference detection pixels 131E and 131F for detecting the upper left diagonal phase difference is disposed. In the seventh column and the fifteenth column, the phase difference detection pixel 131F that is the other of the pair of phase difference detection pixels 131E and 131F for detecting the upper left diagonal phase difference is disposed.

It is possible to detect the phase difference of the horizontal direction and the vertical direction of the image in the central region 441 by disposing the phase difference detection pixel 131 as described above. In addition, it is possible to detect the upper right diagonal phase difference by the upper left region 442 and the lower right region 443 and it is possible to detect the upper left diagonal phase difference by the upper right region 444 and the lower left region 445. Although the image may be affected by concentric astigmatism, the effect on the detection of the phase difference is able to be reduced.

In the configuration example described above, the number of the phase difference detection pixels 131 disposed in the one sub block 103 is one or two. In addition, the number of the phase difference detection pixels 131 disposed in the one block 102 is two, three, or four. Although it is possible to increase the number of the phase difference detection pixels 131, the correction for the captured image becomes complicated. In addition, although it is possible to reduce the number of the phase difference detection pixels 131, the accuracy of the phase difference detection decreases.

As described above, according to the present technology, the phase difference detection pixel 131 is disposed in the pixel 111 of the corresponding position in the sub block 103, further the pixel 111 of the corresponding position in the sub block 103 of the corresponding position in the block 102. That is, in a case in which the phase difference detection pixel 131 is disposed, the phase difference detection pixel 131 is disposed in the sub block 103 at the corresponding position of the block 102 and in the pixel 111 at the corresponding position of the sub block 103. Therefore, it is also possible to regularly perform the correction processing on the captured image at the time of the focus control, and it is possible to suppress deterioration of the quality of the captured image by the phase difference detection pixel 131. Note that here, the position means a relative position.

Since the sub block 103 includes four pixels 111 and one or two of the four pixels 111 are set as the phase difference detection pixels 131, the phase difference detection pixels 131 is able to be disposed at a high density, and the accuracy of the phase difference detection is able to be improved. In addition, the remaining pixels 111 in the sub block 103 are able to be used as the imaging pixels 114 as they are and the imaging signal in the sub block 103 is also able to be acquired. Therefore, it is possible to suppress the deterioration of the quality of the captured image.

24. Modification Example

Figure 39:
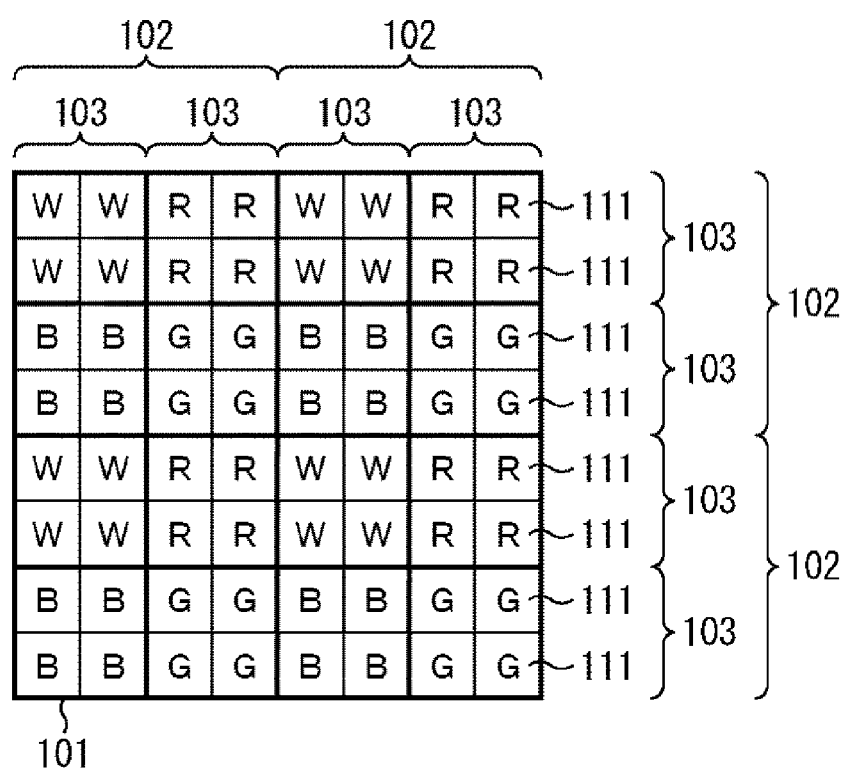
FIG. 39 is a diagram illustrating a planar configuration example of an embodiment of the image sensor to which the present technology is applied.

Next, the modification example of the sub block 103 will be described. FIG. 39 is a diagram illustrating a planar configuration example of an embodiment of the image sensor to which the present technology is applied. In the example of FIG. 3, the block 102 includes the one R sub block 103, the two G sub blocks 103, and the one B sub block 103. On the other hand, in the example of FIG. 39, the block 102 includes one R sub block 103, one G sub block 103, one B sub block 103, and one W (white) sub block 103. That is, the upper left one of the two G sub blocks 103 in the example of FIG. 3 is substituted by the W sub block 103.

Also in this case, the W sub block 103 includes 2×2 W pixels 111. The W sub block 103 is the same as the R sub block 103, the G sub block 103, and the B sub block 103. In addition, a predetermined pixel 111 among the 2×2 W pixels 111 similar to the R sub block 103, the G sub block 103, or the B sub block 103 is substituted by the phase difference detection pixels 131 as occasion demands.

In addition, the W sub block 103 may be a sub-block 103 for sensing infrared rays. In this case, the optical filter 312 in FIG. 11 is configured to not function as an IR cut filter (to transmit infrared rays).

Since the W sub block 103 or the sub block 103 that senses the infrared rays are special, it is not necessary to sense white color or infrared rays in many cases. Therefore, even though the phase difference detection pixel 131 is disposed in such as sub block 103, there is little risk that the quality of the captured image is degraded. Of course, on the contrary, in a case in which the phase difference detection pixel 131 is disposed in the R sub block 103, the G sub block 103, or the B sub block 103 other than such a sub block 103, it is possible to realize a function of sensing white or infrared rays.

In addition, the color of the color filter 224 is not limited to R, G, and B, and may be another color. For example, the present technology is also able to be applied to a case in which the block includes yellow, green, cyan, and magenta.

In addition, instead of the phase difference detection pixel 131, a polarization filter for sensing polarized light in a horizontal direction, a vertical direction, or a diagonal direction is able to be disposed.

In the above description, the sub block 103 includes the 2×2 pixels 111, but the present technology is also able to be applied to a case in which the sub block 103 includes 3×3 pixels or 4×4 pixels 111.

In addition, in the above description, regarding the phase difference detection pixels 131, all the blocks 102 are configured in the same manner. That is, the phase difference detection pixels 131 are disposed at the same position of the pixels 111 in all the blocks 102. However, it is also possible to provide a block 102 in which the phase difference detection pixels 131 are not disposed at appropriate intervals.

For example, in the first configuration example of FIG. 5, the phase difference detection pixel 131A is disposed in the third column, the phase difference detection pixel 131B is disposed in the seventh column, the phase difference detection pixel 131A is disposed in the eleventh column, and the phase difference detection pixel 131B is disposed in the fifteenth column. However, the phase difference detection pixel 131 is not disposed in the seventh column and the fifteenth column (hereinafter similar), and the phase difference detection pixel 131 may be disposed only in the third column and the eleventh column (hereinafter similar). In this case, the phase difference detection pixel 131B is disposed in the eleventh column. That is, an interval at which the phase difference detection pixels 131 are disposed is one sub block 103 (every two sub blocks 103). This is also applied to the column direction. In addition, this is also applied to other configuration examples.

However, commonality of the positions at which the phase difference detection pixels 131 are disposed may be set for each color. For example, the phase difference detection pixel 131 is disposed in the pixel 111 of the upper left in the R sub-block 103, but the phase difference detection pixel 131 may be disposed in the pixel 111 of the lower right in the B sub block 103, and the phase difference detection pixel 131 may be disposed in the pixel 111 of the upper right in the G sub block 103.

In addition, the number of the phase difference detection pixels 131 disposed in the one sub block 103 may also be set for each color. For example, two phase difference detection pixels 131 may be disposed in the B sub block 103, one phase difference detection pixel 131 may be disposed in the R sub block 103, and two phase difference detection pixels 131 may be disposed in the G sub block 103. At this time, as far as the number of phase difference detection pixels 131 is counted, the G sub block 103 of the upper left and the G sub block 103 of the lower right are able to be determined as different sub blocks 103.

As the number of the phase difference detection pixels 131 increases, it is possible to more accurately detect more kinds of phase differences. Increasing the number is suitable for, for example, controlling the traveling of the vehicle. In addition, in a case in which the number of the phase difference detection pixels 131 increases, since discontinuous points are reduced, the influence on the imaging pixel 114 is regularized and the correction processing becomes also easy. In addition, it is possible to acquire imaging pixel signal from the sub block 103 and the deterioration of the quality of the captured image is suppressed even though the sub block 103 includes a plurality of pixels 111 and the phase difference detection pixel 131 is disposed in the sub block 103.

25. Application Examples

The technology according to an embodiment of the present disclosure is applicable to a variety of products. For example, the technology according to an embodiment of the present disclosure may be implemented as devices mounted on any type of vehicles such as automobiles, electric vehicles, hybrid electric vehicles, and motorcycles.

Figure 40:
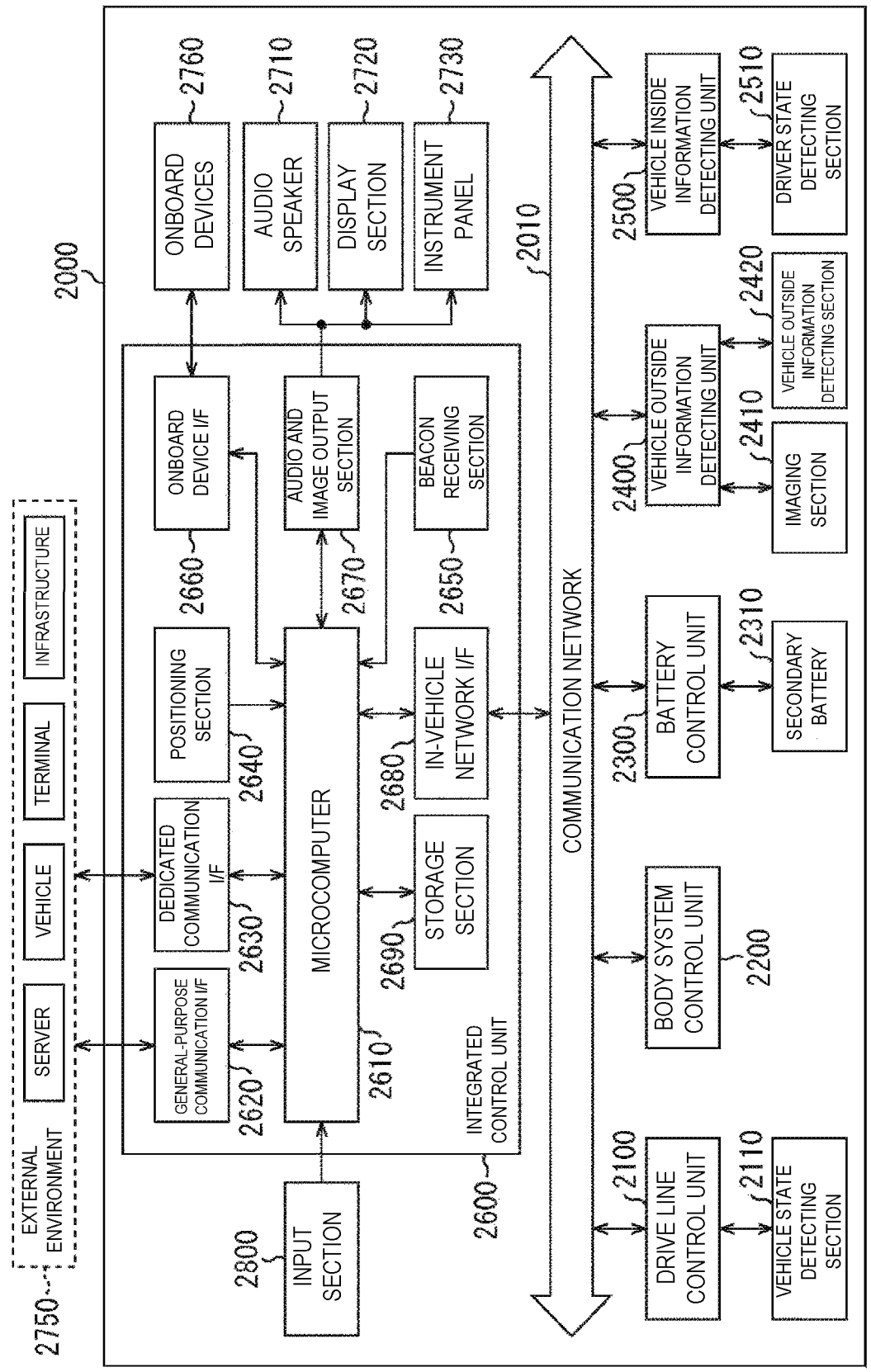
FIG. 40 is a block diagram illustrating an example of a schematic configuration of a vehicle control system.

FIG. 40 is a block diagram illustrating a schematic configuration example of a vehicle control system 2000 to which the technology according to an embodiment of the present disclosure can be applied. The vehicle control system 2000 includes electronic control units connected via a communication network 2010. In the example illustrated in FIG. 40, the vehicle control system 2000 includes a drive line control unit 2100, a body system control unit 2200, a battery control unit 2300, a vehicle outside information detecting device 2400, a vehicle inside information detecting device 2500, and an integrated control unit 2600. The communication network 2010, which connects these control units, may be an in-vehicle communication network such as a controller area network (CAN), a local interconnect network (LIN), a local area network (LAN), or FlexRay (registered trademark) that is compliant with any standard.

Each control unit includes a microcomputer that performs operation processing in accordance with a variety of programs, a storage section that stores the programs, parameters used for the variety of operations, or the like executed by the microcomputer, and a driving circuit that drives devices subjected to various types of control. Each control unit includes a network I/F used to communicate with the other control units via the communication network 2010, and a communication I/F used to communicate with devices, sensors, or the like outside and inside the vehicle through wired communication or wireless communication. FIG. 40 illustrates a microcomputer 2610, a general-purpose communication I/F 2620, a dedicated communication I/F 2630, a positioning section 2640, a beacon receiving section 2650, an onboard device I/F 2660, an audio and image output section 2670, an in-vehicle network I/F 2680, and a storage section 2690 as the functional configuration of the integrated control unit 2600. Each of the other control units similarly includes a microcomputer, a communication I/F, a storage section, and the like.

The drive line control unit 2100 controls the operation of devices related to the drive line of the vehicle in accordance with a variety of programs. For example, the drive line control unit 2100 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like. The drive line control unit 2100 may have the function of a control device for an antilock brake system (ABS) or an electronic stability control (ESC).

The drive line control unit 2100 is connected to a vehicle state detecting section 2110. The vehicle state detecting section 2110 includes, for example, at least one of sensors such as a gyro sensor that detects the angular velocity of the axial rotating motion of the vehicle body, an acceleration sensor that detects the acceleration of the vehicle, or a sensor that detects the operation amount of the accelerator pedal, the operation amount of the brake pedal, the steering wheel angle of the steering wheel, the engine speed, the wheel rotation speed, or the like. The drive line control unit 2100 uses a signal input from the vehicle state detecting section 2110 to perform operation processing, and controls the internal combustion engine, the driving motors, the electric power steering device, the braking device, or the like.

The body system control unit 2200 controls the operations of a variety of devices attached to the vehicle body in accordance with a variety of programs. For example, the body system control unit 2200 functions as a control device for a keyless entry system, a smart key system, a power window device, or a variety of lights such as a headlight, a backup light, a brake light, a blinker, or a fog lamp. In this case, the body system control unit 2200 can receive radio waves transmitted from a portable device that serves instead of the key or signals of a variety of switches. The body system control unit 2200 receives these radio waves or signals, and controls the vehicle door lock device, the power window device, the lights, or the like.

The battery control unit 2300 controls a secondary battery 2310 in accordance with a variety of programs. The secondary battery 2310 serves as a power supply source of a driving motor. For example, the battery control unit 2300 receives information such as the battery temperature, the battery output voltage, or the remaining battery capacity from a battery device including the secondary battery 2310. The battery control unit 2300 uses these signals to perform operation processing, and performs temperature adjusting control on the secondary battery 2310 or controls a cooling device or the like included in the battery device.

The vehicle outside information detecting device 2400 detects information of the outside of the vehicle including the vehicle control system 2000. For example, the vehicle outside information detecting device 2400 is connected to at least one of an imaging section 2410 or a vehicle outside information detecting section 2420. The imaging section 2410 includes at least one of a time of flight (ToF) camera, a stereo camera, a monocular camera, an infrared camera, or other cameras. The vehicle outside information detecting section 2420 includes, for example, an environment sensor that detects the current weather, and a surrounding information detecting sensor that detects another vehicle, an obstacle, a pedestrian, or the like around the vehicle including the vehicle control system 2000.

The environment sensor may be, for example, at least one of a raindrop sensor that detects rainy weather, a fog sensor that detects a fog, a sunshine sensor that detects the degree of sunshine, or a snow sensor that detects a snowfall. The surrounding information detecting sensor may be at least one of an ultrasonic sensor, a radar device, or a light detection and ranging/laser imaging detection and ranging (LIDAR) device. These imaging section 2410 and vehicle outside information detecting section 2420 may be installed as independent sensors or devices, or as a device into which sensors and devices are integrated.

Figure 41:
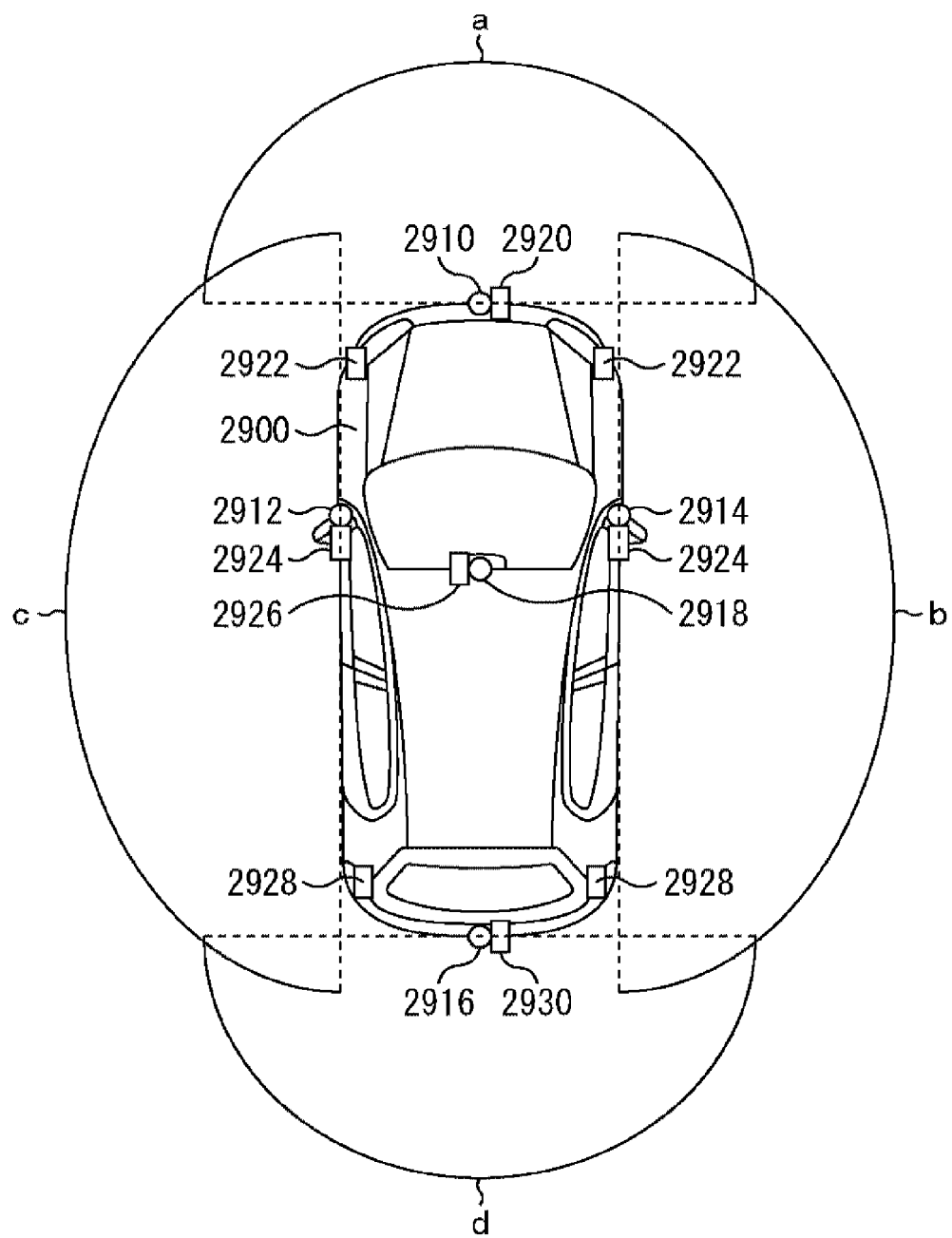
FIG. 41 is an explanatory diagram illustrating an example of installation positions of a vehicle exterior information detection unit and an imaging unit.

FIG. 41 illustrates an example of installation positions of the imaging section 2410 and the vehicle outside information detecting section 2420. Imaging sections 2910, 2912, 2914, 2916, and 2918 are positioned, for example, at least one of the front nose, a side mirror, the rear bumper, the back door, or the upper part of the windshield in the vehicle compartment of a vehicle 2900. The imaging section 2910 attached to the front nose and the imaging section 2918 attached to the upper part of the windshield in the vehicle compartment chiefly acquire images of the area ahead of the vehicle 2900. The imaging sections 2912 and 2914 attached to the side mirrors chiefly acquire images of the areas on the sides of the vehicle 2900. The imaging section 2916 attached to the rear bumper or the back door chiefly acquires images of the area behind the vehicle 2900. The imaging section 2918 attached to the upper part of the windshield in the vehicle compartment is used chiefly to detect a preceding vehicle, a pedestrian, an obstacle, a traffic light, a traffic sign, a lane, or the like.

Additionally, FIG. 41 illustrates an example of the respective imaging ranges of the imaging sections 2910, 2912, 2914, and 2916. An imaging range a represents the imaging range of the imaging section 2910 attached to the front nose. Imaging ranges b and c respectively represent the imaging ranges of the imaging sections 2912 and 2914 attached to the side mirrors. An imaging range d represents the imaging range of the imaging section 2916 attached to the rear bumper or the back door. For example, overlaying image data captured by the imaging sections 2910, 2912, 2914, and 2916 offers an overhead image that looks down on the vehicle 2900.

Vehicle outside information detecting sections 2920, 2922, 2924, 2926, 2928, and 2930 attached to the front, the rear, the sides, the corners, and the upper part of the windshield in the vehicle compartment of the vehicle 2900 may be, for example, ultrasonic sensors or radar devices. The vehicle outside information detecting sections 2920, 2926, and 2930 attached to the front nose, the rear bumper, the back door, and the upper part of the windshield in the vehicle compartment of the vehicle 2900 may be, for example, LIDAR devices. These vehicle outside information detecting sections 2920 to 2930 are used chiefly to detect a preceding vehicle, a pedestrian, an obstacle, or the like.

The description will continue with reference to FIG. 40 again. The vehicle outside information detecting device 2400 causes the imaging section 2410 to capture images of the outside of the vehicle, and receives the captured image data. Further, the vehicle outside information detecting device 2400 receives detection information from the connected vehicle outside information detecting section 2420. In a case where the vehicle outside information detecting section 2420 is an ultrasonic sensor, a radar device, or a LIDAR device, the vehicle outside information detecting device 2400 causes ultrasound, radio waves, or the like to be transmitted, and receives the information of the received reflected waves. The vehicle outside information detecting device 2400 may perform a process of detecting an object such as a person, a car, an obstacle, a traffic sign, or a letter on a road, or a process of detecting the distance on the basis of the received information. The vehicle outside information detecting device 2400 may perform an environment recognition process of recognizing a rainfall, a fog, a road condition, or the like on the basis of the received information. The vehicle outside information detecting device 2400 may compute the distance to an object outside the vehicle on the basis of the received information.

Further, the vehicle outside information detecting device 2400 may perform an image recognition process of recognizing a person, a car, an obstacle, a traffic sign, a letter on a road, or the like, or a process of detecting the distance on the basis of the received image data. The vehicle outside information detecting device 2400 may perform a distortion correcting process, a positioning process, or the like on the received image data, and combine image data captured by a different imaging section 2410 to generate an overhead view or a panoramic image. The vehicle outside information detecting device 2400 may use the image data captured by the other imaging section 2410 to perform a viewpoint converting process.

The vehicle inside information detecting device 2500 detects information of the inside of the vehicle. The vehicle inside information detecting device 2500 is connected, for example, to a driver state detecting section 2510 that detects the state of the driver. The driver state detecting section 2510 may include a camera that images the driver, a biological sensor that detects biological information of the driver, a microphone that picks up a sound in the vehicle compartment, or the like. The biological sensor is attached, for example, to a seating face, the steering wheel, or the like, and detects biological information of the passenger sitting on the seat or the driver gripping the steering wheel. The vehicle inside information detecting device 2500 may compute the degree of the driver's tiredness or the degree of the driver's concentration or determine whether the driver have a doze, on the basis of detection information input from the driver state detecting section 2510. The vehicle inside information detecting device 2500 may perform a process such as a noise canceling process on the picked-up audio signal.

The integrated control unit 2600 controls the overall operation inside the vehicle control system 2000 in accordance with a variety of programs. The integrated control unit 2600 is connected to an input section 2800. The input section 2800 is implemented as a device such as a touch panel, a button, a microphone, a switch, or a lever on which a passenger can perform an input operation. The input section 2800 may be, for example, a remote control device that uses infrared light or other radio waves, or an external connection device such as a mobile telephone or a personal digital assistant (PDA) corresponding to the operation of the vehicle control system 2000. The input section 2800 may be, for example, a camera. In that case, a passenger can input information through gesture. Moreover, the input section 2800 may include an input control circuit or the like that generates an input signal, for example, on the basis of information input by a passenger or the like using the above-described input section 2800, and outputs the generated input signal to the integrated control unit 2600. The passenger or the like operates this input section 2800, thereby inputting various types of data to the vehicle control system 2000 or instructing the vehicle control system 2000 about a processing operation.

The storage section 2690 may include a read only memory (ROM) that stores a variety of programs to be executed by a microcomputer, and a random access memory (RAM) that stores a variety of parameters, operation results, sensor values, or the like. Further, the storage section 2690 may be implemented as a magnetic storage device such as a hard disk drive (HDD), a semiconductor storage device, an optical storage device, a magneto-optical storage device, or the like.

The general-purpose communication I/F 2620 is a general-purpose communication I/F that mediates in communication between a variety of devices in an external environment 2750. The general-purpose communication I/F 2620 may implement a cellular communication protocol such as Global System of Mobile communications (GSM), WiMAX, Long Term Evolution (LTE) or LTE-Advanced (LTE-A), or other wireless communication protocols such as a wireless LAN (which is also referred to as Wi-Fi (registered trademark)). The general-purpose communication I/F 2620 may be connected to a device (such as an application server or a control server) on an external network (such as the Internet, a cloud network, or a network specific to a service provider), for example, via a base station or an access point. Further, the general-purpose communication I/F 2620 may be connected to a terminal (such as a terminal of a pedestrian or a store, or a machine type communication (MTC) terminal) in the vicinity of the vehicle, for example, using the peer-to-peer (P2P) technology.

The dedicated communication I/F 2630 is a communication I/F that supports a communication protocol defined for the purpose of use for vehicles. The dedicated communication I/F 2630 may implement a standard protocol such as wireless access in vehicle environment (WAVE), which is a combination of IEEE 802.11p for the lower layer and IEEE 1609 for the upper layer, or dedicated short range communications (DSRC). The dedicated communication I/F 2630 typically performs V2X communication. The V2X communication is a concept including one or more of vehicle-to-vehicle communication, vehicle-to-infrastructure communication, and vehicle-to-pedestrian communication.

The positioning section 2640 receives, for example, global navigation satellite system (GNSS) signals (such as global positioning system (GPS) signals from a GPS satellite) from a GNSS satellite for positioning, and generates position information including the latitude, longitude, and altitude of the vehicle. Additionally, the positioning section 2640 may also identify the present position by exchanging signals with a wireless access point, or acquire position information from a terminal such as a mobile phone, a PHS, or a smartphone that has a positioning function.

The beacon receiving section 2650 receives radio waves or electromagnetic waves, for example, from a wireless station or the like installed on the road, and acquires information such as the present position, traffic congestion, closed roads, or necessary time. Additionally, the function of the beacon receiving section 2650 may be included in the above-described dedicated communication I/F 2630.

The onboard device I/F 2660 is a communication interface that mediates in connections between the microcomputer 2610 and a variety of devices in the vehicle. The onboard device I/F 2660 may use a wireless communication protocol such as a wireless LAN, Bluetooth (registered trademark), near field communication (NFC), or a wireless USB (WUSB) to establish a wireless connection. Further, the onboard device I/F 2660 may also establish a wired connection via a connection terminal (not illustrated) (and a cable if necessary). The onboard devices 1/2660 may include, for example, at least one of a mobile device of a passenger, a wearable device of a passenger, or an information device carried into or attached to the vehicle. The onboard device I/F 2660 exchanges control signals or data signals with, for example, a mobile device or a wearable device that a passenger has, or an information device carried into or attached to the vehicle.

The in-vehicle network I/F 2680 is an interface that mediates in communication between the microcomputer 2610 and the communication network 2010. The in-vehicle network I/F 2680 transmits and receives signals or the like in compliance with a predetermined protocol supported by the communication network 2010.

The microcomputer 2610 of the integrated control unit 2600 controls the vehicle control system 2000 in accordance with a variety of programs on the basis of information acquired via at least one of the general-purpose communication I/F 2620, the dedicated communication I/F 2630, the positioning section 2640, the beacon receiving section 2650, the onboard device I/F 2660, or the in-vehicle network I/F 2680. For example, the microcomputer 2610 may calculate a control target value of the driving force generating device, the steering mechanism, or the braking device on the basis of acquired information of the inside and outside of the vehicle, and output a control instruction to the drive line control unit 2100. For example, the microcomputer 2610 may perform cooperative control for the purpose of executing the functions of vehicle collision avoidance or impact reduction, follow-up driving based on the inter-vehicle distance, constant vehicle speed driving, automatic driving or the like.

The microcomputer 2610 may create local map information including surrounding information of the present position of the vehicle on the basis of information acquired via at least one of the general-purpose communication I/F 2620, the dedicated communication I/F 2630, the positioning section 2640, the beacon receiving section 2650, the onboard device I/F 2660, or the in-vehicle network I/F 2680. Further, the microcomputer 2610 may predict danger such as vehicle collisions, approaching pedestrians or the like, or entry to closed roads on the basis of acquired information, and generate a warning signal. The warning signal may be, for example, a signal used to generate a warning sound or turn on the warning lamp.

The audio and image output section 2670 transmits an output signal of at least one of a sound or an image to an output device capable of visually or aurally notifying a passenger of the vehicle or the outside of the vehicle of information. In the example of FIG. 40, an audio speaker 2710, a display section 2720, and an instrument panel 2730 are exemplified as the output device. For example, the display section 2720 may include at least one of an onboard display or a head-up display. The display section 2720 may have an augmented reality (AR) display function. The output device may also be a device other than these devices like a headphone, a projector, or a lamp. In a case where the output device is a display device, the display device visually displays a result obtained by the microcomputer 2610 performing a variety of processes or information received from another control unit in a variety of forms such as text, images, tables, or graphs. Further, in a case where the output device is an audio output device, the audio output device converts audio signals including reproduced audio data, acoustic data, or the like into analog signals, and aurally outputs the analog signals.

Additionally, in the example illustrated in FIG. 40, at least two control units connected via the communication network 2010 may be integrated into a single control unit. Alternatively, the individual control units may be configured as control units. Moreover, the vehicle control system 2000 may also include another control unit that is not illustrated. Further, a part or the whole of the functions executed by any of the control units may be executed by another control unit in the above description. That is, as long as information is transmitted and received via the communication network 2010, predetermined operation processing may be performed by any of the control units. Similarly, a sensor or a device connected to any of the control units may be connected to another control unit, and the control units may transmit and receive detection information to and from each other via the communication network 2010.

In the vehicle control system 2000 described above, the electronic apparatus 300 according to the present embodiment described using to FIG. 11 is able to be applied to the integrated control unit 2600 of the application example shown in FIG. 40. For example, the phase difference detection unit 326 of the electronic apparatus 300 corresponds to the microcomputer 2610, the storage unit 2690, and the in-vehicle network I/F 2680 of the integrated control unit 2600.

In addition, at least some structural elements of the electronic apparatus 300 described using FIG. 11 may be achieved in a module (for example, an integrated circuit module including a single die) for the integrated control unit 2600 illustrated in FIG. 40. Alternatively, the electronic apparatus 300 described using FIG. 11 may be achieved by a plurality of control units of the vehicle control system 2000 illustrated in FIG. 40.

Note that a computer program for realizing each function of the electronic apparatus 300 described using FIG. 11 is able to be mounted on any control unit or the like. In addition, it is also possible to provide a computer-readable recording medium in which such a computer program is stored. The recording medium is, for example, a magnetic disk, an optical disk, a magneto-optical disk, a flash memory, or the like. In addition, the computer program described above may be delivered through, for example, a network without using a recording medium.

26. Others

Additionally, the present technology may also be configured as below.

(1)

A solid-state imaging device in which a sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block.

(2)

The solid-state imaging device according to (1), in which the sub block includes 2×2 pixels adjacent to each other.

(3)

The solid-state imaging device according to (1) or (2), in which the block includes four Bayer-arranged sub blocks.

(4)

The solid-state imaging device according to (1), (2), or (3), in which the number of the phase difference detection pixels disposed in the block is equal to or greater than two and is equal to or less than four.

(5)

The solid-state imaging device according to any one of (1) to (4), in which the number of the phase difference detection pixels disposed in the sub block is one or two.

(6)

The solid-state imaging device according to any one of (1) to (5), in which the sub block in which the phase difference detection pixel is disposed is a red or blue sub block.

(7)

The solid-state imaging device according to any one of (1) to (6), in which the phase difference detection pixel detects a phase difference in a horizontal direction or a vertical direction, or a phase difference in an upper left diagonal direction or an upper right diagonal direction.

(8)

The solid-state imaging device according to any one of (1) to (7), in which one of a pair of phase difference detection pixels is disposed in two pixels of a first sub block, and the other of the pair of phase difference detection pixels is disposed in two pixels of a second sub block of the same color as the first sub block.

(9)

The solid-state imaging device according to any one of (1) to (8), in which one of a pair of phase difference detection pixels of another direction that detect a phase difference of a second direction different from a first direction in which the phase difference detection pixel of the first sub block detects a phase difference is disposed in two pixels of a third sub block of which a color is different from the color of the first sub block, and the other of the pair of phase difference detection pixels of the other direction is disposed in two pixels of a fourth sub block of the same color as the third sub block.

(10)

The solid-state imaging device according to any one of (1) to (9), in which one of a pair of phase difference detection pixels that detect a phase difference is disposed in each corresponding position of the sub block of a first color, the sub block of a second color, and the sub block of a third color configuring a first block, and the other of the pair of phase difference detection pixels that detect the phase difference is disposed in each corresponding position of the sub block of the first color, the sub block of the second color, and the sub block of the third color configuring a second block.

(11)

The solid-state imaging device according to any one of (1) to (10), in which light enters the phase difference detection pixel through a color filter.

(12)

The solid-state imaging device according to any one of (1) to (11), in which the phase difference detection pixel is separately detected for each color of the color filter.

(13)

The solid-state imaging device according to any one of (1) to (12), in which the phase difference detection pixel that detects a phase difference of a horizontal direction or a vertical direction is disposed substantially in a center of an imaging region, and the phase difference detection pixel that detects a phase difference of an upper left diagonal direction or an upper right diagonal direction is disposed in a diagonal direction of the imaging region.

(14)

The solid-state imaging device according to any one of (1) to (13), in which positions in the sub blocks in which the phase difference detection pixels are disposed correspond to each other within the sub block of a first color and within the sub block of a second color different from the first color, but the positions are different between sub blocks of the first color and sub blocks of the second color.

(15)

The solid-state imaging device according to any one of (1) to (14), further including:

a detection unit that detects a phase difference on a basis of an output of the phase difference detection pixel.

(16)

An electronic apparatus including:

an image sensor in which pixels for photoelectric conversion of light from a subject are disposed in a planar manner; and a control unit that controls driving of a lens that causes light to be incident on the image sensor on a basis of a phase difference detected by a phase difference detection pixel, in which, in the image sensor, a sub block includes a plurality of pixels of the same color, a block includes a plurality of sub blocks including different colors, and the phase difference detection pixels are disposed at positions corresponding to each other in two or more sub blocks in a case in which the phase difference detection pixels are disposed in two or more sub blocks among the plurality of sub blocks configuring the block.

(17)

A lens control method of an electronic apparatus including an image sensor in which pixels for photoelectric conversion of light from a subject are disposed in a planar manner, a sub block includes a plurality of pixels of the same color, a block includes a plurality of sub blocks including different colors, and phase difference detection pixels are disposed at positions corresponding to each other in two or more sub blocks in a case in which the phase difference detection pixels are disposed in two or more sub blocks among the plurality of sub blocks configuring the block, the lens control method including:

controlling driving of a lens that causes light to be incident on the image sensor on a basis of a phase difference detected by the phase difference detection pixel.

(18)

A vehicle including:

an image sensor in which pixels for photoelectric conversion of light from a subject are disposed in a planar manner; and a control unit that controls driving of a lens that causes light to be incident on the image sensor on a basis of a phase difference detected by a phase difference detection pixel, in which, in the image sensor, a sub block includes a plurality of pixels of the same color, a block includes a plurality of sub blocks including different colors, and the phase difference detection pixels are disposed at positions corresponding to each other in two or more sub blocks in a case in which the phase difference detection pixels are disposed in two or more sub blocks among the plurality of sub blocks configuring the block.

REFERENCE SIGNS LIST 102 block
103 sub block
111 pixel
114 imaging pixel
131 phase difference detection pixel
311 lens
312 optical filter
322 clamp unit
326 phase difference detection unit
327 lens control unit
328 defect correction unit
329 demosaic unit
331 luminance chroma signal generation unit
332 interface unit

The invention claimed is:

1. A solid-state imaging device, comprising:
a plurality of sub blocks, wherein a sub block of the plurality of sub blocks includes a plurality of pixels of a same color;
a block that includes the plurality of sub blocks including different colors; and
a plurality of phase difference detection pixels at positions corresponding to each other in a plurality of first sub blocks of the plurality of sub blocks based on the plurality of phase difference detection pixels that are disposed in the plurality of first sub blocks among the plurality of sub blocks configuring the block, wherein
a first phase difference detection pixel of a pair of the plurality of phase difference detection pixels configured to detect a phase difference is disposed in each corresponding position of the sub block of a first color, the sub block of a second color, and the sub block of a third color configuring a first block, and
a second phase difference detection pixel of the pair of the plurality of phase difference detection pixels configured to detect the phase difference is disposed in each corresponding position of the sub block of the first color, the sub block of the second color, and the sub block of the third color configuring a second block.

2. The solid-state imaging device according to claim 1, wherein the sub block includes 2×2 pixels adjacent to each other.

3. The solid-state imaging device according to claim 2, wherein the block includes four Bayer-arranged sub blocks.

4. The solid-state imaging device according to claim 3, wherein a number of the plurality of phase difference detection pixels disposed in the block is equal to or greater than two and is equal to or less than four.

5. The solid-state imaging device according to claim 3, wherein a number of the plurality of phase difference detection pixels disposed in the sub block is one or two.

6. The solid-state imaging device according to claim 3, wherein the sub block a phase difference detection pixel of the plurality of phase difference detection pixels is disposed is a red sub block or a blue sub block.

7. The solid-state imaging device according to claim 3, wherein each of the plurality of phase difference detection pixels is configured to detect the phase difference in a horizontal direction or a vertical direction, or the phase difference in an upper left diagonal direction or an upper right diagonal direction.

8. The solid-state imaging device according to claim 7, wherein
a first phase difference detection pixel of a first pair of the plurality of phase difference detection pixels configured to detect the phase difference in a first direction is disposed in two pixels of a first sub block of the plurality of sub blocks, and
a second phase difference detection pixel of the first pair of the plurality of phase difference detection pixels is disposed in two pixels of a second sub block of the plurality of sub blocks of the same color as the first sub block.

9. The solid-state imaging device according to claim 8, wherein
a first phase difference detection pixel of a second pair of the plurality of phase difference detection pixels configured to detect the phase difference of a second direction different from the first direction is disposed in two pixels of a third sub block of the plurality of sub blocks of which a color is different from the color of the first sub block, and
  a second phase difference detection pixel of the second pair of the plurality of phase difference detection pixels is disposed in two pixels of a fourth sub block of the plurality of sub blocks of the same color as the third sub block.

10. The solid-state imaging device according to claim 1, wherein a phase difference detection pixel of the plurality of phase difference detection pixels is configured to receive light through a color filter.

11. The solid-state imaging device according to claim 10, wherein the phase difference detection pixel is separately detected for each color of the color filter.

12. The solid-state imaging device according to claim 1, wherein
  the first phase difference detection pixel configured to detect the phase difference of a horizontal direction or a vertical direction is disposed in a center of an imaging region, and
  the second phase difference detection pixel configured to detect the phase difference of an upper left diagonal direction or an upper right diagonal direction is disposed in a diagonal direction of the imaging region.

13. The solid-state imaging device according to claim 1, wherein
  the positions in the plurality of first sub blocks correspond to each other within the sub block of the first color and within the sub block of the second color different from the first color, and
  the positions are different between sub blocks of the first color and sub blocks of the second color.

14. The solid-state imaging device according to claim 1, further comprising:
  a detection unit configured to detect the phase difference based on an output of a phase difference detection pixel of the plurality of phase difference detection pixels.

15. An electronic apparatus, comprising:
  an image sensor configured to dispose, in a planer manner, a plurality of pixels for photoelectric conversion of light from a subject; and
  circuitry configured to control driving of a lens that causes the light to be incident on the image sensor based on a phase difference detected by a phase difference detection pixel, wherein the image sensor comprises:
    a plurality of sub blocks, wherein a sub block of the plurality of sub blocks includes the plurality of pixels of a same color;
    a block that includes the plurality of sub blocks including different colors; and
    a plurality of phase difference detection pixels at positions corresponding to each other in a plurality of first sub blocks of the plurality of sub blocks based on the plurality of phase difference detection pixels that are disposed in the plurality of first sub blocks among the plurality of sub blocks configuring the block, wherein
      a first phase difference detection pixel of a pair of the plurality of phase difference detection pixels configured to detect the phase difference is disposed in each corresponding position of the sub block of a first color, the sub block of a second color, and the sub block of a third color configuring a first block, and
      a second phase difference detection pixel of the pair of the plurality of phase difference detection pixels configured to detect the phase difference is disposed in each corresponding position of the sub block of the first color, the sub block of the second color, and the sub block of the third color configuring a second block.

16. A lens control method of an electronic apparatus, comprising:
  disposing, by an image sensor, a plurality of pixels for photoelectric conversion of light from a subject in a planar manner, wherein the image sensor comprises:
    a plurality of sub blocks, wherein a sub block of the plurality of sub blocks includes the plurality of pixels of a same color;
    a block that includes the plurality of sub blocks including different colors; and
    a plurality of phase difference detection pixels at positions corresponding to each other in a plurality of first sub blocks of the plurality of sub blocks based on the plurality of phase difference detection pixels that are disposed in the plurality of first sub blocks among the plurality of sub blocks configuring the block, wherein
      a first phase difference detection pixel of a pair of the plurality of phase difference detection pixels configured to detect a phase difference is disposed in each corresponding position of the sub block of a first color, the sub block of a second color, and the sub block of a third color configuring a first block, and
      a second phase difference detection pixel of the pair of the plurality of phase difference detection pixels configured to detect the phase difference is disposed in each corresponding position of the sub block of the first color, the sub block of the second color, and the sub block of the third color configuring a second block; and
  controlling driving of a lens that causes the light to be incident on the image sensor based on the phase difference detected by a phase difference detection pixel of the plurality of phase difference detection pixels.

17. A vehicle, comprising:
  an image sensor configured to dispose, in a planer manner, a plurality of pixels for photoelectric conversion of light from a subject; and
  circuitry configured to control driving of a lens that causes the light to be incident on the image sensor based on a phase difference detected by a phase difference detection pixel, wherein the image sensor comprises:
    a plurality of sub blocks, wherein a sub block of the plurality of sub blocks includes the plurality of pixels of a same color;
    a block that includes the plurality of sub blocks including different colors; and
    a plurality of phase difference detection pixels at positions corresponding to each other in a plurality of first sub blocks of the plurality of sub blocks based on the plurality of phase difference detection pixels that are disposed in the plurality of first sub blocks among the plurality of sub blocks configuring the block, wherein
      a first phase difference detection pixel of a pair of the plurality of phase difference detection pixels configured to detect the phase difference is disposed in each corresponding position of the sub block of a first color, the sub block of a second color, and the sub block of a third color configuring a first block, and a second phase difference detection pixel of the pair of the plurality of phase difference detection pixels configured to detect the phase difference is disposed in each corresponding position of the sub block of the first color, the sub block of the second color, and the sub block of the third color configuring a second block.

* * * * *